(12) United States Patent
Rogers et al.

(10) Patent No.: US 11,456,258 B2
(45) Date of Patent: Sep. 27, 2022

(54) STRETCHABLE FORM OF SINGLE CRYSTAL SILICON FOR HIGH PERFORMANCE ELECTRONICS ON RUBBER SUBSTRATES

(71) Applicant: The Board of Trustees of the University of Illinois, Urbana, IL (US)

(72) Inventors: John A. Rogers, Wilmette, IL (US); Dahl-Young Khang, Seoul (KR); Yugang Sun, Naperville, IL (US); Etienne Menard, Durham, NC (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 228 days.

(21) Appl. No.: 16/272,488

(22) Filed: Feb. 11, 2019

(65) Prior Publication Data
US 2020/0013720 A1    Jan. 9, 2020

Related U.S. Application Data

(60) Continuation of application No. 15/339,338, filed on Oct. 31, 2016, now Pat. No. 10,204,864, which is a
(Continued)

(51) Int. Cl.
*H01L 23/538* (2006.01)
*H01L 29/72* (2006.01)
(Continued)

(52) U.S. Cl.
CPC .......... *H01L 23/5387* (2013.01); *B82Y 10/00* (2013.01); *H01L 21/02422* (2013.01);
(Continued)

(58) Field of Classification Search
CPC ......... H01L 21/823807; H01L 21/8221; H01L 21/02595; H01L 29/78672;
(Continued)

(56) References Cited

U.S. PATENT DOCUMENTS 3,743,148 A    7/1973    Carlson
4,392,451 A    7/1983    Mickelsen et al.
(Continued)

FOREIGN PATENT DOCUMENTS

CN    1190248    8/1998
CN    1299073    6/2001
(Continued)

OTHER PUBLICATIONS

U.S. Appl. No. 11/001,689, filed Dec. 1, 2004.
(Continued)

*Primary Examiner* — John P. Dulka
(74) *Attorney, Agent, or Firm* — Leydig, Voit & Mayer, Ltd.

(57) ABSTRACT

The present invention provides stretchable, and optionally printable, semiconductors and electronic circuits capable of providing good performance when stretched, compressed, flexed or otherwise deformed. Stretchable semiconductors and electronic circuits of the present invention preferred for some applications are flexible, in addition to being stretchable, and thus are capable of significant elongation, flexing, bending or other deformation along one or more axes. Further, stretchable semiconductors and electronic circuits of the present invention may be adapted to a wide range of device configurations to provide fully flexible electronic and optoelectronic devices.

22 Claims, 38 Drawing Sheets

Related U.S. Application Data continuation of application No. 14/789,645, filed on Jul. 1, 2015, now Pat. No. 9,515,025, which is a continuation of application No. 14/220,923, filed on Mar. 20, 2014, now Pat. No. 9,105,555, which is a continuation of application No. 13/441,618, filed on Apr. 6, 2012, now Pat. No. 8,754,396, which is a continuation of application No. 12/405,475, filed on Mar. 17, 2009, now Pat. No. 8,198,621, which is a division of application No. 11/423,287, filed on Jun. 9, 2006, now Pat. No. 7,521,292, and a continuation-in-part of application No. 11/145,542, filed on Jun. 2, 2005, now Pat. No. 7,557,367, and a continuation-in-part of application No. 11/145,574, filed on Jun. 2, 2005, now Pat. No. 7,622,367.

(60) Provisional application No. 60/790,104, filed on Apr. 7, 2006, provisional application No. 60/677,617, filed on May 4, 2005, provisional application No. 60/663,391, filed on Mar. 18, 2005, provisional application No. 60/650,305, filed on Feb. 4, 2005, provisional application No. 60/601,061, filed on Aug. 11, 2004, provisional application No. 60/577,077, filed on Jun. 4, 2004.

(51) Int. Cl.
| | | |
|---|---|---|
| *B82Y 10/00* | (2011.01) | |
| *H01L 21/02* | (2006.01) | |
| *H01L 21/683* | (2006.01) | |
| *H01L 27/12* | (2006.01) | |
| *H01L 29/06* | (2006.01) | |
| *H01L 29/16* | (2006.01) | |
| *H01L 29/778* | (2006.01) | |
| *H01L 29/786* | (2006.01) | |
| *H01L 31/0392* | (2006.01) | |
| *H01L 31/18* | (2006.01) | |
| *H05K 1/02* | (2006.01) | |
| *H01L 23/29* | (2006.01) | |
| *H01L 29/15* | (2006.01) | |
| *H01L 23/31* | (2006.01) | |
| *H01L 23/00* | (2006.01) | |

(52) U.S. Cl.
CPC .. *H01L 21/02521* (2013.01); *H01L 21/02532* (2013.01); *H01L 21/02546* (2013.01); *H01L 21/02628* (2013.01); *H01L 21/6835* (2013.01); *H01L 23/293* (2013.01); *H01L 23/3157* (2013.01); *H01L 23/564* (2013.01); *H01L 27/1266* (2013.01); *H01L 27/1285* (2013.01); *H01L 27/1292* (2013.01); *H01L 29/06* (2013.01); *H01L 29/068* (2013.01); *H01L 29/0665* (2013.01); *H01L 29/0673* (2013.01); *H01L 29/0676* (2013.01); *H01L 29/151* (2013.01); *H01L 29/158* (2013.01); *H01L 29/16* (2013.01); *H01L 29/1602* (2013.01); *H01L 29/1606* (2013.01); *H01L 29/72* (2013.01); *H01L 29/7781* (2013.01); *H01L 29/78603* (2013.01); *H01L 29/78696* (2013.01); *H01L 31/0392* (2013.01); *H01L 31/03925* (2013.01); *H01L 31/03926* (2013.01); *H01L 31/18* (2013.01); *H01L 31/1804* (2013.01); *H05K 1/0277* (2013.01); *H05K 1/0283* (2013.01); *B81C 2201/0185* (2013.01); *H01L 24/29* (2013.01); *H01L 24/32* (2013.01); *H01L 24/80* (2013.01); *H01L 29/78681* (2013.01); *H01L 2221/68368* (2013.01); *H01L 2224/291* (2013.01); *H01L 2224/2919* (2013.01); *H01L 2224/80894* (2013.01); *H01L 2224/8385* (2013.01); *H01L 2924/0002* (2013.01); *H01L 2924/0101* (2013.01); *H01L 2924/0102* (2013.01); *H01L 2924/01002* (2013.01); *H01L 2924/0103* (2013.01); *H01L 2924/01003* (2013.01); *H01L 2924/01005* (2013.01); *H01L 2924/01006* (2013.01); *H01L 2924/01011* (2013.01); *H01L 2924/01013* (2013.01); *H01L 2924/01015* (2013.01); *H01L 2924/01019* (2013.01); *H01L 2924/01023* (2013.01); *H01L 2924/01024* (2013.01); *H01L 2924/01029* (2013.01); *H01L 2924/0132* (2013.01); *H01L 2924/01032* (2013.01); *H01L 2924/01033* (2013.01); *H01L 2924/01049* (2013.01); *H01L 2924/01051* (2013.01); *H01L 2924/01067* (2013.01); *H01L 2924/01072* (2013.01); *H01L 2924/01074* (2013.01); *H01L 2924/01079* (2013.01); *H01L 2924/01082* (2013.01); *H01L 2924/07802* (2013.01); *H01L 2924/10329* (2013.01); *H01L 2924/10336* (2013.01); *H01L 2924/10349* (2013.01); *H01L 2924/12032* (2013.01); *H01L 2924/12036* (2013.01); *H01L 2924/12041* (2013.01); *H01L 2924/12042* (2013.01); *H01L 2924/13063* (2013.01); *H01L 2924/13091* (2013.01); *H01L 2924/1461* (2013.01); *H01L 2924/3025* (2013.01); *Y02E 10/547* (2013.01); *Y02P 70/50* (2015.11)

(58) Field of Classification Search
CPC ........... H01L 21/02675; H01L 29/6675; H01L 27/0922; H01L 21/02532
See application file for complete search history.

(56) References Cited

U.S. PATENT DOCUMENTS

| | | |
|---|---|---|
| 4,471,003 A | 9/1984 | Cann |
| 4,487,162 A | 12/1984 | Cann |
| 4,761,335 A | 8/1988 | Aurichio et al. |
| 4,766,670 A | 8/1988 | Gazdik et al. |
| 4,784,720 A | 11/1988 | Douglas |
| 4,855,017 A | 8/1989 | Douglas |
| 5,086,785 A | 2/1992 | Gentile et al. |
| 5,204,144 A | 4/1993 | Cann et al. |
| 5,313,094 A | 5/1994 | Beyer et al. |
| 5,465,009 A | 11/1995 | Drabik et al. |
| 5,491,350 A | 2/1996 | Unno et al. |
| 5,525,815 A | 6/1996 | Einset |
| 5,545,291 A | 8/1996 | Smith et al. |
| 5,648,148 A | 7/1997 | Simpson |
| 5,691,245 A | 11/1997 | Bakhit et al. |
| 5,710,057 A | 1/1998 | Kenney |
| 5,753,529 A | 5/1998 | Chang et al. |
| 5,757,081 A | 5/1998 | Chang et al. |
| 5,767,578 A | 6/1998 | Chang et al. |
| 5,772,905 A | 6/1998 | Chou |
| 5,783,856 A | 7/1998 | Smith et al. |
| 5,817,242 A | 10/1998 | Biebuyck et al. |
| 5,824,186 A | 10/1998 | Smith et al. |
| 5,904,545 A | 5/1999 | Smith et al. |
| 5,907,189 A | 5/1999 | Mertol |
| 5,915,180 A | 6/1999 | Hara et al. |
| 5,928,001 A | 7/1999 | Gillette et al. |
| 5,955,781 A | 9/1999 | Joshi et al. |
| 5,976,683 A | 11/1999 | Liehrr et al. |
| 5,998,291 A | 12/1999 | Bakhit et al. |
| 6,080,608 A | 6/2000 | Nowak |
| 6,100,166 A | 8/2000 | Sakaguchi et al. |
| 6,150,602 A | 11/2000 | Campbell |
| 6,190,937 B1 | 2/2001 | Nakagawa et al. |

(56) References Cited

U.S. PATENT DOCUMENTS

| | | |
|---|---|---|
| 6,225,149 B1 | 5/2001 | Gan et al. |
| 6,265,326 B1 | 7/2001 | Ueno |
| 6,274,508 B1 | 8/2001 | Jacobsen et al. |
| 6,277,712 B1 | 8/2001 | Kang et al. |
| 6,281,038 B1 | 8/2001 | Jacobsen et al. |
| 6,291,896 B1 | 9/2001 | Smith |
| 6,316,278 B1 | 11/2001 | Jacobsen et al. |
| 6,317,175 B1 | 11/2001 | Salerno et al. |
| 6,334,960 B1 | 1/2002 | Willson et al. |
| 6,380,729 B1 | 4/2002 | Smith |
| 6,403,397 B1 | 6/2002 | Katz |
| 6,413,790 B1 | 7/2002 | Duthaler et al. |
| 6,417,025 B1 | 7/2002 | Gengel |
| 6,420,266 B1 | 7/2002 | Smith et al. |
| 6,459,418 B1 | 10/2002 | Comiskey et al. |
| 6,468,638 B2 | 10/2002 | Jacobsen et al. |
| 6,479,395 B1 | 11/2002 | Smith et al. |
| 6,521,511 B1 | 2/2003 | Inoue et al. |
| 6,555,408 B1 | 4/2003 | Jacobsen et al. |
| 6,527,964 B1 | 5/2003 | Smith et al. |
| 6,566,744 B2 | 5/2003 | Gengel |
| 6,580,151 B2 | 6/2003 | Vandeputte et al. |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,608,370 B1 | 8/2003 | Chen et al. |
| 6,623,579 B1 | 9/2003 | Smith et al. |
| 6,639,578 B1 | 10/2003 | Comiskey et al. |
| 6,655,286 B2 | 12/2003 | Rogers |
| 6,657,289 B1 | 12/2003 | Craig et al. |
| 6,661,037 B2 | 12/2003 | Pan et al. |
| 6,665,044 B1 | 12/2003 | Jacobsen et al. |
| 6,667,548 B2 | 12/2003 | O'Connor et al. |
| 6,683,663 B1 | 1/2004 | Hadley et al. |
| 6,693,384 B1 | 2/2004 | Vicentini et al. |
| 6,714,274 B2 | 3/2004 | Aoki et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,743,982 B2 | 6/2004 | Biegelsen et al. |
| 6,780,696 B1 | 8/2004 | Schatz |
| 6,784,450 B2 | 8/2004 | Pan et al. |
| 6,814,898 B1 | 11/2004 | Deeman et al. |
| 6,816,380 B2 | 11/2004 | Credelle et al. |
| 6,844,673 B1 | 1/2005 | Bernkopf |
| 6,848,162 B2 | 2/2005 | Arneson et al. |
| 6,850,312 B2 | 2/2005 | Jacobsen et al. |
| 6,863,219 B1 | 3/2005 | Jacobsen et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,607 B2 | 4/2005 | Inoue et al. |
| 6,878,871 B2 | 4/2005 | Scher et al. |
| 6,887,650 B2 | 5/2005 | Shimoda et al. |
| 6,900,094 B2 | 5/2005 | Hammond et al. |
| 6,908,834 B2 | 6/2005 | Tokushige |
| 6,917,061 B2 | 7/2005 | Pan et al. |
| 6,949,199 B1 | 9/2005 | Gauzner et al. |
| 6,949,206 B2 | 9/2005 | Whitford |
| 6,950,220 B2 | 9/2005 | Abramson et al. |
| 6,984,934 B2 | 1/2006 | Moller et al. |
| 6,989,285 B2 | 1/2006 | Ball |
| 7,029,951 B2 | 4/2006 | Chen et al. |
| 7,067,903 B2 | 6/2006 | Tachibana et al. |
| 7,101,729 B2 | 9/2006 | Kimura et al. |
| 7,116,318 B2 | 10/2006 | Amundson et al. |
| 7,132,313 B2 | 11/2006 | O'Connor et al. |
| 7,148,512 B2 | 12/2006 | Leu et al. |
| 7,169,669 B2 | 1/2007 | Blakers et al. |
| 7,170,164 B2 | 1/2007 | Chen et al. |
| 7,186,624 B2 | 3/2007 | Weiser et al. |
| 7,195,733 B2 | 3/2007 | Rogers et al. |
| 7,244,662 B2 | 7/2007 | Kondo |
| 7,253,442 B2 | 8/2007 | Huang et al. |
| 7,255,919 B2 | 8/2007 | Sakata et al. |
| 7,374,968 B2 | 5/2008 | Kornilovich et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,629,691 B2 | 12/2009 | Roush |
| 7,704,684 B2 | 4/2010 | Rogers et al. |
| 7,705,280 B2 | 4/2010 | Nuzzo et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 8,198,621 B2 | 6/2012 | Rogers et al. |
| 8,217,381 B2 | 7/2012 | Rogers et al. |
| 8,367,035 B2 | 2/2013 | Rogers et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,552,299 B2 | 10/2013 | Rogers et al. |
| 8,562,095 B2 | 10/2013 | Alleyne et al. |
| 8,664,699 B2 | 3/2014 | Rogers et al. |
| 8,666,471 B2 | 3/2014 | Rogers et al. |
| 8,679,888 B2 | 3/2014 | Rogers et al. |
| 8,722,458 B2 | 5/2014 | Rogers et al. |
| 8,729,524 B2 | 5/2014 | Rogers et al. |
| 8,754,396 B2 | 6/2014 | Rogers et al. |
| 8,865,489 B2 | 10/2014 | Rogers et al. |
| 8,895,406 B2 | 11/2014 | Rogers et al. |
| 8,905,772 B2 | 12/2014 | Rogers et al. |
| 8,934,965 B2 | 1/2015 | Rogers et al. |
| 8,946,683 B2 | 2/2015 | Rogers et al. |
| 9,057,994 B2 | 6/2015 | Rogers et al. |
| 9,061,494 B2 | 6/2015 | Rogers et al. |
| 9,105,555 B2 | 8/2015 | Rogers et al. |
| 9,105,782 B2 | 8/2015 | Rogers et al. |
| 9,117,940 B2 | 8/2015 | Rogers et al. |
| 9,278,522 B2 | 3/2016 | Rogers et al. |
| 9,324,733 B2 | 4/2016 | Rogers et al. |
| 9,349,900 B2 | 5/2016 | Rogers et al. |
| 9,442,285 B2 | 9/2016 | Rogers |
| 9,450,043 B2 | 9/2016 | Nuzzo et al. |
| 9,487,002 B2 | 11/2016 | Rogers et al. |
| 9,496,229 B2 | 11/2016 | Rogers et al. |
| 9,515,025 B2 | 12/2016 | Rogers et al. |
| 9,554,484 B2 | 1/2017 | Rogers et al. |
| 9,555,644 B2 | 1/2017 | Rogers et al. |
| 9,601,671 B2 | 3/2017 | Rogers et al. |
| 9,613,911 B2 | 4/2017 | Rogers et al. |
| 9,647,171 B2 | 5/2017 | Rogers et al. |
| 9,691,873 B2 | 6/2017 | Rogers et al. |
| 9,761,444 B2 | 9/2017 | Nuzzo et al. |
| 9,765,934 B2 | 9/2017 | Rogers et al. |
| 9,768,086 B2 | 9/2017 | Nuzzo et al. |
| 9,825,229 B2 | 11/2017 | Rogers et al. |
| 9,875,974 B2 | 1/2018 | Rogers et al. |
| 9,936,574 B2 | 4/2018 | Rogers et al. |
| 9,986,924 B2 | 6/2018 | Rogers et al. |
| 10,029,451 B2 | 7/2018 | Rogers et al. |
| 10,052,066 B2 | 8/2018 | Rogers et al. |
| 10,064,269 B2 | 8/2018 | Rogers et al. |
| 10,143,086 B2 | 11/2018 | Rogers et al. |
| 10,154,592 B2 | 12/2018 | Rogers et al. |
| 10,192,830 B2 | 1/2019 | Rogers et al. |
| 10,204,864 B2 | 2/2019 | Rogers et al. |
| 10,292,261 B2 | 5/2019 | Rogers et al. |
| 10,292,263 B2 | 5/2019 | Rogers et al. |
| 10,333,069 B2 | 6/2019 | Rogers et al. |
| 10,349,860 B2 | 7/2019 | Rogers et al. |
| 10,355,113 B2 | 7/2019 | Rogers et al. |
| 10,357,201 B2 | 7/2019 | Rogers et al. |
| 10,361,180 B2 | 7/2019 | Rogers et al. |
| 10,374,072 B2 | 8/2019 | Nuzzo et al. |
| 10,396,173 B2 | 8/2019 | Rogers et al. |
| 10,424,572 B2 | 9/2019 | Rogers et al. |
| 10,441,185 B2 | 10/2019 | Rogers et al. |
| 2002/0064032 A1 | 5/2002 | Oohata |

(56) References Cited

U.S. PATENT DOCUMENTS

| | | | |
|---|---|---|---|
| 2002/0094701 A1* | 7/2002 | Biegelsen | H01L 25/0655 439/32 |
| 2002/0182874 A1 | 12/2002 | Wang | |
| 2003/0006527 A1 | 1/2003 | Rabolt et al. | |
| 2003/0047732 A1 | 3/2003 | Yamazaki et al. | |
| 2003/0082889 A1 | 5/2003 | Maruyama et al. | |
| 2003/0143766 A1 | 7/2003 | Ishikawa et al. | |
| 2003/0157795 A1 | 8/2003 | Chung | |
| 2003/0176014 A1* | 9/2003 | Hofmann | H01L 24/11 438/106 |
| 2003/0178316 A1 | 9/2003 | Jacobs et al. | |
| 2003/0222282 A1 | 12/2003 | Fjelstad et al. | |
| 2003/0227116 A1 | 12/2003 | Halik et al. | |
| 2004/0005723 A1 | 1/2004 | Empedocles et al. | |
| 2004/0026684 A1 | 2/2004 | Empedocles et al. | |
| 2004/0079464 A1 | 4/2004 | Kumakura | |
| 2004/0095658 A1 | 5/2004 | Buretea et al. | |
| 2004/0112964 A1 | 6/2004 | Empedocles et al. | |
| 2004/0136866 A1 | 7/2004 | Pontis et al. | |
| 2004/0146560 A1 | 7/2004 | Whiteford et al. | |
| 2004/0178390 A1 | 9/2004 | Whiteford | |
| 2004/0192062 A1 | 9/2004 | Mikelson et al. | |
| 2004/0192082 A1 | 9/2004 | Wagner et al. | |
| 2004/0206448 A1 | 10/2004 | Dubrow | |
| 2004/0250950 A1 | 12/2004 | Dubrow | |
| 2005/0020094 A1 | 1/2005 | Forbes et al. | |
| 2005/0038498 A1 | 2/2005 | Dubrow et al. | |
| 2005/0227389 A1 | 10/2005 | Bhattacharya et al. | |
| 2005/0233504 A1 | 10/2005 | Doi et al. | |
| 2005/0255686 A1 | 11/2005 | Yamano et al. | |
| 2006/0048885 A1 | 3/2006 | Constantin et al. | |
| 2006/0049485 A1 | 3/2006 | Pan et al. | |
| 2006/0076561 A1 | 4/2006 | Hioki et al. | |
| 2006/0127817 A1 | 6/2006 | Ramanujan et al. | |
| 2006/0132025 A1 | 6/2006 | Gao et al. | |
| 2006/0134893 A1 | 6/2006 | Savage et al. | |
| 2006/0169989 A1 | 8/2006 | Bhattacharya | |
| 2006/0244105 A1 | 11/2006 | Forbes et al. | |
| 2008/0041617 A1 | 2/2008 | Chen et al. | |
| 2008/0055581 A1 | 3/2008 | Rogers et al. | |
| 2011/0316120 A1 | 12/2011 | Rogers et al. | |
| 2012/0157804 A1 | 6/2012 | Rogers et al. | |
| 2014/0220422 A1 | 8/2014 | Rogers et al. | |
| 2015/0141767 A1 | 5/2015 | Rogers et al. | |
| 2015/0207012 A1 | 7/2015 | Rogers et al. | |
| 2015/0373831 A1 | 12/2015 | Rogers et al. | |
| 2016/0066789 A1 | 3/2016 | Rogers et al. | |
| 2016/0136877 A1 | 5/2016 | Rogers et al. | |
| 2017/0020402 A1 | 1/2017 | Rogers et al. | |
| 2017/0128015 A1 | 5/2017 | Rogers et al. | |
| 2017/0179356 A1 | 6/2017 | Rogers et al. | |
| 2017/0200707 A1 | 7/2017 | Rogers et al. | |
| 2017/0224257 A1 | 8/2017 | Rogers et al. | |
| 2017/0231571 A1 | 8/2017 | Rogers et al. | |
| 2017/0347891 A1 | 12/2017 | Rogers et al. | |
| 2018/0014734 A1 | 1/2018 | Rogers et al. | |
| 2018/0064377 A1 | 3/2018 | Rogers et al. | |
| 2018/0165566 A1 | 6/2018 | Rogers et al. | |
| 2018/0274973 A1 | 9/2018 | Rogers et al. | |
| 2018/0359850 A1 | 12/2018 | Rogers et al. | |
| 2019/0053712 A1 | 2/2019 | Rogers et al. | |
| 2020/0006540 A1 | 1/2020 | Nuzzo et al. | |
| 2020/0161291 A1 | 5/2020 | Rogers et al. | |

FOREIGN PATENT DOCUMENTS

| | | |
|---|---|---|
| CN | 1444436 | 9/2003 |
| CN | 1448987 | 10/2003 |
| CN | 1480983 | 3/2004 |
| DE | 4241045 | 5/1994 |
| EP | 0277606 | 8/1988 |
| EP | 0929097 | 7/1999 |
| EP | 1357773 | 10/2003 |
| EP | 1 414 082 | 4/2004 |
| JP | H03-220787 | 9/1991 |
| JP | H06-118441 | 4/1994 |
| JP | H06-504139 | 5/1994 |
| JP | H11-026733 | 1/1999 |
| JP | 2001-332383 | 11/2001 |
| JP | 2002-092984 | 3/2002 |
| JP | 2003-142666 | 5/2003 |
| JP | 2003-197881 | 7/2003 |
| JP | 2003-203898 | 7/2003 |
| JP | 2003-229548 | 8/2003 |
| JP | 2003-258211 | 9/2003 |
| JP | 2003-289136 | 10/2003 |
| JP | 2003-297974 | 10/2003 |
| JP | 2003-298029 | 10/2003 |
| JP | 2003-323132 | 11/2003 |
| KR | 10-2000-0068418 | 11/2000 |
| KR | 10-0345624 B1 | 9/2002 |
| KR | 10-2004-0088346 | 10/2004 |
| TW | 367570 | 8/1999 |
| TW | 494257 | 7/2002 |
| TW | 200503885 | 2/2005 |
| TW | I229780 | 3/2005 |
| TW | 200836353 | 9/2008 |
| WO | WO 1992/012453 | 7/1992 |
| WO | WO 1996/021245 | 7/1996 |
| WO | WO 2000/046854 | 8/2000 |
| WO | WO 2000/049421 | 8/2000 |
| WO | WO 2000/049658 | 8/2000 |
| WO | WO 2000/055915 | 9/2000 |
| WO | WO 2000/055916 | 9/2000 |
| WO | WO 2001/031082 | 5/2001 |
| WO | WO 2001/033621 | 5/2001 |
| WO | WO 2001/097284 | 12/2001 |
| WO | WO 2002/027701 | 4/2002 |
| WO | WO 2002/043032 | 5/2002 |
| WO | WO 2002/045160 | 6/2002 |
| WO | WO 2002/071137 | 9/2002 |
| WO | WO 2002/097708 | 12/2002 |
| WO | WO 2002/097724 | 12/2002 |
| WO | WO 2003/010825 | 2/2003 |
| WO | WO 2003/032240 | 4/2003 |
| WO | WO 2003/049201 | 6/2003 |
| WO | WO 2003/063211 | 7/2003 |
| WO | WO 2003/085700 | 10/2003 |
| WO | WO 2003/085701 | 10/2003 |
| WO | WO 2003/092073 | 11/2003 |
| WO | WO 2004/003535 | 1/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/043849 | 5/2004 |
| WO | WO 2004/086289 | 10/2004 |
| WO | WO 2004/094303 | 11/2004 |
| WO | WO 2004/100252 | 11/2004 |
| WO | WO 2004/099068 | 12/2004 |
| WO | WO 2004/105456 | 12/2004 |
| WO | WO 2004/107973 | 12/2004 |
| WO | WO 2005/005679 | 1/2005 |
| WO | WO 2005/015480 | 2/2005 |
| WO | WO 2005/017962 | 2/2005 |
| WO | WO 2005/022120 | 3/2005 |
| WO | WO 2005/029578 | 3/2005 |
| WO | WO 2005/033786 | 4/2005 |
| WO | WO 2005/033787 | 4/2005 |
| WO | WO 2005/054119 | 6/2005 |
| WO | WO 2005/104756 | 11/2005 |
| WO | WO 2005/106934 | 11/2005 |
| WO | WO 2005/122285 | 12/2005 |
| WO | WO 2006/130558 | 12/2006 |
| WO | WO 2006/130721 | 12/2006 |
| WO | WO 2007/000037 | 1/2007 |
| WO | WO 2007/126412 | 11/2007 |
| WO | WO 2008/030666 | 3/2008 |

(56) References Cited

FOREIGN PATENT DOCUMENTS

| WO | WO 2008/030960 | 3/2008 |
|---|---|---|
| WO | WO 2008/036837 | 3/2008 |
| WO | WO 2008/055054 | 5/2008 |
| WO | WO 2008/143635 | 11/2008 |
| WO | WO 2009/011709 | 1/2009 |
| WO | WO 2009/111641 | 9/2009 |
| WO | WO 2010/005707 | 1/2010 |
| WO | WO 2010/036807 | 4/2010 |
| WO | WO 2010/132552 | 11/2010 |
| WO | WO 2016/196673 | 12/2016 |
| WO | WO 2016/196675 | 12/2016 |
| WO | WO 2017/004531 | 1/2017 |
| WO | WO 2017/004576 | 1/2017 |

OTHER PUBLICATIONS

U.S. Appl. No. 11/115,954, filed Apr. 27, 2005.
U.S. Appl. No. 11/145,574, filed Jun. 2, 2005.
U.S. Appl. No. 11/145,542, filed Jun. 2, 2005.
U.S. Appl. No. 11/421,654, filed Jun. 1, 2006.
U.S. Appl. No. 11/423,287, filed Jun. 9, 2006.
U.S. Appl. No. 11/423,192, filed Jun. 9, 2006.
U.S. Appl. No. 11/465,317, filed Aug. 17, 2006.
U.S. Appl. No. 11/675,659, filed Feb. 16, 2007.
U.S. Appl. No. 11/782,799, filed Jul. 25, 2007.
U.S. Appl. No. 11/851,182, filed Sep. 6, 2007.
U.S. Appl. No. 11/858,788, filed Sep. 20, 2007.
U.S. Appl. No. 11/981,380, filed Oct. 31, 2007.
U.S. Appl. No. 12/372,605, filed Feb. 17, 2009.
U.S. Appl. No. 12/398,811, filed Mar. 5, 2009.
U.S. Appl. No. 12/405,475, filed Mar. 17, 2009.
U.S. Appl. No. 12/418,071, filed Apr. 3, 2009.
U.S. Appl. No. 12/522,582, filed Jul. 9, 2009.
U.S. Appl. No. 12/564,566, filed Sep. 22, 2009.
U.S. Appl. No. 12/669,287, filed Jan. 15, 2010.
U.S. Appl. No. 12/778,588, filed May 12, 2010.
U.S. Appl. No. 12/844,492, filed Jul. 27, 2010.
U.S. Appl. No. 12/892,001, filed Sep. 28, 2010.
U.S. Appl. No. 12/916,934, filed Nov. 1, 2010.
U.S. Appl. No. 12/947,120, filed Nov. 16, 2010.
U.S. Appl. No. 12/996,924, filed Dec. 8, 2010.
U.S. Appl. No. 12/968,637, filed Dec. 15, 2010.
U.S. Appl. No. 13/046,191, filed Mar. 11, 2011.
U.S. Appl. No. 13/071,027, filed Mar. 24, 2011.
U.S. Appl. No. 13/095,502, filed Apr. 27, 2011.
U.S. Appl. No. 13/100,774, filed May 4, 2011.
U.S. Appl. No. 13/113,504, filed May 23, 2011.
U.S. Appl. No. 13/120,486, filed Aug. 4, 2011.
U.S. Appl. No. 13/228,041, filed Sep. 8, 2011.
U.S. Appl. No. 13/270,954, filed Oct. 11, 2011.
U.S. Appl. No. 13/349,336, filed Jan. 12, 2012.
U.S. Appl. No. 13/441,618, filed Apr. 6, 2012.
U.S. Appl. No. 13/441,598, filed Apr. 6, 2012.
U.S. Appl. No. 13/472,165, filed May 15, 2012.
U.S. Appl. No. 13/486,726, filed Jun. 1, 2012.
U.S. Appl. No. 13/492,636, filed Jun. 8, 2012.
U.S. Appl. No. 13/549,291, filed Jul. 13, 2012.
U.S. Appl. No. 13/596,343, filed Aug. 28, 2012.
U.S. Appl. No. 13/624,096, filed Sep. 21, 2012.
U.S. Appl. No. 13/801,868, filed Mar. 13, 2013.
U.S. Appl. No. 13/835,284, filed Mar. 15, 2013.
U.S. Appl. No. 13/853,770, filed Mar. 29, 2013.
U.S. Appl. No. 13/974,963, filed Aug. 23, 2013.
U.S. Appl. No. 14/033,765, filed Sep. 23, 2013.
U.S. Appl. No. 14/140,299, filed Dec. 24, 2013.
U.S. Appl. No. 14/155,010, filed Jan. 14, 2014.
U.S. Appl. No. 14/173,525, filed Feb. 5, 2014.
U.S. Appl. No. 14/209,481, filed Mar. 13, 2014.
U.S. Appl. No. 14/220,910, filed Mar. 20, 2014.
U.S. Appl. No. 14/220,923, filed Mar. 20, 2014.
U.S. Appl. No. 14/246,962, filed Apr. 7, 2014.
U.S. Appl. No. 14/250,671, filed Apr. 11, 2014.
U.S. Appl. No. 14/251,259, filed Apr. 11, 2014.
U.S. Appl. No. 14/479,100, filed Sep. 5, 2014.
U.S. Appl. No. 14/504,736, filed Oct. 2, 2014.
U.S. Appl. No. 14/521,319, filed Oct. 22, 2014.
U.S. Appl. No. 14/532,687, filed Nov. 4, 2014.
U.S. Appl. No. 14/599,290, filed Jan. 16, 2015.
U.S. Appl. No. 14/686,304, filed Apr. 14, 2015.
U.S. Appl. No. 14/706,733, filed May 7, 2015.
U.S. Appl. No. 14/766,926, filed Aug. 10, 2015.
U.S. Appl. No. 14/766,301, filed Aug. 6, 2015.
U.S. Appl. No. 14/766,333, filed Aug. 6, 2015.
U.S. Appl. No. 14/772,312, filed Sep. 2, 2015.
U.S. Appl. No. 14/772,354, filed Sep. 2, 2015.
U.S. Appl. No. 14/789,645, filed Jul. 1, 2015.
U.S. Appl. No. 14/800,363, filed Jul. 15, 2015.
U.S. Appl. No. 14/818,109, filed Aug. 4, 2015.
U.S. Appl. No. 14/944,039, filed Nov. 17, 2015.
U.S. Appl. No. 15/084,091, filed Mar. 29, 2016.
U.S. Appl. No. 15/084,112, filed Mar. 29, 2016.
U.S. Appl. No. 15/084,211, filed Mar. 29, 2016.
U.S. Appl. No. 15/146,629, filed May 4, 2016.
U.S. Appl. No. 15/339,338, filed Oct. 31, 2016.
U.S. Appl. No. 15/349,525, filed Nov. 11, 2016.
U.S. Appl. No. 15/351,234, filed Nov. 14, 2016.
U.S. Appl. No. 15/354,951, filed Nov. 17, 2016.
U.S. Appl. No. 15/374,926, filed Dec. 9, 2016.
U.S. Appl. No. 15/375,514, filed Dec. 12, 2016.
U.S. Appl. No. 15/402,684, filed Jan. 10, 2017.
U.S. Appl. No. 15/402,718, filed Jan. 10, 2017.
U.S. Appl. No. 15/470,780, filed Mar. 27, 2017.
U.S. Appl. No. 15/402,723, filed Jan. 10, 2017.
U.S. Appl. No. 15/477,865, filed Apr. 3, 2017.
U.S. Appl. No. 15/501,364, filed Feb. 2, 2017.
U.S. Appl. No. 15/501,373, filed Feb. 2, 2017.
U.S. Appl. No. 15/501,379, filed Feb. 2, 2017.
U.S. Appl. No. 15/515,494, filed Mar. 29, 2017.
U.S. Appl. No. 15/578,602, filed Nov. 30, 2017.
U.S. Appl. No. 15/578,617, filed Nov. 30, 2017.
U.S. Appl. No. 15/625,087, filed Jun. 16, 2017.
U.S. Appl. No. 15/632,004, filed Jun. 23, 2017.
U.S. Appl. No. 15/640,206, filed Jun. 30, 2017.
U.S. Appl. No. 15/738,043, filed Dec. 19, 2017.
U.S. Appl. No. 15/861,257, filed Jan. 3, 2018.
U.S. Appl. No. 15/865,033, filed Jan. 8, 2018.
U.S. Appl. No. 15/942,242, filed Mar. 30, 2018.
U.S. Appl. No. 16/086,377, filed Sep. 19, 2018.
U.S. Appl. No. 16/194,007, filed Nov. 16, 2018.
U.S. Appl. No. 16/448,988, filed Jun. 21, 2019.
U.S. Appl. No. 16/510,583, filed Jul. 12, 2019.
U.S. Appl. No. 16/552,215, filed Aug. 27, 2019.
U.S. Appl. No. 16/667,215, filed Oct. 29, 2019.
Abbaschian et al. (Dec. 2005) "High Pressure-High Temperature Growth of Diamond Crystals Using Split Sphere Apparatus," Diamond Relat. Mater. 14(11-12):1916-1919.
Adachi et al. (1982) "Chemical Etching of InGaAsP/InP DH Wafer," J. Electrochem. Soc. 129:1053-1062.
Adachi et al. (1983) "Chemical Etching Characteristics of (001)GaAs," J. Electrochem. Soc. 130:2427-2435.
Ahmed et al. (Web Release Oct. 11, 2005) "Extending the 3ω-Method to the MHz Range for Thermal Conductivity Measurements of Diamond Thin Films," Diamond Relat. Mater. 15(2-3):389-393.
Ahn et al. (Jun. 2006) "High-Speed Mechanically Flexible Single-Crystal Silicon Thin-Film Transistors on Plastic Substrates," IEEE Electron Dev. Lett. 27(6):460-462.
Ahn et al. (Dec. 15, 2006) "Heterogeneous Three-Dimensional Electronics by Use of Printed Semiconductor Nanomaterials," Science 314:1754-1757.
Ahn et al. (2007) "Bendable Integrated Circuits on Plastic Substrates by Use of Printed Ribbons of Single-Crystalline Silicon," Appl. Phys. Lett. 90:213501.

(56) References Cited

OTHER PUBLICATIONS

Alivisatos et al. (1996) "Semiconductor Clusters, Nanocrystals, and Quantum Dots," Science 271:933-937.

Alivisatos et al. (1998) "From Molecules to Materials: Current Trends and Future Directions," Adv. Mater. 10:1297-1336.

Allen et al. (Feb. 20, 2006) "Nanomaterial Transfer Using Hot Embossing for Flexible Electronic Devices," Appl. Phys. Lett. 88:083112.

Al-Sarawi et al. (Feb. 1998) "A Review of 3-D Packaging Technology," IEEE Trans. Comp. Packag. Manufac. Technol. B 21(1):2-14.

Amano et al. (Feb. 3, 1986) "Metalorganic Vapor Phase Epitaxial Growth of a High Quality GaN Film Using an AlN Buffer Layer," Appl. Phys. Lett. 48(5):353-355.

Ambrosy et al. (1996) "Silicon Motherboards for Multichannel Optical Modules," IEEE Trans. Compon. Pack. A 19:34-40.

Andersson et al. (Oct. 16, 2002) "Active Matrix Displays Based on All-Organic Electrochemical Smart Pixels Printed on Paper," Adv. Mater. 14:1460-1464.

Ando et al. (2004) "Self-Aligned Self-Assembly Process for Fabricating Organic Thin-Film Transistors," Appl. Phys. Lett. 85:1849-1851.

Angadi et al. (Web Release Jun. 1, 2006) "Thermal Transport and Grain Boundary Conductance in Ultrananocrystalline Diamond Thin Films," J. Appl. Phys. 99:114301.

Aoki et al. (2003) "Microassembly of Semiconductor Three Dimensional Photonic Crystals," Nat. Mater. 2:117-121.

Arnold et al. (Web Release Dec. 28, 2002) "Field-Effect Transistors Based on Single Semiconducting Oxide Nanobelts," J. Phys. Chem. B 107(3):659-663.

Ayón et al. (Jan. 1999) "Characterization of a Time Multiplexed Inductively Coupled Plasma Etcher," J. Electrochem. Soc. 146(1):339-349.

Baca et al. (2008) "Semiconductor Wires and Ribbons for High-Performance Flexible Electronics," Angew. Chern. Int. Ed. 47:5524-5542.

Bachtold et al. (Nov. 9, 2001) "Logic Circuits with Carbon Nanotube Transistors," Science 294:1317-1320.

Bae et al. (Jul. 1, 2002) "Single-Crystalline Gallium Nitride Nanobelts," Appl. Phys. Lett. 81:126-128.

Balmer et al. (2005) "Diffusion of Alkanethiols in PDMS and Its Implications on Microcontact Printing (µCP)," Langmuir 21 (2):622-632.

Banerjee et al. (May 2001) "3-D ICs: A Novel Chip Design for Improving Deep-Submicrometerinterconnect Performance and Systems-on-Chip Integration," Proc. IEEE 89(5):602-633.

Bao et al. (1997) "High-Performance Plastic Transistors Fabricated by Printing Techniques," Chem. Mater. 9:1299-1301.

Bao et al. (1999) "Printable Organic and Polymeric Semiconducting Materials and Devices," J. Mater. Chem. 9:1895-1904.

Barquins, M. (1992) "Adherence, Friction and Wear of Rubber-Like Materials," Wear 158:87-117.

Bates, F.S. (1991) "Polymer-Polymer Phase Behavior," Science 251:898-905.

Battaglia et al. (2003) "Colloidal Two-Dimensional Systems: CdSe Quantum Shells and Wells," Angew. Chem. Int. Ed. 442:5035-5039.

Bauer et al. (2004) "Biological Applications of High Aspect Ratio Nanoparticles," J. Mater. Chem. 14:517-526.

Berg et al. (2003) "Tailored Micropatterns Through Weak Polyelectrolyte Stamping," Langmuir 19:2231-2237.

Bernard et al. (1998) "Printing Patterns of Proteins," Langmuir 14(9):2225-2229.

Bhunia et al. (2004) "Free-Standing and Vertically Aligned InP Nanowires Grown by Metalorganic Vapor Phase Epitaxy," Physica E 21:583-587.

Bhushan et al. (2004) "Multiwalled Carbon Nanotube AFM Probes for Surface Characterization of Micro/Nanostructures," Microsyst. Technol. 10:633-639.

Bietsch et al. (2000) "Conformational Contact and Pattern Stability of Stamps Used for Soft Lithography," J. Appl. Phys. 88:4310-4318.

BIOFLEX—Biocompatible Flexible Electronic Circuits. Available at http://tfcg.elis.ugent.be/projects/bioflex. Accessed Feb. 8, 2012.

Bishay et al. (2000) "Temperature Coefficient of the Surface Resistivity of Two-Dimensional Island Gold Films," J. Phys. D. Appl. Phys. 33(18):2218-2222.

Blanchet et al. (2003) "Large Area, High Resolution, Dry Printing of Conducting Polymers for Organic Electronics," Appl. Phys. Lett. 82:463-465.

Blanchet et al. (2003) "Printing Techniques for Plastic Electronics," J. Imag. Sci. Tech. 47(4):296-303.

Blazdell et al. (Nov. 1999) "Preparation of Ceramic Inks for Solid Freeforming Using a Continuous Jet Printer," J. Mat. Syn. Process. 7(6):349-356.

Boltau et al. (1998) "Surface-Induced Structure Formation of Polymer Blends on Patterned Substrates," Nature 391:877-879.

Boncheva et al. (Mar. 15, 2005) "Magnetic Self-Assembly of Three-Dimensional Surfaces from Planar Sheets," Proc. Natl. Acad. Sci. USA 102(11):3924-3929.

Boncheva et al. (Mar. 8, 2005) "Templates Self-Assembly: Formation of Folded Structures by Relaxation of Pre-Stressed, Planar Tapes. The Path to Ubiquitous and Low-cost Organic Electronic Appliances on Plastic," Adv. Mater. 17(5):553-557.

Bowden et al. (1997) "Self Assembly of Mesoscale Objects into Ordered Two-Dimensional Arrays," Science 276:233-235.

Bowden et al. (1998) "Spontaneous Formation of Ordered Structures in Thin Films of Metals Supported on an Elastomeric Polymer," Nature 393:146-149.

Bowden et al. (2001) "Molecule-Mimetic Chemistry and Mesoscale Self-Assembly," Acc. Chem. Res. 34:231-238.

Bracher et al. (2009) "Shaped Films of Ionotropic Hydrogels Fabricated Using Templates of Patterns Paper," Adv. Mater. 21:445-450.

Braun et al. (1999) "Electrochemically Grown Photonic Crystals," Nature 402:603-604.

Britton et al. (Web Release Oct. 25, 2005) "Microstructural Defect Characterization of a Si:H Deposited by Low Temperature HW-CVD on Paper Substrates," Thin Solid Films 501(1-2)79-83.

Brown et al. (Dec. 19, 2001) "Heterogeneous Materials Integration: Compliant Substrates to Active Device and Materials Packaging," Mater. Sci. Eng. B 87(3):317-322.

Brown, H.R. (1991) "The Adhesion Between Polymers," Ann. Rev. Mater. Sci. 21:463-489.

Bruschi et al. (2001) "Micromachined Silicon Suspended Wires With Submicrometric Dimensions," Microelectron. Eng. 57-58:959-965.

Buma et al. (2001) "High-Frequency Ultrasound Array Element Using Thermoelastic Expansion in an Elastomeric Film," Appl. Phys. Lett. 79:548-550.

Burdinski et al. (2005) "Single Etch Patterning of Stacked Silver and Molybdenum Alloy Layers on Glass Using Microcontat Wave Printing," J. Am. Chem. Soc. 127(31):10786-10787.

Burdinski, D. (non-dated) "Soft Lithography and Microcontact Wave Printing," http://www.research.philips.com/technologies/light_dev_microsys/softlitho/index.html , Downloaded May 23, 2007.

Burgin et al. (2000) "Large Area Submicrometer Contact Printing Using a Contact Aligner," Langmuir 16:5371-5375.

Burns et al. (2003) "Printing of Polymer Thin-Film Transistors for Active-Matrix-Display Applications," J. Soc. Inf. Display 11:599-604.

Campbell et al. (2000) "Fabrication of Photonic Crystals for the Visible Spectrum by Holographic Lithography," Nature 404:53-56.

Cao et al. (2006) "Highly Bendable,Transparent Thin-Film Transistors That Use Carbon-Nanotube-Based Conductors and Semiconductors with Elastomeric Delectrics," Adv. Mater. 18(3):304-309.

Cao et al. (Jul. 24, 2008) "Medium-Scale Carbon Nanotube Thin-Film Integrated Circuits on Flexible Plastic Substrates," Nature 454:495-500.

Carr et al. (1998) "Measurement of Nanomechanical Resonant Structures in Single-Crystal Silicon," J. Vac. Sci. Technol. B 16:3821-3824.

(56) References Cited

OTHER PUBLICATIONS

Chadhury et al. (1991) "Direct Measurement of Interfacial Interactions Between Semispherical Lenses and Flat Sheets of Poly(dimethylsiloxane) and their Chemical Derivatives," Langmuir 7:1013-1025.
Chang et al. (1994) "Process Techniques, Lithography and Device-Related Physics and Principles," In; GaAs High-Speed Devices: Physics, Technology and Circuit Application, John Wiley and Sons, New York, pp. 115-278.
Chen et al. (Jun. 2002) Effect of Process Parameters on the Surface Morphology and Mechanical Performance of Silicon Structures After Deep Reactive Ion Etching (DRIE) J. Microelectromech. Syst. 11(3):264-2775.
Chen et al. (2003) "Characterization of Pd-GaAs Schottly Diodes Prepared by the Electrodes Plating Technique," Semiconductor. Sci. Technol. 18:620-626.
Chen et al. (2003) "Electronic Paper: Flexible Active-Matrix Electronics Ink Display," Nature. vol. 423, p. 136.
Chen et al. (Mar. 2004) "A Family of Herringbone Patterns in Thin Films," Scr. Mater. 50(6):797-801.
Chen et al. (2004) "Herringbone Buckling Patterns of Compresses Thin Films on Comlliant Substrates," J. Appl. Mech. 71:597.
Chen et al. (2005) "InGaN Nanorings and Nanodots by Selective Area Epitaxy," Appl. Phys. Lett. 87:143111.
Chen et al. (2005) "The Role of Metal-Nanotube Caontact in the Performance of Carbon Nanotube Field-Effect Transistors," Nano Lett. 5(7):1497-1502.
Chen et al. (Feb. 27, 2006) "Complementary Carbon Nanotube-Gated Carbon Nanotube Thin-Fim Transistor," Appl. Phys. Lett. 88:093502.
Chen et al. (Mar. 24, 2006) "An Integrated Logic Circuit Assembled on a Single Carbon Nanotube," Science vol. 311, p. 1735.
Cheng et al. (2005) "Ink-Jet Printing, Self-Assembled Polyelectrolytes, and Electroless Plating: Low Cost Fabrication of Circuits on a Flexible Substrate at Room Temperature," Macromol. Rapid Commun. 26:247-264.
Childs et al. (2002) "Decal Transfer Microlithography: A New Soft-Lithographic Patterning Method," J. Am. Chem. Soc. 124:13583-13596.
Childs et al. (Aug. 14, 2004) "Patterning of Thin-Film Microstructures on Non-Planar Substrate Surfaces Using Decal Transfer Lithography," Adv. Mater. 16(15):1323-1327.
Childs et al. (2005) "Masterless Soft-Lithography: Patterning UV/Ozone-lnduced Adhesion on Poly(dimethylsiloxane) Surfaces," Langmuir 21:10096-10105.
Choi et al. (Web Release Jan. 25, 2005) "Simple Detachment Patterning of Organic Layers and Its Applications to Organic Light-Emitting Diodes," Adv. Mater. 17(2):166-171.
Choi et al. (2007) "Biaxially Stretchable 'Wavy' Silicon Nanomembranes," Nano Lett. 7(6): 1655-1663.
Chou et al. (Jun. 8, 1999) "Micromachining on (111)-Oriented Silicon," Sens. Actuators A 75(3):271-277.
Chou et al. (2004) "An Orientation-Controlled Pentacene Film Aligned by Photoaligned Polyimide for Organic Thin-Film Transistor Applications," Adv. Func. Mater. 14:811-815.
Chu et al. (2005) "High-Performance Organic Thin-Film Transistors with Metal Oxide/Metal Bilayer Electrode," Appl. Phys. Lett. 87:193508.
Chung et al. (2000) "Silicon Nanowire Devices," Appl. Phys. Lett. 76(15):2068-2070.
Chung et al. (Jul. 1, 2003) "A Study on Formation of Al and Al2O3 on the Porous Paper by DC Magnetron Sputtering," Surf. Coat. Technol. 171(1-3):65-70.
Collins et al. (Apr. 27, 2001) "Engineering Carbon Nanotubes and Nanotube Circuits Using Electrical Breakdown," Science 292:706-709.
Creagh et al. (2003) "Design and Performance of Inkjet Print Heads for Non-Graphic-Arts Applications," MRS Bull. 28:807-811.
Crone et al. (Feb. 3, 2000) "Large-Scale Complementary Integrated Circuits Based on Organic Transistors," Nature 403:521-523.
Crowder et al. (1998) "Low-Temperature Single-Crystal Si TFTs Fabricated on Si Films Processed via Sequential Lateral Solidification," IEEE Electron. Dev. Lett. 19:306-308.
Cui et al. (2001) "Nanowire Nanosensors for Highly Sensitive and Selective Detection of Biological and Chemical Species," Science 293:1289-1292.
Dai et al. (2003) "Novel Nanostructures of Functional Oxides Synthesized by Thermal Evaporation," Adv. Funct. Mater. 13:9-24.
Dai et al. (Web Release Jan. 15, 2002) "Gallium Oxide Nanoribbons and Nanosheets," J. Phys. Chem. B 106(5):902-904.
Davidson et al. (2004) "Supercritical Fluid-Liquid-Solid Synthesis of Gallium Arsenide Nanowires Seeded by Alkanethiol-Stabilized Gold Nanocrystals," Adv. Mater. 16:646-649.
De Boer et al. (2004) "Organic Single-Crystal Field-Effect Transistors," Phys. Stat. Sol. 201:1302-1331.
De Gans (2004) "Inkjet Printing of Polymers: State of the Art and Future Developments," Adv. Mater. 16(3):203-213.
De Sio et al. (Web Release May 18, 2005) "Electro-Optical Response of a Single-Crystal Diamond Ultraviolet Photoconductor in Transverse Configuration," Appl. Phys. Lett. 86:213504.
Decision of Refusal corresponding to Japanese Patent Application No. P2007-515549, Dispatched Sep. 4, 2012—English translation only.
Decision of Rejection corresponding to Korean Patent Application No. 10-2007-7000216, dated Sep. 19, 2012—includes English Translation.
Decision of Refusal corresponding to Japanese Patent Application No. P2009-527564, Dispatched Jan. 29, 2013—Japanese language with English translation.
Decision of Rejection corresponding to Korean Patent Application No. 10-2006-0053675, dated Jul. 30, 2013—English translation only.
Deen et al. (2004) "Electrical Characterization of Polymer-Based FETs Fabricated By Spin-Coating Poly(3-alkylthiophene)s," IEEE Trans. Electron Devices 51:1892-1901.
Delmerche et al. (1997) "Stability of Molded Polydimethylsiloxane Microstructures," Adv. Mat. 9:741-746.
Deruelle et al. (1995) "Adhesion at the Solid-Elastomer Interface: Influence of Interfacial Chains," Macromol. 28:7419-7428.
Derycke et al. (Sep. 2001) "Carbon Nanotube Inter- and Intramolecular Logic Gates," Nano Lett. 1(9):453-456.
Desai et al. (Feb. 1999) "Nanopore Technology for Biomedical Applications," Biomed. Microdevices 2(1):11-40.
Dick et al. (2004) "Synthesis of Branched 'Nanotrees' by Controlled Seeding of Multiples Branching Events," Nat. Mater. 3:380-384.
Dimroth et al. (Mar. 2007) "High-Efficiency Multijunction Solar Cells," MRS Bull. 32:230-235.
Ding et al. (Oct. 4, 2004) "Self Catalysis and Phase Transformation in the Formation ofCdSe Nanosaws," Adv. Mater. 16(19):1740-1743.
Dinsmore et al. (2002) "Colloidosomes: Selectively Permeable Capsules Composed of Colloidal Particles," Science 298:1006-1009.
Divliansky et al. (2003) "Fabrication of Three-Dimensional Polymer Photonic Crystal Structures Using Single Diffraction Element Interference Lithography," Appl. Phys. Lett. 82(11):1667-1669.
Dodabalapur A. (Apr. 2006) "Organic and Polymer Transistors for Electronics," Mater Today 9(4):24-30.
Dodabalapur et al. (1995) "Organic Transistors: Two-Dimensional Transport and Improved Electrical Characteristics," Science 268:270-271.
Duan et al. (2000) "General Synthesis of Compound Semiconductor Nanowires," Adv. Mater. 12:298-302.
Duan et al. (2003) "High-performance Thin-Film Transistors Using Semiconductor Nanowires and Nanoribbons," Nature 425:274-278.
Duan X, (2003) "Semiconductor Nanowires: From Nanoelectronics to Macroelectronics," Abstract from a presentation given at the 11th Foresight Conference on Molecular Nanotechnology, October 10-20, Burlingame, CA.
Duboz et al. (1998) "Transistors and Detectors Based on GaN-Related Materials," In; Group III Nitride Semiconductor Compounds, Gill, B. ed., Clarendon, Oxford, pp. 343-387.

(56) References Cited

OTHER PUBLICATIONS

Duffy et al. (1998) "Rapid Prototyping of Microfluidic Systems in Poly(dimethylsiloxane)," Anal. Chem. 70(23):4974-4984.
Durkop et al. (2004) "Extraordinary Mobility in Semiconducting Carbon Nanotube," Nano Lett. 4(1):35-39.
Eder et al. (Apr. 5, 2004) "Organic Electronics on Paper," Appl. Phys. Lett. 84(14):2673-2675.
Edrington et al. (2001) "Polymer-Based Photonic Crystals," Adv. Mater. 13:421-425.
Efimenko et al. (Oct. 15, 2002) "Surface Modification of Sylgard-184 Poly(dimethyl Siloxane) Networks by Ultraviolet and Ultraviolet/Ozone Treatment," J. Colloid Interface Sci. 254(2):306-315.
Eftekhari, G. (1993) "Variation in the Effective Richardson Constant of Metal—GaAs and Metal—InP Contacta Due to the Effect of Processing Parameters," Phys. Status Solid A—Appl. Res. 140:189-194.
Ensell, G. (1995) "Free Standing Single-Crystal Silicon Microstructures," J. Micromech. Microeng. 5:1-4.
Examination Report, Corresponding to Singapore Patent Application No. 200608359-6, Completed on Aug. 27, 2008.
Examination Report, Corresponding to Malaysian Patent Publication No. PI 20052553, dated Mar. 13, 2009 and Dec. 8, 2009.
Examination Report, Corresponding to Malaysian Patent Application No. PI 20062672, dated Aug. 28, 2009.
Examination Report, Corresponding to European Application No. EP 05 756 327.2, dated Jan. 20, 2010.
Examination Report, Corresponding to Malaysian Patent Application No. PI 20092343, dated Jun. 15, 2010.
Examination Report, Corresponding to European Patent Application No. 07841968.6, dated Apr. 27, 2012.
Faez et al. (1999) "An Elastomeric Conductor Based on Polyaniline Prepared by Mechanical Mixing," Polymer 40:5497-5503.
Felgner et al. (1996) "Flexural Rigidity of Microtubules Measured with the Use of Optical Tweezers," J. Cell Sci. 109:509-516.
Fink et al. (1999) "Block Copolymers as Photonic Bandgap Materials," J. Lightwave Tech. 17:1963-1969.
Flewitt et al. (2005) "Low-Temperature Deposition of Hydrogenated Amorphous Silicon in an Electron Cyclotron Resonance Reactor for Flexible Displays," Proc. IEEE 93:1364-1373.
Folch et al. (1999) "Wafer-Level In-Registry Microstamping," J. Microelectromech. Syst. 8:85-89.
Forment et al. (2004) "Influence of Hydrogen Treatment and Annealing Processes Upon the Schottky Barrier Height of Au/n-GaAs and Ti/n-GaAs Diodes," Semicond. Sci. Technol. 19:1391-1396.
Forrest et al. (2004) "The Path to Ubiquitous and Low-Cost Organic Electronic Appliances on Plastic," Nature 428:911-918.
Fortunato et al. (2005) "Flexible a-Si: H Position-Sensitive Detectors," Proc. IEEE 93:1281-1286.
Fortunato et al. (Sep. 2008) "High-Performance Flexible Hybrid Field-Effect Transistors Based on Cellulose Fiber Paper," IEEE Electron. Dev. Lett. 29(9):988-990.
Freire et al. (1999) "Thermal Stability of Polyethylene Terephthalate (PET): Oligomer Distribution and Formation of Volatiles," Packag. Technol. Sci. 12:29-36.
Freund, L.B. (2000) "The Mechanics of Electronic Materials," Int. J. Solids Struct. 37:185-196.
Friedman et al. (2005) "Nanotechnology: High-Speed Integrated Nanowire Circuits," Nature 434:1085.
Fu et al. (Jan. 10, 2003) "Patterning of Diamond Microstructures on Si Substrate by Bulk and Surface Micromachining," J. Mater. Process. Technol. 132(1-3):73-81.
Furneaux et al. (1989) "The Formation of Controlled-Porosity Membranes from Anodically Oxidized Aluminum," Nature 337:147-149.
Gan et al. (2002) "Preparation of Thin-Film Transistors with Chemical Bath Deposited CdSe and CdS Thin Films," IEEE Trans. Electron. Dev. 49:15-18.
Gao et al. (Sep. 9, 2005) "Conversion of Zinc Oxide Nanobelts into Superlattice-Structures Nanohelices," Science 309:1700-1704.
Garcia et al. (Oct. 2004) "Etchant Anisotropy Controls the Step Bunching Instability in KOH Etching of Silicon," Phys. Rev. Lett. 93(16):166102.
Garnier et al. (1994) "All-Polymer Field-Effect Transistor Realized by Printing Techniques," Science 265:1684-1686.
Geim et al. (Mar. 2007) "The Rise of Graphene," Nature Mater. 6:183-191.
Geissler et al. (2003) "Fabrication of Metal Nanowires Using Microcontact Printing," Langmuir 19(15):6301-6311.
Geissler et al. (Jun. 2003) "Selective Wet-Etching of Microcontact-Printed Cu Substrates with Control Over the Etch Profile," Microelec. Eng. 67-68:326-332.
Gelinck et al. (2000) "High-Performance All-Polymer Integrated Circuits," Appl. Phys. Lett. 77:1487-1489.
Gelinck et al. (2004) "Flexible Active-Matrix Displays and Shift Registers Based on Solution-Processed Organic Transistors," Nat. Mater. 3:106-110.
Georgakilas et al. (2002) "Wafer-Scale Integration of GaAs Optoelectronic Devices with Standard Si Integrated Circuits Using a Low-Temperature Bonding Procedure," Appl. Phys. Lett. 81:5099-5101.
Givargizov, E.I. (1991) "Applications," In; Oriented Crystallization on Amorphous Substrates, Plenum Press, New York, pp. 341-363.
Goetting et al. (1999) "Microcontact Printing of Alkanephosphonic Acids on Aluminum: Pattern Transfer by Wet Chemical Etching," Langmuir 15:1182-1191.
Goldman et al. (1996) "Correlation of Buffer Strain Relaxation Modes with Transport Properties of Two-Dimensional Electron Gases," J. Apple. Phys. 80:6849-6854.
Goldmann et al. (2004) "Hole Mobility in Organic Single Crystals Measured by a "Flip-Crystal" Field-Effect Technique," J. Appl. Phys. 96:2080-2086.
Goldsmith, T.H. (Sep. 1990) "Optimization, Constraint, and History in the Evolution of Eyes," Quart. Rev. Biol. 65(3):281-322.
Gray et al. (2004) "High-Conductivity Elastomeric Electronics," Adv. Mater. 16:393-397.
Gray et al. (Dec. 2001) "Screen Printed Organic Thin Film Transistors (OTFTs) on a Flexible Substrate," Proc. SPIE 4466:89-94.
Grayson, T. (2002) "Curved Focal Plane Wide Field of View Telescope Design," Proc. SPIE 4849:269-274.
Gruen et al. (Mar. 21, 1994) "Fullerenes as Precursors for Diamond Film Growth Without Hydrogen or Oxygen Additions," Appl. Phys. Lett. 65(12):1502-1504.
Gudiksen et al. (Web Release Apr. 18, 2001) "Synthetic Control of the Diameter and Length of Single Crystal Semiconductor Nanowires," J. Phys. Chem. B 105:4062-4064.
Guo et al. (Aug. 19, 2002) "Metal-lnsulator-Semiconductor Electrostatics of Carbon Nanotubes," Appl. Phys. Lett. 81 (8):1486-1488.
Gur et al. (2005) "Air-Stable All-Inorganic Nanocrystal Solar Cells Processed from Solution," Science 310:462-465.
Gurbuz et al. (Jul. 2005) "Diamond Semiconductor Technology for RF Device Applications." Solid State Electron. 49(7):1055-1070.
Haisma et al. (2002) "Contact Bonding, Including Direct-Binding in a Historical and Recent Context of Materials Science and Technology, Physics and Chemistry -Historical Review in a Broader Scope and Comparative Outlook," Mater. Sci. Eng. R 37:1-60.
Halik et al. (2004) "Low-Voltage Organic Transistors with an Amorphous Molecular Gate Dielectric," Nature 431:963-966.
Hamedi et al. (May 2007) "Towards Woven Logic from Organic Electronic Fibres," Nat. Mater. 6:357-362.
Hamilton et al. (2004) "Field-Effect Mobility of Organic Polymer Thin-Film Transistors," Chem. Mater. 16:4699-4704.
Han et al. (2005) "Template-Free Directional Growth of Single-Walled Carbon Nanotues on a- and r-Plane Sapphire," J. Am. Chem. Soc. 127:5294-5295.
Harada et al. (2001) "Catalytic Amplification of the Soft Lithographic Patterning of Si. Nonelectrochemical Orthogonal Fabrication of Photoluminescent Porous Si Pixel Arrays," J. Am. Chem. Soc. 123:8709-8717.
Harkonen et al. (Jun. 8, 2006) "4 W Single-Transverse Mode VECSEL Utilizing Intra-Cavity Diamond Heatspreader," Electron Lett. 42(12):693-694.

(56) References Cited

OTHER PUBLICATIONS

He et al. (2005) "Si Nanowire Bridges in Microtrenches: Integration of Growth into Device Fabrication," Adv. Mater. 17:2098-2102.
Hillbrog et al. (Web Release Dec. 30, 2003) "Nanoscale Hydrophobic Recovery: A Chemical Force Microscopy Study of UV/Ozone-Treated Cross-Linker Poly(dimethylsiloxane)," Langmuir 20(3):785-794.
Hines et al. (2005) "Nanotransfer Printing of Organic and Carbon Nanotube Thin-Film Transistors on Plastic Substrates," Appl. Phys. Lett. 86:163101.
Holmes et al. (Feb. 25, 2000) "Control of Thickness and Orientation of Solution-Grown Silicon Nanowires," Science 287:1471-1473.
Horn et al. (1992) "Contact Electrification and Adhesion Between Dissimilar Materials," Science 256:362-364.
Hoyer, P. (1996) "Semiconductor Nanotube Formation by a Two-Step Template Process," Adv. Mater. 8:857-859.
Hsia et al. (2005) "Collapse of Stamps for Soft Lithography Due to Interfacial Adhesion," Appl. Phys. Lett. 86:154106.
Hsu et al. (2002) "Amorphous Si TFTs on Plastically Deformed Spherical Domes," J. Non-Crystalline Solids 299-302:1355-1359.
Hsu et al. (2003) "Nature of Electrical Contacts in a Metal—Molecule—Semiconductor System," J. Vac. Sci. Technol. B 21(4):1928-1935.
Hsu et al. (2004) "Effects of Mechanical Strain on TFTs on Spherical Strains," IEEE Trans. Electron Dev. 51(3):371-377.
Hsu et al. (Jan. 15, 2004) "Spherical Deformation of Compliant Substrates with Semiconductor Device Islands," J. Appl. Phys. 95(2):705-712.
Hu et al. (1997) "Using Soft Lithography to Fabricate GaAs/AlGaAs Heterostructure Field Effect Transistors," Appl. Phys. Lett. 71:2020—2022.
Hu et al. (1999) Chemistry and Physics in One Dimension: Synthesis and Properties of Nanowires and Nanotubes, Acc. Chem. Res. 32:435-445.
Huang et al. (2001) "Directed Assembly of One-Dimensional Nanostructures into Functional Networks," Science 291:630-633.
Huang et al. (2001) "Room-Temperature Ultraviolet Nanowire Nanolasers," Science 292:1897-1899.
Huang et al. (Jan. 16, 2001) "Catalytic Growth of Zinc Oxide Nanowires by Vapor Transport," Adv. Mater. 13(2):113-116.
Huang et al. (2004) "Self-Organizing High-Density Single-Walled Carbon Nanotube Arrays from Surfactant Suspensions," Nanotechnol. 15:1450-1454.
Huang et al. (2005) "Nanomechanical Architecture of Strained Bilayer Thin Films: From Design Principles to Experimental Fabrication," Adv. Mater. 17(23):2860-2864.
Huang et al. (2005) "Nanowires for Integrated Multicolor Nanophotonics," Small 1(1):142-147.
Huang et al. (2005) "Nonlinear Analyses of Wrinkles in a Film Bonded to a Compliant Substrate," J. Meeh. Phys. Solids 53:2101-2118.
Huang et al. (2005) "Stamp Collapse in Soft Lithography," Langmuir 21:8058-8068.
Huck et al. (2000) "Ordering of Spontaneously Formed Buckles on Planar Surfaces," Langmuir 16:3497-3501.
Huie, J.C. (2003) "Guided Molecular Self-Assembly: A Review of Recent Efforts," Smart Mater. Struct. 12:264-271.
Huitema et al. (2001) "Plastic Transistors in Active-Matrix Displays," Nature 414:599.
Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," Appl. Phys. Lett. 85(23):5730-5732.
Hur et al. (Jun. 13, 2005) "Extreme Bendability of Single Walled Carbon Nanotube Networks Transferred From High-Temperature Growth Substrates to Plastic and Their Use in Thin-Film Transistors," Appl. Phys. Lett. 243502.
Hur et al. (2005) "Organic Nanodelectrics for Low Voltage Carbon Nanotube Thin Film Transistors and Complementary Logo Gates," J. Am. Chem. Soc. 127:13808-13809.
Hutchinson et al. (1992) "Mixed Mode Cracking in Layered Materials," Adv. Appl. Meeh. 29:63-191.
Imparato et al. (2005) "Excimer Laser Induced Crystallization of Amorphous Silicon on Flexible Polymer Substrates," Thin Solid Films 487:58-62.
International Search Report and Written Opinion, Corresponding to International Application No. PCT/US2007/077759, dated Apr. 11, 2008.
International Search Report and Written Opinion, Corresponding to International Application No. PCT/US2005/014449, dated Jul. 3, 2008.
International Search Report and Written Opinion, Corresponding to International Application No. PCT/US2007/022959, dated Oct. 14, 2008.
International Search Report and Written Opinion, Corresponding to International Application No. PCT/US2009/036192, dated Jul. 6, 2009.
Isberg et al. (Sep. 6, 2002) "High Carrier Mobility in Single-Crystal Plasma-Deposited Diamond," Science 297:1670-1672.
Islam et al. (Jan. 16, 2003) "High Weight Fraction Surfactant Solubilization of Single-Wall Carbon Nanotubes in Water," Nano Lett. 3(2):269-273.
Ismach et al. (2004) "Atomic-Step-Templated Formation or a Single Wall Carbon Nanotube Patterns," Angew. Chem. Int. Ed. 43:6140-6143.
Itoh et al. (1991) "Cathodoluminescence Properties of Undoped and Zn-Doped $Al_xGa_{1-x}N$ Grown by Metaloganic Vapor Phase Epitaxy," Jap. J. Appl. Phys. 30:1604-1608.
Jabbour et al. (2001) "Screen Printing for the Fabrication of Organic Light-Emitting Devices," IEEE J. Select. Top. Quantum. Electron. 7(5):769-773.
Jackman et al. (Aug. 4, 1995) "Fabrication of Submicrometer Features on Curved Substrates by Microcontact Printing," Science 269:664-666.
Jacobs et al. (2002) "Fabrication of a Cylindrical Display by Patterned Assembly," Science 296:323-325.
Jain et al. (2000) "III-Nitrides: Growth, Characterization, and Properties," J. Appl. Phys. 87:965-1006.
Jain et al. (2005) "Flexible Electronics and Displays: High-Resolution, Roll-to-Roll, Projection Lithography and Photoblation processing Technologies for High-Throughput Production," Proc. IEEE 93:1500-1510.
James et al. (1998) "Patterned Protein Layers on Solid Substrates by This Stamp Microcontact Printing," Langmuir 14:742-744.
Jang et al. (2006) "Low-Voltage and High-Field-Effect Mobility Organic Transistors with a Polymer Insulator," Appl. Phys. Lett. 88:072101.
Javey et al. (2002) "High-κDielectrics for Advanced Carbon-Nanotube Transistors and Logic Gates," Nature Mater. 1:241-246.
Javey et al. (Aug. 7, 2003) "Ballistic Carbon Nanotube Field-Effect Transistors," Nature 424:654-657.
Jenkins et al. (1994) "Gallium Arsenide Transistors: Realization Through a Molecularly Designed Insulator," Science 263:1751-1753.
Jeon et al. (1995) "Patterning of Dielectric Oxide Thin Layers by Microcontact Printing of Self-Assembled Monolayers," J. Mater. Res. 10:2996-2999.
Jeon et al. (2004) "Fabricating Complex Three-Dimensional Nanostructures with High Resolution Conformable Phase Masks," Proc. Natl. Acad. Sci. USA 101:12428-12433.
Jeon et al. (Aug. 4, 2004) "Three Dimensional Nanofabrication with Rubber Stamps and Conformable Photomasks," Adv. Mater. 16(15):1369-1373.
Jiang et al. (1999) "Preparation of Macroporous Metal Films from Colloidal Crystals," J. Am. Chem. Soc. 121:7957-7958.
Jiang et al. (2002) "Polymer-on-Polymer Stamping: Universal Approaches to Chemically Patterned Surfaces," Langmuir 18:2607-2615.
Jiang et al. (Oct. 2, 2007) "Finite Deformation Mechanics in Buckled Thin Films on Compliant Supports," Proc. Natl. Acad. Sci. USA 104(40):15607-15612.
Jin et al. (2004) "Scalable Interconnection and Integration of Nanowire Devices Without Registration," Nano Lett. 4:915-919.

(56) References Cited

OTHER PUBLICATIONS

Jin et al. (2004) "Soft Lithographic Fabrication of an Image Senbsor Array on a Curved Substrate," J. Vac. Sci. Technol. B 22:2548-2551.
Joachim et al. (Nov. 30, 2000) "Electronics Using Hybrid-Molecular and Mono-Molecular Devices," Nature 408:541-548.
Johnson et al. (1999) "Ordered Mesoporous Polymers of Tunable Pore Size from Colloidal Silica Templates," Science 283:963-965.
Jones et al. (Jul./Aug. 2004) "Stretchable Wavy Metal Interconnects," J. Vac. Sci. Technol. A 22(4):1723-1725.
Joo et al. (2006) "Low-Temperature Solution-Phase Synthesis of Quantum Well Structures CdSe Nanoribbons," J. Am. Chem. Soc. 128(17):5632-5633.
Jortner et al. (2002) "Nanostructured Advanced Materials Perspectives and Directions," Pure Appl. Chem. 74(9):1491-1506.
Kagan (1999) "Organic-Inorganic Hybrid Materials as Semiconducting Channels in Thin-Film Field-Effect Transistors," Science 286:945-947.
Kagan et al. (2001) "Patterning Organic-Inorganic Thin-Film Transistors Using Microcontact Printed Templates," Appl. Phys Lett. 79(21):3536-3538.
Kagan et al. (2003) Thin Film Transistors, Dekker, New York, pp. 1-34.
Kane et al. (2000) "Analog and Digital Circuits Using Organic Thin-Film Transistors on Polyester Substrates," IEEE Electron. Dev. Lett. 21:534-536.
Kane et al. (Apr. 2007) "High-performance Electronics Using Dense, Perfectly Aligned Arrays of Single-Walled Carbon Nanotubes," Nat. Nanotechnol. 2(4):230-236.
Kang et al. (2007) "High-Performance Electronics Using Dense, Perfectly Aligned Arrays of Single-Walled Carbon Nanotubes," Nat. Nanotechnol. 2:230-236.
Kar et al. (Web Release Feb. 8, 2005) "Controlled Synthesis and Photoluminescence Properties of ZnS Nanowires and Nanoribbons," J. Phys. Chem. B 109(8):3298-3302.
Kar et al. (Web Release Sep. 28, 2005) "Synthesis and Optical Properties of CdS Nanoribbons," J. Phys. Chem B. 109(41):19134-19138.
Kar et al. (Web Release Feb. 18, 2006) "Shape Selective Growth of CdS One-Dimensional Nanostructures by a Thermal Evaporation Process," J. Phys. Chem. B. 110(10):4542-4547.
Karnik et al. (2003) "Lateral Polysilicon p+-p-n+ and p+-n-n+ Diodes," Solid-State Electronics 47:653-659.
Karnik et al. (2003) "Multiple Lateral Polysilicon Diodes as Temperature Sensors for Chemical Microreaction Systems," Jpn. J. Appl. Phys. 42:1200-1205.
Kato et al. (2004) The Characteristic Improvement of Si(111) Metal-Oxide-Semiconductor Field-Effect Transistor by Long-Time Hydrogen Annealing, Jpn. J. Appl. Phys. 43(10):6848-6853.
Katz et al. (2001) "Synthetic Chemistry for Ultrapure, Processable, and High-Mobility Organic Transistor Semiconductors," Acc. Chem. Res. 34:359-369.
Katz, H.E. (2004) "Recent Advances in Semiconductor Performance and Printing Processes for Organic Transistor-Based Electronics," Chem. Mater. 16:4748-4756.
Kawata et al. (2001) "Finer Features for Functional Microdevices," Nature 412:697-698.
Kendall, D.L. (1979) "Vertical Etching of Silicon at Very High Apect Ratios," Ann. Rev. Mater. Sci. 9:373-403.
Khan et al. (1993) "High Electron Mobility Transistor Based on a GaN-AlxGa1-xN Heterojunction," Appl. Phys. Lett. 63:1214-1215.
Khang et al. (2006) "A Stretchable Form of Single-Crystal Silicon for High-Performance Electronics on Rubber Substraights," Science 311:208-212.
Kilby, J.S. (1976) "Invention of the Integrated Circuit," IEEE Trans. Electron. Dev. 23:648-654.
Kim et al. (Nov. 15, 1999) "Direct Observation of Electron Emission Site on Boron-Doped Polycrystalline Diamond Thin Films Using an Ultra-High-Vacuum Scanning Tunneling Microscope," Appl. Phys. Lett. 75(20):3219-3221.
Kim et al. (2000) "Field Emission from Carbon Nanotubes for Displays," Diamond and Related Mater. 9(3-6):1184-1189.
Kim et al. (2002) "Nanolithography Based on Patterned Metal Transfer and its Application to Organic Electronic Devices," Appl. Phys. Lett. 80:4051-4053.
Kim et al. (2003) "Epitaxial self-assembly of block copolymers on lithographically defined nanopatterned substrates," Nature 424:411-414.
Kim, Y.S. (Web Release Aug. 9, 2005) "Microheater-Integrated Single Gas Sensor Array Chip Fabricated on Flexible Polyimide Substrate," Sens. Actuators B 114(1):410-417.
Kim et al. (Oct. 2004) "Organic TFT Array on a Paper Substrate," IEEE Electron. Dev. Lett. 25(10):702-704.
Kim et al. (Jan. 2008) "Complementary Logic Gates and Ring Oscillators Plastic Substrates by Use of Printed Ribbons Single-Crystalline Silicon," IEEE Electron. Dev. Lett. 29(1):73-76.
Kim et al. (Web Release Feb. 29, 2008) "Highly Emissive Self-Assembled Organic Nanoparticles Having Dual Color Capacity for Targeted Immunofluorescence Labeling," Adv. Mater. 20(6):1117-1121.
Kim et al. (Apr. 25, 2008) "Stretchable and Foldable Silicon Integrated Circuits," Science 320:507-511.
Kim et al. (Dec. 2, 2008) "Materials and Noncoplanar Mesh Designs for Integrated Circuits with Linear Elastic Responses to Extreme Mechanical Deformations," Proc. Natl. Acad. Sci. USA 105(48):18675-18680.
Kim et al. (2009) "Optimized Structural Designs for Stretchable Silicon Integrated Circuits," Small 5(24):2841-2847.
Kim et al. (Web Release Jul. 6, 2009) "Ultrathin Silicon Circuits with Strain-Isolation Layers and Mesh Layouts for High-Performance Electronics on Fabric, Vinyl, Leather and Paper," Adv. Mater. 21(36):3703-3707.
Klauk et al. (2002) "High-Mobility Polymer Gate Dielectric Pentacene Thin Film Transistors," J. Appl. Phys. 92:5259-5263.
Klein-Wiele et al. (2003) "Fabrication of Periodic Nanostructures by Phase-Controlled Multiple-Beam Interference," Appl. Phys. Lett. 83(23):4707-4709.
Knipp et al. (2003) "Pentacine Thin Film Transistors on Inorganic Dielectrics: Morphology, Structural Properties, and Electronic Transport," J Appl. Phys. 93:347-355.
Ko et al. (2006) "Bulk Quantities of Single-Crystal Silicon Micro-/Nanoribbons Generated from Bulk Wafers," Nano Lett. 6(10):2318-2324.
Ko et al. (Aug. 7, 2008) "A Hemispherical Electronic Eye Camera Based on Compressible Silicon Optoelectronics," Nature 454:748-753.
Ko et al. (Web Release Oct. 28, 2009) "Curvilinear Electronics Formed Using Silicon Membrane Circuits and Elastomeric Transfer Elements," Small 5(23):2703-2709.
Kocabas et al. (2005) "Guided Growth of Large-Scale, Horizontally Aligned Arrays of Single-Walled Carbon Nanotubes and Their Use in Thin-Film Transistors," Small 1(11):1110-1116.
Kocabas et al. (2006) "Spatially Selective Guided Growth of High-Coverage Arrays and Random Networks of Single-Walled Carbon Nanotubes and Their Integration into Electronic Devices," J. Am. Chem. Soc. 128:4540-4541.
Kocabas et al. (Feb. 5, 2008) "Radio Frequency Analog Electronics Based on Carbon Nanotube Transistors," Proc. Natl. Acad. Sci. USA 105(5):1405-1409.
Kodambaka et al. (2006) "Control of Si Nanowire Growth by Oxygen," Nano Lett. 6(6):1292-1296.
Koide et al. (2000) "Patterned Luminescence of Organic Light-Emitting Diodes by Hot Microcontact Printing (HµCP) of Self-Assembled Monolayers," J. Am. Chem. Soc. 122(45):11266-11267.
Konagai et al. (1978) "High Efficiency GaAs Thin Film Solar Cells by Peeled Film Technology," J. Cryst. Growth 45:277-280.
Kong et al. (Oct. 29, 1998) "Synthesis of Individual Single-Walled Carbon Nanotubes on Patterned Silicon Wafers," Nature 395:878-881.
Kong et al. (Jan. 28, 2000) "Nanotube Molecular Wires as Chemical Sensors," Science 287:622-625.
Kong et al. (Oct. 2003) "Structure of Indium Oxide Nanobelts," Solid State Commun. 128(1):1-4.

(56) References Cited

OTHER PUBLICATIONS

Kong et al. (2004) "Single-Crystal Nanorings Formed by Epitaxial Self-Coiling of Polar Nanobelts," Science 303:1348-1351.
Kudo et al. (Web Release Jun. 13, 2006) "A Flexible and Wearable Glucose Sensor Based on Functional Polymers with Soft-MEMS Techniques," Biosens. Bioelectron. 22:558-562.
Kulkarni et al. (2002) "Mesoscale Organization of Metal Nanocrystals," Pure Appl. Chem 74(9):1581-1591.
Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," Appl. Phys. Lett. 63(14):2002-2004.
Kumar et al. (1994) "Patterning Self-Assembled Monolayers: Applications in Materials Science," Langmuir 10:1498-1511.
Kumar et al. (2002) "Thermally-Stable Low-Resistance Ti/Al/Mo/Au Multilayer Ohmic Contacts on n-GaN," J. Appl. Phys. 92:1712-1714.
Kuo et al. (1985) "Effect of Mismatch Strain on Band Gap in III-V Semiconductors," J. Appl. Phys. 57:5428-5432.
Kuykendall et al. (Aug. 2004) "Crystallographic Alignment of High Density Gallium Nitride Nanowire Arrays," Nat. Mater. 3:524-528.
Lacour et al. (2003) "Stretchable Gold Conductors on Elastomeric Substrates," Appl. Phys. Lett. 82(15):2404-2406.
Lacour et al. (Apr. 2004) "Design and Performance of Thin Metal Film Interconnects for Skin-Like Electronic Circuits," IEEE Electron. Dev. Lett. 25(4):179-181.
Lacour et al. (Dec. 2004) "An Elastically Stretchable TFT Circuit," IEEE Electron Dev. Lett. 25(12):792-794.
Lacour et al. (2005) "Stretchable Interconnects for Elastic Electronic Surfaces," Proc. IEEE 93(8):1459-1467.
Lacour et al. (Web Release May 16, 2006) "Mechanisms of Reversible Stretchability of Thin Metal Films on Elastomeric Substrates," Appl. Phys. Lett. 88:204103.
Lacour et al. (Web Release Jul. 14, 2006) "Stiff Subcircuit Islands of Diamondlike Carbon for Stretchable Electronics," J. Appl. Phys. 100:014913.
Laimer et al. (Mar. 1997) "Diamond Growth in a Direct-Current Low-Pressure Supersonic Plasmajet," Diamond Relat. Mater. 6:406-410.
Lambacher et al. (2004) "Electrical Imaging of Neuronal Activity by Multi-Transistor-Array (MTA) Recording at 7.8 µm Resolution," Appl. Phys. A 79:1607-1611.
Landes et al. (2002) "Some Properties of Spherical and Rod-Shaped Semiconductor and Metal Nanocrystals," Pure Appl. Chem. 74(9):1675-1692.
Law et al. (Aug. 27, 2004) "Nanoribbon Waveguides for Subwavelength Photonics Integration," Science 305:1269-1273.
Law et al. (2004) "Semiconductor Nanowires and Nanotubes," Ann. Rev. Mater. Res. 34:83-122.
Leclercq et al. (1998) "III-V Micromachined Devices for Microsystems," Microelectronics J. 29:613-619.
Lecomte et al. (Apr. 2006) "Degradation Mechanism of Diethylene Glycol Units in a Terephthalate Polymer," Polym. Degrade. Stab. 91(4):681-689.
Lee et al. (Dec. 1999) "The Surface/Bulk Micromachining (SBM) Process: A New Method For Fabricating Released MEMS in Single Crystal Silicon," J. Microelectromech. Syst. 8(4):409-416.
Lee et al. (2000) "Thin Film Transistors for Displays on Plastic Substrates," Solid State Electron. 44:1431-1434.
Lee et al. (Feb. 2001) "Application of Carbon Nanotubes to Field Emission Displays," Diamond and Related Mater. 10(2):265-270.
Lee et al. (2003) "High-Performance Poly-Si TFTs on Plastic Substrates Using a Nano-Structured Separation Layer Approach," IEEE Elec. Dev. Lett. 24:19-21.
Lee et al. (2004) "Organic Light-Emitting Diodes Formed by Soft Contact Lamination," Proc. Natl. Acad. Sci. USA 101(2):429-433.
Lee et al. (2005) "A Printable Form of Single-Crystalline Gallium Nitride for Flexable Optoelectronic Systems," Small 1:1164-1168.
Lee et al. (Feb. 2005) "Weave Patterned Organic Transistors on Fiber for E-Textiles," IEEE Trans. Electron. Dev. 52(2):269-275.
Lee et al. (Apr. 2005) "Fabrication of Stable Metallic Patterns Embedded in Poly(dimethylsiloxane) and Model Applications in Non-Planar Electronic and Lab-on-a-Chip Device Patterning," Adv. Funct. Mater. 15(4):557-566.
Lee et al. (2005) "Large-Area, Selective Transfer of Microstructured Silicon (µs-Si): A Printing-Based Approach to High-Performance Thin-Film Transistors Supported on Flexible Substraights," Adv. Mater. 17:2332-2336.
Lee et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," Appl. Phys. Lett. 100:084907/1-7.
Li et al. (2002) "High-Resolution Contact Printing with Dendrimers," Nano Lett. 2(4):347-349.
Li et al. (Jul. 1, 2002) "ZnO Nanobelts Grown on Si Substrate," Appl. Phys. Lett. 81(1):144-146.
Li et al. (2003) "Ultrathin Single-Crystalline-Silicon Cantilever Resonators: Fabrication Technology and Significant Specimen Size Effect on Young's Modulus," Appl. Phys. Lett. 83:3081-3083.
Li et al. (2004) "Electrospinning of Nanofibers: Reinventing the Wheel," Adv. Mater. 16(14):1151-1170.
Li et al. (Dec. 2005) "Compliant Thin Film Patterns of Stiff Materials as Platforms for Stretchable Electronics," J. Mater. Res. 20(12):3274-3277.
Li et al. (Web Release Mar. 16, 2006) "Catalyst-Assisted Formation of Nanocantilever Arrays on ZnS Nanoribbons by Post-Annealing Treatment," J. Phys. Chem. B 110(13):6759-6762.
Lieber, C. (2001) "The Incredible Shrinking Circuit," Sci. Am. 285(3):58-64.
Lieber, C.M. (2003) "Nanoscale Science and Technology: Building a Big Future from Small Things," MRS. Bull. 28:486-491.
Lim et al. (2005) "Flexible Membrane Pressure Sensor," Sens. Act. A 119:332-335.
Lima et al. (2007) "Creating Micro- and Nanostructures on Tubular and Spherical Surfaces," J. Vac. Sci. Technol. B 25(6):2412-2418.
Lin et al. (2005) "High-Performance Carbon Nanotube Field-Effect Transistor with Tunable Polarities," IEEE Trans. Nano 4(5):481-489.
Linder et al. (1994) "Fabrication Technology for Wafer Through-Hole Interconnections and Three-Dimensional Stacks of Chips and Wafers," Proc. IEEE Micro. Electro Mech. Syst. 349-354.
Ling et al. (2004) "Thin Film Deposition, Patterning, and Printing in Organic Thin Film Transistors," Chem. Mater. 16:4824-4840.
Long et al. (1990) "Heterostructure FETs and Bipolar Transistors," In; Gallium Arsenide Digital Integrated Circuit Design, McGraw-Hill, New York, pp. 58-69.
Loo et al. (2002) "Additive, Nanoscale Patterning of Metal Films with a Stamp and a Surface Chemistry Mediated Transfer Process: Applications in Plastic Electronics," Appl. Physics Lett. 81:562-564.
Loo et al. (2002) "High-Resolution Transfer Printing on GaAs Surfaces Using Alkane Dithiol Monolayers," J. Vac. Sci. Technol. B 20(6):2853-2856.
Loo et al. (2002) "Interfacial Chemistries for Nanoscale Transfer Printing," J. Am. Chem. Soc. 124:7654-7655.
Loo et al. (2002) "Soft, Conformable Electrical Contacts for Organic Semiconductors: High-Resolution Plastic Circuits by Lamination," Proc. Natl. Acad. Sci. USA 99(16):10252-10256.
Loo et al. (2003) "Electrical Contacts to Molecular Layers by Nanotransfer Printing," Nano Lett. 3(7):913-917.
Lopes et al. (Sep. 2004) "Thermal Conductivity of PET/(LDPE/Al) Composites Determined by MDSC," Polym. Test.23(6):637-643.
Lu et al. (Dec. 2006) "Electronic Materials-Buckling Down for Flexible Electronics," Nat. Nanotechnol. 1:163-164.
Lu et al. (Jul. 19, 2005) "One Dimensional Hole Gas in Germanium/Silicon Nanowire Heterostructures," Proc. Nat. Acad. Sci. USA 102(29):10046-10051.
Lu et al. (Nov. 2008) "Nanowire Transistor Performance Limits and Applications," IEEE Trans Electron Dev. 55(11):2859-2876.

(56) References Cited

OTHER PUBLICATIONS

Luan et al. (1992) "An Experimental Study of the Source/Drain Parasitic Resistance Effects in Amorphous Silicon Thin Film Transistors," J. Appl. Phys. 72:766-772.
Ma et al. (2004) "Single-Crystal CdSe Nanosaws," J. Am. Chem. Soc. 126(3):708-709.
Mack et al. (2006) "Mechanically Flexible Thin-Film Transistors that Use Ultrathin Ribbons of Silicon Derived from Bulk Wafers," Appl. Phys. Lett. 88:213101.
Madou, M. (1997) "Etch-Stop Techniques," In; Fundamentals of Microfabrication, CRC Press, New York, pp. 193-199.
Maikap et al. (2004) "Mechanically Strained-Si NMOSFETs," IEEE Electron. Dev. Lett. 25:40-42.
Maldovan et al. (2004) "Diamond-Structured Photonic Crystals," Nature Materials 3:593-600.
Mandlik et al. (Aug. 2006) "Fully Elastic Interconnects on Nanopatterned Elastomeric Substrates," IEEE Electron Dev. Lett. 27(8):650-652.
Manna et al. (Web Release May 25, 2003) "Controlled Growth of Tetrapod-Branched Inorganic Nanocrystals," Nat. Mater. 2:382-385.
Markovich et al. (1999) "Architectonic Quantum Dot Solids," Acc. Chem. Res. 32:415-423.
Marquette et al. (2004) "Conducting Elastomer Surface Texturing: A Path to Electrode Spotting Application to the Biochip Production," Biosens. Bioelectron. 20:197-203.
Martensson et al. (2004) "Nanowire Arrays Defined by Nanoimprint Lithography," Nano Lett. 4:699-702.
Martin, C.R. (1995) "Template Synthesis of Electronically Conductive Polymer Nanostructures," Acc. Chem. Res. 28:61-68.
Mas-Torrent et al. (2006) "Large Photoresponsivity in High-Mobility Single-Crystal Organic Field-Effect Phototransistors," ChemPhysChem 7:86-88.
Masuda et al. (2000) "Fabrication of Ordered Diamonds/Metal Nanocomposite Structures," Chem. Lett. 10:1112-1113.
Matsunaga et al. (2003) "An Improved GaAs Device Model for the Simulation of Analog Integrated Circuit," IEEE Trans. Elect. Dev. 50:1194-1199.
McAlpine et al. (2003) "High-Performance Nanowire Electronics and Photonics on Glass and Plastic Substrates," Nano Lett. 3:1531-1535.
McAlpine et al. (2005) "High-Performance Nanowire Electronics and Photonics and Nanoscale Patterning on Flexible Plastic Substrates," Proc. IEEE 93:1357-1363.
McCaldin et al. (1971) "Diffusivity and Solubility of Si in the Al Metallization of Integrated Circuits," Appl. Phys. Lett. 19:524-527.
Meisel et al. (2004) "Three-Dimensional Photonic Crystals by Holographic Lithography Using the Umbrella Configuration: Symmetries and Complete Photonic Band Gaps," Phys. Rev. B. 70:165101:1-10.
Meitl et al. (2004) "Solution Casting and Transfer Printing Single-Walled Carbon Nanotube Films," Nano Lett. 4(9): 1643-1947.
Meitl et al. (2006) "Transfer Printing by Kinetic Control of Adhesion to an Elastomeric Stamp," Nat. Mater. 5:33-38.
Meitl et al. (Web Release Feb. 22, 2007) "Stress Focusing for Controlled Fracture in Microelectromechanical Systems," Appl. Phys. Lett. 90:083110.
Melosh et al. (2003) "Ultrahigh-Density Nanowire Lattices and Circuits," Science 300:112-115.
Menard et al. (2004) "A Printable Form of Silicon for High Performance Thin Film Transistors on Plastic Substrates," Appl. Phys. Lett. 84:5398-5400.
Menard et al. (2004) "High-Performance n- and p-Type Single-Crystal Organic Transistors with Free-Space Gate Dielectrics," Adv. Mat. 16:2097-2101.
Menard et al. (2004) "Improved Surface Chemistries, Thin Film Deposition Techniques, and Stamp Designs for Nanotransfer Printing," Langmuir 20:6871-6878.
Menard et al. (2005) Bendable Single Crystal Silicon Thin Film Transistors Formed by Printing on Plastic Substrates Appl. Phys. Lett. 86:093507.
Miao et al. (2003) "Micromachining of Three-Dimensional GaAs Membrane Structures Using High-Energy Nitrogen Implantation," J. Micromech. Microeng. 13:35-39.
Michel et al. (2001) Printing Meets Lithography: Soft Approaches to High-Resolution Patterning, IBM J. Res. Dev. 45(5):697-719.
Miller et al. (2002) "Direct Printing of Polymer Microstructures on Flat and Spherical Surfaces Using a Letterpress Technique," J. Vac. Sci. Technol. B 20(6):2320-2327.
Milliron et al. (2004) "Colloidal Nanocrystal Heterostructures with Linear and Branched Topology," Nature 430:190-195.
Min, G. (Apr. 4, 2003) "Plastic Electronics and Their Packaging Technologies," Syn. Metals. 135:141-143.
Mirkin et al. (Jul. 2001) "Emerging Methods for Micro- and Nanofabrication," MRS Bull. 26(7):506-507.
Misewich et al. (May 2, 2003) "Electronically Induced Optical Emission from a Carbon Nanotube FET," Science 300:783-786.
Mishra et al. (2002) "AlGaN/GaN HEMTs—an Overview of Device Operation and Applications," Proc. IEEE 90:1022-1031.
Mitzi et al. (2004) "High-Mobility Ulltrathin Semiconducting Films Prepared by Spin Coating," Nature 428:299-303.
Moon et al. (2002) "Ink-Jet Printing of Binders for Ceramic Compinents," J. Am. Ceram. Soc. 85(4):755-762.
Moore et al. (Sep. 9, 2003) "Individually Suspended Single-Walled Carbon Nanotubes in Various Surfactants," Nano Lett. 3(10):1379-1382.
Morales et al. (Jan. 9, 1998) "A Laser Ablation Method for the Synthesis of Crystalline Semiconductor Nanowires," Science 279:208-211.
Morent et al. (2007) "Adhesion Enhancement by a Dielectric Barrier Discharge of PDMS used for Flexible and Stretchable Electronics," J. Phys. D. Appl. Phys. 40:7392-7401.
Mori et al. (1978) "A New Etching Solution System, H3PO4-H2O2-H2O, for GaAs and Its Kinetics," J. Electrochem. Soc. 125:1510-1514.
Morkoc et al. (1995) "High-Luminosity Blue and Blue-Green Gallium Nitride Light-Emitting Diodes," Science 267:51-55.
Morkved et al. (1994) "Mesoscopic Self-Assembly of Gold Islands on Diblock-Copolymer Films," Appl. Phys. Lett. 64:422-424.
Morra et al. (1990) "On the Aging of Oxygen Plasma-Treated Polydimethylsiloxane Surfaces," J. Colloid Interface Sci. 137:11-24.
Namazu et al. (2000) "Evaluation of Size Effect on Mechanical Properties of Single Crystal Silicon by Nanoscale Bending Test Using AFM," J. MEMS 9:450-459.
Nath et al. (2002) "Nanotubes of the Disulfides of Groups 4 and 5 Metals," Pure Appl. Chem. 74(9):1545-1552.
Nathan et al. (2000) "Amorphous Silicon Detector and Thin Film Transistor Technology for Large-Area Imaging of X-Rays,." Microelectron J. 31:883-891.
Nathan et al. (2002) "Amorphous Silicon Technology for Large Area Digital X-Ray and Optical Imaging," Microelectronics Reliability 42:735-746.
Newman et al. (2004) "Introduction to Organic Thin Film Transistors and Design of n-Channel Organic Semiconductors," Chem. Mater. 16:4436-4451.
Nirmal et al. (1999) "Luminescence Photophysics in Semiconductor Nanocrystals," Acc. Chem. Res. 32:407-414.
Noda et al. (1996) "New Realization Method for Three-Dimensional Photonic Crystal in Optical Wavelength Region," Jpn. J. Appl. Phys. 35:L909-L912.
Nomura et al. (2004) "Room-Temperature Fabrication of Transparent Flexible Thin-Film Transistors Using Oxide Semiconductors," Nature 432:488-492.
Notice of Allowance corresponding to Korean Patent Application No. 10-2013-7034843, dated Sep. 30, 2015.
Notice of Allowance corresponding to Japanese Patent Application No. 2015-095093, dated Nov. 1, 2016—Search results only.
Notice of Allowance corresponding to U.S. Appl. No. 15/084,211, dated Apr. 25, 2017.

(56) References Cited

OTHER PUBLICATIONS

Notice of Reasons for Rejection, Corresponding to Japanese Patent Application No. P2006-165159, dated Apr. 24, 2012.
Notice of Reasons for Rejection, Corresponding to Japanese Patent Application No. P2006-165159, dated Apr. 16, 2013.
Novoselov et al. (Oct. 22, 2004) "Electric Field Effect in Atomically Thin Carbon Films," Science 306:666-669.
O'Connell et al. (Jul. 26, 2002) "Bang Gap Fluorescence from Individual Single-Walled Caarbon Nanotubes," Science 297:593-596.
Odom et al. (2002) "Improved Pattern Transfer in Soft Lithography Using Composite Stamps," Langmuir 18:5314-5320.
Office Action, Corresponding to U.S. Appl. No. 11/145,542, filed Jun. 2, 2005, dated Apr. 5, 2007.
Office Actions, Corresponding to U.S. Appl. No. 11/145,542, dated between Apr. 5, 2007 and Dec. 23, 2008.
Office Action, Corresponding to U.S. Appl. No. 11/423,287, dated Feb. 13, 2008.
Office Actions, Corresponding to Chinese Patent Application No. 200580018159.5, dated Jan. 23, 2009 and Feb. 12, 2010.
Office Action, Corresponding to U.S. Appl. No. 11/851,182, dated Apr. 1, 2010.
Office Action, Corresponding to Taiwan Patent Application No. 095121212, dated May 7, 2010.
Office Action, Corresponding to Chinese Patent Application No. 200580013574.1, dated May 11, 2010.
Office Action Corresponding to Chinese Patent Application No. 200780049982.1, dated May 12, 2010.
Office Action, Corresponding to U.S. Appl. No. 11/981,380, dated Sep. 23, 2010.
Office Action, corresponding to U.S. Appl. No. 11/851,182, dated Oct. 29, 2010.
Office Actions Corresponding to U.S. Appl. No. 11/851,182, dated Apr. 1, 2010, Oct. 29, 2010 and Jun. 7, 2011.
Office Action Corresponding to Chinese Patent Application No. 200780041127.6, dated Apr. 8, 2011.
Office Action, Corresponding to U.S. Appl. No. 12/405,475, dated Jun. 8, 2011.
Office Action, Corresponding to Indian Patent Application No. 1366/DEL/2006, dated Jun. 10, 2011.
Office Action Corresponding to U.S. Appl. No. 12/398,811, dated Nov. 26, 2012.
Office Action corresponding to Korean Patent Application No. 10-2013-0131753, dated Jan. 29, 2014—with English translation.
Office Action corresponding to U.S. Appl. No. 14/155,010, dated Sep. 17, 2015.
Office Action corresponding to Chinese Patent Application No. 2013104361165, dated Oct. 10, 2015.
Office Action corresponding to Japanese Patent Application No. P2014-201741, dated Nov. 4, 2015.
Office Action corresponding to U.S. Appl. No. 15/084,211, dated Nov. 17, 2016.
Office Action corresponding to European Patent Application No. 1300427.5, dated Jan. 2, 2017.
Ohzono et al. (2004) "Ordering of Microwrinkle Patterns by Compressive Strain," Phys. Rev. B 69(13):132202.
Ohzono et al. (Web Release Jul. 7, 2005) "Geometry-Dependent Stripe Rearrangement Processes Induced by Strain on Preordered Microwrinkle Patterns," Langmuir 21(16):7230-7237.
Ong et al. (2004) "High-Performance Semiconducting Poolythiophenes for Organic Thin-Film Transistors," J. Am. Chem. Soc. 126:3378-3379.
Ong et al. (2005) "Design of High-Performance Regioreular Polythiophenes for Organic Thin-Film Transistors," Proc. IEEE 93:1412-1419.
Origin Energy (May 2004) "Fact Sheet—Sliver Cells," www.originenergy.com.au/sliver.
O'Riordan et al. (2004) "Field Configured Assembly: Programmed Manipulation and Self-Assembly at the Mesoscale," Nano Lett. 4:761-765.

Ouyang et al. (Web Release Mar. 20, 2000) "Conversion of Some Siloxane Polymers to Silicon Oxide by UV/Ozone Photochemical Processes," Chem. Mater. 12(6):1591-1596.
Ouyang et al. (2002) "High-Performance, Flexible Polymer Light-Emitting Diodes Fabricated by a Continuous Polymer Coating Process," Adv. Mat. 14:915-918.
Ouyang et al. (2008) "High Frequency Properties of Electro-Textiles for Wearable Antenna Applications," IEEE Trans. Antennas Propag. 56(2):381-389.
Pan et al. (2001) "Nanobelts of Semiconducting Oxides," Science 291:1947-1949.
Panev et al. (2003) "Sharp Exciton Emission from Single InAs Quantum Dots in GaAs Nanowires," Appl. Phys. Lett. 83:2238-2240.
Pardo et al. (2000) "Application of Screen Printing in the Fabrication of Organic Ligh-Emitting Devices," Adv. Mater. 12(17):1249-1252.
Park et al. (1997) "Block Copolymer Lithography: Periodic Arrays of ~1011 Holes in 1 Square Centimeter," Science 276:1401-1404.
Park et al. (1998) "Fabrication of Three-Dimensional Macroporous Membranes with Assemblies of Microspheres as Templates," Chem. Mater. 10:1745-1747.
Patton et al. (Mar. 1998) "Effect of Diamond like Carbon Coating and Surface Topography on the Performance of Metal Evaporated Magnetic Tapes," IEEE Trans Magn. 34(2):575-587.
Paul et al. (Apr. 2003) "Patterning Spherical Surfaces at the Two Hundred Nanometer Scale Using Soft Lithography," Adv. Func. Mater. 13(4):259-263.
Pearton et al. (1999) "GaN: Processing, Defects, and Devices," J. Appl. Phys. 86:1-78.
Peng et al. (Mar. 2, 2000) "Shape Control of CdSe Nanocrystals," Nature 404:59-61.
Piazza et al. (2005) "Protective Diamond-Like Carbon Coatings for Future Optical Storage Disks," Diamond Relat. Mater. 14:994-999.
Podzorov et al. (2005) "Hall Effect in the Accumulation Layers on the Surface of Orgaic Semiconductors," Phys. Rev. lett. 95:226601.
Pushpa et al. (2002) "Stars and Stripes. Nanoscale Misfit Dislocation Patterns on Surfaces," Pure Appl. Chem. 74(9):1663-1671.
Quake et al. (2000) "From Micro- to Nanofabrication with Soft Materials," Science 290:1536-1540.
Radtke et al. (Feb. 5, 2007) "Laser-Lithography on Non-Planar Surfaces," Opt. Exp. 15(3):1167-1174.
Raman et al. (1989) "Study of Mesa Undercuts Produced in GaAs with H3PO4-Based Etchants," J. Electrochem. Soc. 136:2405-2410.
Razeghi et al. (1994) "High-Power Laser Diodes Based on InGaAsP Alloys," Nature 369:631-633.
Razouk et al. (Sep. 1979) "Dependence of Interface State Density on Silicon Thermal Oxidation Process Variables," J. Electrochem. Soc. 126(9):1573-1581.
Response to Office Action, corresponding to U.S. Appl. No. 11/851,182, filed Aug. 12, 2010.
Response to Office Action, corresponding to U.S. Appl. No. 11/851,182, filed Mar. 29, 2011.
Reuss et al. (2005) "Macroelectronics: Perspectives on Technology and Applications," Proc. IEEE 93:1239-1256.
Reuss et al. (Jun. 2006) "Macroelectronics," MRS Bull. 31:447-454.
Ribas et al. (1998) "Bulk Micromachining Characterization of 0.2 mm HEMT MMIC Technology forGaAs MEMS Design," Mater. Sci. Eng. B 51:267-273.
Ridley et al. (1999) "All-Inorganic Field Effect Transistors Fabricated by Printing," Science 286:746-749.
Roberts et al. (1979) "Looking at Rubber Adhesion," Rubber Chem. Technol. 52:23-42.
Roberts et al. (May 2006) "Elastically Relaxed Free-Standing Strained-Silicon Nanomembranes," Nat. Mater. 5:388-393.
Robinson et al. (1983) "GaAs Readied for High-Speed Microcircuits," Science 219:275-277.
Roelkens et al. (Dec. 2005) "Integration of InP/InGaAsP Photodetectors onto Silicon-on-insulator Waveguide Circuits," Optics Express 13(25):10102-10108.

(56) References Cited

OTHER PUBLICATIONS

Rogers et al. (1997) "Using an Elastomeric Phase Mask for Sub-100 nm Photolithography in the Optical Near Field," Appl. Phys. Lett. 70:2658-2660.
Rogers et al. (1998) "Generating ~90 Nanometer Features Using Near Field Contact Mode Photolithography with an Elastomeric Phase Mask," J. Vac. Sci. Technol. 16(1):59-68.
Rogers et al. (1998) "Quantifying Distortions in Soft Lithography," J. Vac. Sci. Technol. 16:88-97.
Rogers et al. (1998) "Using Printing and Molding Techniques to Produce Distributed Feedback and Bragg Reflector Resonators for Plastic Lasers," Appl. Phys. Lett. 73:1766-1768.
Rogers et al. (1999) Printing Process Suitable for Reel-to-Reel Production of High-Performance Organic Transistors and Circuits, Adv. Mater. 11 (9):741-745.
Rogers et al. (2000) "Organic Smart Pixels and Complementart Inverter Circuits Formed on Plastic Substrates by Casting and Rubber Stamping," IEEE Electron Dev. Lett. 21 (3):100-103.
Rogers et al. (2001) "Paper-Like Electronic Displays: Large-Area Rubber-Stamped Plastic Sheets of Electronics and Microencapsulated Electrophoretic Inks," Proc. Natl. Acad. Sci. USA 98:4835-4840.
Rogers, J.A. (2001) "Rubber Stamping for Plastic Electronics and Fiber Optics," MRS Bulletin 26(7):530-534.
Rogers, J.A. (2001) "Toward Paperlike Displays," Science 291:1502-1503.
Rogers et al. (2002) "Printed Plastic Electronics and Paperlike Displays," J. Polym. Sci. Part A. Polym. Chem. 40:3327-3334.
Rogers, J. (Jul. 9, 2010) "Farewell to Flatland," Science 329:138-139.
Rosenblatt et al. (2002) "High Performance Electrolyte Gated Carbon Nanotube Transistors," Nano Lett. 2(8):869-872.
Rotkin et al. (2003) "Universal Description of Channel Conductivity for Nanotube and Nanowire Transistors," Appl. Phys. Lett. 83:1623-1625.
Roundy et al. (2003) "Photonic Crystal Structure with Square Symetry within Each Layer and a Three-Dimensional Band Gap," Appl. Phys Lett. 82:3835-3837.
Ruchehoeft et al. (2000) "Optimal Strategy for Controlling Linewidth on Spherical Focal Surface Arrays," J. Vac. Sci. Technol. B 18(6):3185-3189.
Samuelson et al. (2004) "Semiconductor Nanowires for Novel One-Dimensional Devices," Physica E 21:560-567.
Sanyal et al. (2002) "Morphology of Nanostructures Materials," Pure Appl. Chem. 74(9):1553-1570.
Sazonov et al. (2005) "Low-Temperature Materials and Thin-Film Transistors for Flexible Electronics," Proc. IEEE 93:1420-1428.
Schermer et al. (2005) "Thin-Film GaAs Epitaxial Lift-Off Solar Cells for Space Applications," Prog. Photovolt. Res. Appl. 13:587-596.
Schermer et al. (2006) "Photon Confinement in High-Efficiency, Thin Film III-V Solar Cells Obtained by Epitaxial Lift-Off," Thin Solid Films 211-512:645-653.
Schmid et al. (Mar. 25, 2000) "Siloxane Polymers for High-Resolution, High-Accuracy Soft Lithography," Macromolecules 33(8):3042-3049.
Schmidt et al. (Mar. 8, 2001) "Thin Solid Films Roll up into Nanotubes," Nature 410:168.
Schmid et al. (2003) "Preparation of Metallic Films on Elastomeric Stamps and Their Application for Contact Processing and Contact Printing," Adv. Funct. Mater. 13:145-153.
Schnable et al. (1969) "Aluminum Metallization; Advantages and Limitations for Integrated Circuit Applications," IEEE 57:1570-1580.
Schneider et al. (2008) "Mechanical Properties of Silicones for MEMS," J. Micromech. Microeng. 18:065008.
Schon et al. (1995) "Ambipolar Pentacene Field-Effect Transistors and Inverters," Science 287:1022-1023.

Schrieber et al. (1998) "The Effectiveness of Silane Adhesion Promotors in the Performance of Polyurethane Adhesives," J. Adhesion 68:31-44.
Scorzoni et al. (Oct. 4, 2004) "On the Relationship Between the Temperature coefficient of Resistance and the Thermal Conductance of Integrated Metal Resistors," Sens Actuators A 116(1):137-144.
Search Report, Corresponding to Republic of China (Taiwan) Patent Application No. 094118507, dated Feb. 24, 2007.
Search Report for Corresponding International PCT Application No. PCT/US2005/019354 dated Apr. 18, 2007.
Search and Examination Report, Corresponding to Singapore Patent Application No. 200607372-0, dated Oct. 17, 2007.
Search Report and Examination Report Corresponding to Singapore Patent Application No. 200901178-4, Completed Mar. 13, 2010.
Search Report Corresponding to Taiwanese Patent Application No. 095121212, Completed Oct. 8, 2010.
Search Report for Patent Application, Corresponding to Republic of China (Taiwan) Patent Application No. 094118507.
Second Office Action Corresponding to Chinese Patent Application No. 200780041127.6, dated May 2, 2012.
Sekitani et al. (2005) "Bending Experimant on Pentacene Field-Effect Transistors on Plastic Films," Appl. Phys. Lett. 86:073511.
Sekitani et al. (Sep. 12, 2008) "A Rubberlike Stretchable Active Matrix Using Elastic Conductors," Science 321:1468-1472.
Sen et al. (2002) "Nonequilibrium Processes for Generating Silicon Nanostructures in Single-Crystalline Silicon," Pure Appl. Chem. 74(9):1631-1641.
Serikawa et al. (May 1, 2000) "High-Mobility Poly-Si Thin Film Transistors Fabricated on Stainless-Steel Foils by Low-Temperature Processes Using Sputter-Depositions," Jpn. J. Appl. Phys. 39:L393-L395.
Servanti et al. (2005) "Functional Pixel Circuits for Elastic AMOLED displays," Proc. IEEE 93:1257-1264.
Service, R.F. (Aug. 15, 2003) "Electronic Textiles Charge Ahead," Science 301:909-911.
Shan et al. (2004) "From Si Source Gas Directly to Positioned, Electrically Contacted Si Nanowires: The Self-Assembling 'Grow-in-Place' Approach," Nano Lett. 4(11):2085-2089.
Sharp et al. (2003) "Holographic Photonic Crystals with Diamond Symmetry," Phys. Rev. B 68:205102/1-205102/6.
Sheraw et al. (2002) "Organic Thin-Film Transistor-Driven Polymer-Dispersed Liquid Crystal Displays on Flexible Polymeric Substrates," Appl. Phys. Lett. 80:1088-1090.
Shetty et al. (2005) "Formation and Characterization of Silicon Films on Flexible Polymer Substrates," Mater. Lett. 59:872-875.
Shi et al. (Sep. 2000) "Synthesis of Large Areas of Highly Oriented, Very Long Silicon Nanowires," Adv. Mater. 12(18):1343-1345.
Shi et al. (Web Release Oct. 11, 2001) "Free-Standing Single Crystal Silicon Nanoribbons," J. Am. Chem. Soc. 123(44):11095-11096.
Shtein et al. (Oct. 15, 2004) "Direct Mask-Free Patterning of Molecular Organic Semiconductors Using Organic Vapor Jet Printing," J. Appl. Phys. 96(8):4500-4507.
Shull et al. (1998) "Axisymmetric Adhesion Tests of Soft Materials," Macromol. Chem. Phys. 199:489-511.
Siegel et al. (Web Release Feb. 7, 2007) "Microsolidics: Fabrication of Three-Dimensional Metallic Microstructures in Poly(dimethylsiloxane)," Adv. Mater. 19(5):727-733.
Sim et al. (1993) "An Analytical Back-Gate Bias Effect Model for Ultrathin SOI CMOS Devices," IEEE Trans. Elec. Dev. 40:755-765.
Sirringhaus et al. (Dec. 15, 2000) "High-Resolution Inkjet Printing of All-Polymer Transistor Circuits," Science 290:2123-2126.
Sirringhaus et al. (2003) "Inkjet Printing of Functional Materials," MRS Bull. 28:802-806.
Sirringhaus, H. (2005) "Device Physics of Solution-Processed Organic Field-Effect Transistors," Adv. Mater. 17:2411-2425.
Smay et al. (2002) "Colloidal Inks for Directed Assembly of 3-D Periodic Structures," Langmuir 18:5429-5437.
Smith et al. (2000) "Electric-Field Assisted Assembly and Alignment of Metallic Nanowires," Appl. Phys. Lett. 77(9):1399-1401.
Someya et al. (Jul. 6, 2004) "A Large-Area, Flexible Pressure Sensor Matrix With Organic Field-Effect Transistors for Artificial Skin Applications," Proc. Nat. Acad. Sci. USA 101(27):9966-9970.

(56) References Cited

OTHER PUBLICATIONS

Someya et al. (2005) "Conformable, Flexible, Large-Area Networks of Pressure and Thermal Sensors with Organic Transistor Active Matrixes," Proc. Nat. Acad. Sci. USA 102:12321-12325.
Someya et al. (2005) "Integration of Organic FETs with Organic Photodiodes fora Large Area, Flexible, and Lightweight Sheet Image Scanners," IEEE Trans. Electron Devices 52:2502-2511.
Someya, T. (Aug. 7, 2008) "Electronic Eyeballs," Nature 454:703-704.
Soole et al. (Mar. 1991) "InGaAs Metal-Semiconductor-Metal Photodetectors for Long Wavelength Optical Communications," IEEE J. Quantum Electron. 27(3):737-752.
Srinivasan et al. (Web Release Mar. 26, 2007) "Piezoelectric/Ultrananocrystalline Diamond Heterostructures for High-Performance Multifunctional Micro/Nanoelectromechanical Systems," Appl. Phys. Lett. 90:134101.
Stafford et al. (2004) "A Buckling-Based Metrology for Measuring the Elastic Moduli of Polymeris Thin Films," Nature Mater. 3:545-550.
STELLA Project—Stretchable Electronics for Large-Area Applications. Available at www.stella-project.de. Accessed Feb. 8, 2012.
Storm et al. (Web Release Jul. 13, 2003) "Fabrication of Solid-State Nanopores with Single-Nanometre Precision," Nat. Mater. 2:537-540.
Strukov et al. (2005) "CMOL FPGA: A Reconfigurable Architecture for Hybrid Digital Circuits with Two-Terminal Nanodevices," Nanotechnology 16:888-900.
Substantive Examination Adverse Report, Corresponding to Malaysian Patent Application No. PI 20062672, dated Aug. 28, 2009.
Substantive Examination Adverse Report, Corresponding to Malaysian Patent Application No. PI 20094997, dated Aug. 15, 2012.
Substantive Examination Adverse Report, Corresponding to Malaysian Patent Application No. PI 20090622, dated Sep. 28, 2012.
Sumant et al. (Apr. 2005) "Toward the Ultimate Tribological Interface: Surface Chemistry and Nanotribology of Ultrananocrystalline Diamond," Adv. Mater. 17(8):1039-1045.
Sun et al. (2004) "Fabricating Semiconductor Nano/Microwires and Transfer Printing Ordered Arrays of them onto Plastic Substrates," Nano Lett. 4:1953-1959.
Sun et al. (2005) "Advances in Organic Field-Effect Transistors," J. Mater. Chem. 15:53-65.
Sun et al. (2005) "Bendable GaAs Metal-Semiconductor Field-Effect Transistors Formed with a Printed GaAs Wire Arrays on Plastic Substrates," Appl. Phys. Lett. 87:083501.
Sun et al. (2005) "Photolithographic Route to the Fabrication of Micro/Nanowires of III-V Semiconductors," Adv. Funct. Mater. 15:30-40.
Sun et al. (Nov. 2006) "Buckled and Wavy Ribbons of GaAs for High-Performance Electronics on Elastomeric Substrates," Adv. Mater. 18(21):2857-2862.
Sun et al. (Web Release Dec. 5, 2006) "Controlled Buckling of Semiconductor Nanoribbons for Stretchable Electronics," Nature Nanotech. 1:201-207.
Sun et al. (2007) "Inorganic Semiconductors for Flexible Electronics," Adv. Mater. 19:1897-1916.
Sun et al. (2007) "Structural Forms of Single Crystal Semiconductor Nanoribbons for High-Performance Stretchable Electronics," J. Mater Chem. 17:832-840.
Sundar et al. (2004) "Elastomeric Transistor Stamps: Reversible Probing of CHaarge Transport in Organic Crystals," Science 303:1644-1646.
Suo et al. (Feb. 22, 1999) "Mechanics of Rollable and Foldable Film-on-Foil Electronics," Appl. Phys. Lett. 74(8): 11771179.
Supplementary European Search Report, Corresponding to European Application No. EP 05 75 6327, Completed Sep. 25, 2009.
Supplementary European Search Report Corresponding to European Patent Application No. 07 84 1968, Completed Mar. 31, 2011.
Supplemental European Search Report. Corresponding to European Application No. EP 09 71 6695, dated Jun. 26, 2012.
Swain et al. (2004) "Curved CCD Detector Devices and Arrays for Multi-Spectral Astrophysical Application and Terrestrial Stereo Panoramic Cameras," Proc. SPIE 5499:281-301.
SWEET: Stretchable and Washable Electronics for Embedding Textiles. Available at http://tfcg.elis.ugent.be/projects/sweet. Accessed Feb. 8, 2012.
Sze, S. (1985) "Lithography and Etching," In; Semiconductor Devices: Physics and Technology, New York: Wiley, pp. 428-467.
Sze et al. (1985) Semiconductor Devices, Physics and Technology, 2nd ed., Wiley, New York, pp. 190-192.
Sze, S. (1988) "Ion Implantation," In; VLSI Technology, Mcgraw-Hill, 327-374, 566-611.
Sze, S. (1994) "Semiconductor Sensor Technologies," In; Semiconductor Sensors, John Wiley and Sons: New York pp. 17-95.
Takamoto et al. (Jan. 20, 1997) "Over 30% Efficient InGaP/GaAs Tandem Solar Cells," Appl. Phys. Lett. 70(3):381-383.
Talapin et al. (Oct. 7, 2005) "PbSe Nanocrystal Solids for n- and p-Channel Thin Film Field-Effect Transistors," Science 310:86-89.
Tan et al. (Apr. 12, 2004) "Performance Enhancement of InGaN Light Emitting Diodes by Laser-Lift-off and Transfer from Sapphire to Copper Substrate," Appl. Phys. Lett. 84(15):2757-2759.
Tanase et al. (2002) "Magnetic Trapping and Self-Assembly of Multicomponent Nanowires," J. Appl. Phys. 91:8549-8551.
Tang et al. (2005) "One-Dimensional Assemblies of Nanoparticles: Preparation, Properties, and Promise," Adv. Mater. 17:951-962.
Tao et al. (2003) "Langmuir-Blodgett Silver Nanowire Monolayers for Molecular Sensing Using Surface-Enhanced Raman Spectroscopy," Nano Lett. 3:1229-1233.
Tate et al. (2000) "Anodization and Microcontact Printing on Elotroless Silver: Solution-Based Fabrication Procudures for Low-Voltage Electronic Systems with Organic Acitve Components," Langmuir 16:6054-6060.
Teshima et al. (2001) "Room-Temperature Deposition of High-Purity Silicon Oxide Films by RF Plasma-Enhanced CVD," Surf. Coat. Technol. 146-147:451-456.
Theiss et al. (1998) "PolySilicon Thin Film Transistors Fabricated at 100° C on a Flexible Plastic Substrate," IEDM 98:257-260.
Toader et al. (2004) "Photonic Band Gap Architectures for Holographic Lithography," Phy. Rev. Lett. 043905/1-043905/4.
Toader et al. (2004) "Photonic Band Gaps Based on Tetragonal Lattices of Slanted Pores," Phys. Rev. Lett. 90:233901/1-233901/4.
Tong (1999) "Stresses in Bonded Wafers," In; Semiconductor Wafer Bonding: Science and Technology, John Wiley; New York, pp. 187-221.
Trau et al. (1997) "Microscopic Patterning of Orientated Mesoscopic Silica Through Guided Growth," Nature 390:674-676.
Trentler et al. (1995) "Solution-Liquid-Solid Growth of Crytalline III-V Semiconductors: An Analogy to Vapor-Liquid-Solid Growth," Science 270:1791-1794.
Tseng et al. (Web Release Dec. 19, 2003) "Monolithic Integration of Carbon Nanotube Devices with Silicon MOS Technology" Nano Lett. 4(1):123-127.
Ucjikoga, S. (2002) "Low-Temperature Polycrystalline Silicon Thin-Film Transistor Technologies ofr System-on-Glass Displays," MRS Bull. 27:881-886.
Urruchi et al. (2000) "Etching of DLC Films Using a Low Intensity Oxygen Plasma Jet," Diamond Relat. Mater. 9:685-688.
Vanfleteren. SWEET: Stretchable and Washable Electronics for Embedding Textiles. Available at ftp://ftp.cordis.europa.eu/pub/ist/docs/mnd/ws-sfit_en.pdf. Accessed Feb. 8, 2012.
Vanhollenbeke et al. (2000) "Compliant Substrate Technology: Integration of Mismatched Materials for Opto-Electronic Applications," Prog. Cryst. Growth Charact. Mater. 41(1-4):1-55.
Velev et al. (1997) "Porous silica via colloidal crystallization," Nature 389:447-448.
Vilan et al. (2000) "Molecular Control Over Au/GaAs Diodes," Nature 404:166-168.
Vlasov et al. (2001) "On-Chip Natural Assembly of Silicon Photonic Bandgap Crystals," Nature 414:289-293.
Voss, D. (2000) "Cheap and Cheerful Circuits," Nature 407:442-444.
Wagner et al. (Mar. 1, 1964) "Vapor-Liquid-Solid Mechanism of Single Crystal Growth," Appl. Phys. Lett. 4(5):89-90.

(56) References Cited

OTHER PUBLICATIONS

Wagner et al. (2003) "Silicon for Thin-Film Transistors," Thin Solid Films 430:15-19.
Wagner et al. (2005) "Electronic Skin: Architecture and Components," Physica E 25:326-334.
Wang et al. (2003) "A Solution-Phase, Precursor Route to Polycrystalline SnO2 Nanowores That Can Be Used for Gas Sensing under Ambient Conditions," J. Am. Chem. Soc. 125:16176-16177.
Wang et al. (2005) "Oxidation Resistant Germanium Nanowires: Bulk Synthesis, Long Chain Alkanethiol Functionalization, and Langmuir-Blodgett Assembly," J. Am. Chem. Soc. 127(33):11871-11875.
Wang et al. (2006) "Direct Synthesis and Characterization of CdS Nanobelts," Appl. Phys. Lett. 89:033102.
Weber et al. (Jan. 2004) "A Novel Low-Cost, High Efficiency Micromachined Silicon Solar Cell," IEEE Electron Device Lett. 25(1):37-39.
Wen et al. (Web Release Dec. 4, 2004) "Controlled Growth of Large-Area, Uniform, Vertically Aligned Arrays of α-Fe2O2 Nanobelts and Nanowires," J. Phys. Chem. B 109(1):215-220.
Whang et al. (2003) "Large-Scale Hierarchical Organization of Nanowire Arrays for Integrated Nanosystems," Nano Lett. 3(9):1255-1259.
Williams et al. (Web Release Jan. 23, 2006) "Comparison of the Growth and Properties of Ultranocrystalline Diamond and Nanocrystalline Diamond," Diamond Relat. Mater. 15:654-658.
Williams et al. (Oct. 2006) "Growth and Properties of Nanocrystalline Diamond Films," Phys. Stat. Sol. A 203(13):3375-3386.
Willner et al. (2002) "Functional Nanoparticle Architectures for Senoric, Optoelectronic, and Bioelectronic Applications," Pure Appl. Chem. 74(9):1773-1783.
Wind et al. (May 20, 2002) "Vertical Scaling of Carbon Nanotube-Field-Effect Transitors Using Top Gate Electrodes," Appl. Phys. Lett. 80(20):3871-3819.
Won et al. (2004) "Effect of Mechanical and Electrical Stresses on the Performance of an a-Si:H TFT on Plastic Substrate," J. Electrochem. Soc. 151:G167-G170.
Written Opinion, Corresponding to International Application No. PCT/US2005/019354, dated Apr. 18, 2007.
Written Opinion, Corresponding to International Application No. PCT/US2007/077759, Completed Mar. 13, 2008.
Wu et al. (2001) "Amorphous Silicon Crystallization and Polysilicon Thin Film Transistors on SiO2 Passivated Steel Foil Substrates," Apple. Surf. Sci 175-176:753-758.
Wu et al. (Web Release Mar. 13, 2001) "Direct Observation of Vapor-Liquid-Solid Nanowire Growth," J. Am. Chem. Soc. 123(13):3165-3166.
Wu et al. (2001) "Thermal Oxide of Polycrystalline Silicon on Steel Foil as a Thin-Film Transitor Gate Dielectric," Appl. Phys. Lett. 78:3729-2731.
Wu et al. (Web Release Jan. 19, 2002) "Block-by-Block Growth of Single-Crystalline Si/SiGe Superlattice Nanowires," Nano Lett. 2(2):83-86.
Wu et al. (Nov. 2002) "Complementary Metal-Oxide-Semiconductor Thin-Film Transistor Circuits from a High-Temperature Polycrystalline Silicon Process on Steel Foil Substrates," IEEE Trans. Electr. Dev. 49(11):1993-2000.
Wu et al. (2002) "Growth of Au-Catalyzed Ordered GaAs Nanowire Arrays by Molecular-Beam Epitaxy," Appl. Phys. Lett. 81:5177-5179.
Wu et al. (2002) "Inorganic Semiconductor Nanowires: Rational Growth, Assembly, and Novel Properties," Chem. Eur. J. 8(6):1261-1268.
Wu et al. (2003) "Growth, Branching, and Kinking of Molecular-Beam Epitaxial (110) GaAs Nanowires," Appl. Phys. Lett. 83:3368-3370.
Wu et al. (Jul. 1, 2004) "Single-Crystal Metallic Nanowires and Metal/Semiconductor Nanowire Heterostructures," Nature 430:61-65.
Xia et al. (Jul. 19, 1996) "Complex Optical Surfaces Formed by Replica Molding Against Elastomeric Masters," Science 273:347-349.
Xia et al. (1996) "Shadowed Sputtering of Gold on V-Shaped Microtrenches Etched in Silicon and Applications in Microfabrication," Adv. Mater. 8(9):765-768.
Xia (1998) "Soft Lithography" Angew. Chem. Int. Ed. 37:551-575.
Xia et al. (1998) "Soft Lithography," Annu. Rev. Mater. Sci. 28:153-184.
Xia et al. (1999) "Unconventional Methods for Fabricating and Patterning Nanostructures," Chem. Rev. 99:1823-1848.
Xia et al. (2003) "One-Dimensional Nanostructures: Synthesis, Characterization and Applications," Adv. Mater. 15:353-389.
Xiang et al. (Mar. 25, 2006) "Ge/Si Nanowire Heterostructures as High-Performance Field-Effect Transistors," Nature 441:489-493.
Xie et al. (May 2003) "Polymer-Controlled Growth of Sb2Se3 Nanoribbons Via a Hydrothermal Process," J. Cryst. Growth 252(4):570-574.
Xin et al. (Jun. 2005) "Evaluation of Polydimethylsiloxane Scaffolds with Physiologically-Relevant Elastic Moduli: Interplay of Substrate Mechanics and Surface Chemistry Effects on Vascular Smooth Muscle Cell Response," Biomaterials 26(16):3123-3129.
Yang et al. (1997) "Mesoporous Silica with Micrometer-Scale Desgns," Adv. Mater. 9:811-814.
Yang et al. (2000) "Stability of Low-Temperature Amorphous Silicon Thin Film Transistors Formed on Glass and Transparent Plastic Substrates," J. Vac. Sci. Technol. B 18:683-689.
Yang et al. (2002) "Creating Periodic Three-Dimensional Structures by Multibeam Interface of Visible Laser," Chem. Mater. 14:2831-2833.
Yang, P. (2005) "The Chemistry and Physics of Semiconductor Nanowires," MRS Bull. 30:85-91.
Yang et al. (Dec. 2007) "FRID Tag and RF Structures on a Paper Substrate Using Inkjet-Printing Technology," IEEE Trans. Microw. Theory Tech. 55(12):2894-2901.
Yao et al. (Mar. 2000) "High-Field Effect Electrical Transport in Single-Walled Carbon Nanotubes," Phys. Rev. Lett. 84(13):2941-2944.
Yeh et al. (1994) "Fluidic Self-Assembly for the Integration of GaAs Light-Emitting Diodes on Si Substrates," IEEE Photon. Technol. Lett. 6:706-708.
Yin et al. (2000) "A Soft Lithography Approach to the Fabrication of Nanostructures of Single Crystalline Silicon with Well-Defined Dimensions and Shapes," Adv. Mater. 12:1426-1430.
Yin et al. (2005) "Colloidal Nanocrystal Synthesis and the Organic-Inorganic Interface," Nature 437:664-670.
Yoon et al. (2005) "Low-Voltage Organic Field-Effect Transistors and Inverters Enabled by Ultrathin Cross-Linked Polymers as Gate Dielectrics," J. Am. Chem. Soc. 127:10388-10395.
Yu et al. (2000) "Silicon Nanowires: preparation, Device Fabrication, and Transport Properties," J. Phys. Chem. B 104(50):11864-11870.
Yu et al. (2003) "Solution-Liquid-Solid Growth of Soluble GaAs Nanowires," Adv. Mater. 15:416-419.
Yu et al. (2003) "Two- Versus Three-Dimensional Quantum Confinement in Indium Phosphide Wires and Dots," Nat. Mater. 2:517-520.
Yuan et al. (2006) "High-Speed Strained-Single-Crystal-Silicon Thin-Film Transistors on Flexible Polymers," J. Appl. Phys. 100:013708.
Yurelki et al. (Jul. 24, 2004) "Small-Angle Neutron Scattering from Surfactant-Assisted Aqueous Dispersions of Carbon Nanotubes," J. Am. Chem. Soc. 126(32):9902-9903.
Zakhidov et al. (1998) "Carbon Structure with Three-Dimensional Periodicity at Optical Wavelengths," Science 282:897-901.
Zaumseil et al. (2003) "Nanoscale Organic Transistors that use Source/Drain Electrodes Supported by High Resolution Rubber Stamps," Appl. Phys. Lett. 82(5):793-795.
Zaumseil et al. (2003) "Three-Dimensional and Multilayer Nanostructures Formed by Nanotransfer Printing," Nano Lett. 3(9):1223-1227.
Zhang et al. (Apr. 2003) "Oxide-Assisted Growth of Semiconducting Nanowires," Adv. Mater. 15(7-8):635-640.

(56) References Cited

OTHER PUBLICATIONS

Zhang et al. (Apr. 5, 2004) "Structure and Photoiluminescence of ZnSe Nanoribbons Grown by Metal Organic Chemical Vapor Deposition," Appl. Phys. Lett. 84(14):2641-2643.

Zhang et al. (2005) "Low-Temperature Growth and Photoluminescence Property of ZnS Nanoribbons," J. Phys. Chem. B 109(39):18352-18355.

Zhang et al. (Feb. 9, 2006) "Electronic Transport in Nanometre-Scale Silicon-on-insulator Membranes," Nature 439:703-706.

Zhang et al. (Jun. 6, 2006) "Anomalous Coiling of SiGe/Si and SiGe/Si/Cr Helical Nanobelts," Nano Lett. 6(7):1311-1317.

Zhao et al. (Mar. 2007) "Improved Field Emission Properties from Metal-Coated Diamond Films," Diamond Relat Mater. 16(3):650-653.

Zheng et al. (Aug. 31, 2004) "Sequential Shape-and-Solder-Directed Self Assembly of Functional Microsystems," Proc. Natl. Acad. Sci. USA 101(35):12814-12817.

Zheng et al. (2004) "Shape-and Solder-Directed Self-Assembly to Package Semiconductor Device Segments," Appl. Phys. Lett. 85:3635-3637.

Zhou et al. (2002) "An Efficient Two-Photon-Generated Photoacid Applied to Positive-Tone 3D Microfabrication," Science 296:1106-1109.

Zhou et al. (2004) "p-Channel, n-Channel Thin Film Transistors and p-n Diodes Based on Single Wall Carbon Nanotube Networks," Nano Lett. 4:2031-2035.

Zhou et al. (2005) "Band Structure, Phonon Scattering, and the Performance Limit of Single-Walled Carbon Nanotube Transistors," Phys. Rev. Lett. 95:146805.

Zhou et al. (2005) "Mechanism for Stamp Collapse in Soft Lithography," Appl. Phys. Lett. 87:251925.

Zhu et al. (2005) "Spin on Dopants for High-Performance Single-Crystal Silicon Transistors on Flexible Plastic Substrates," Appl. Phys. Lett. 86:133507.

\* cited by examiner

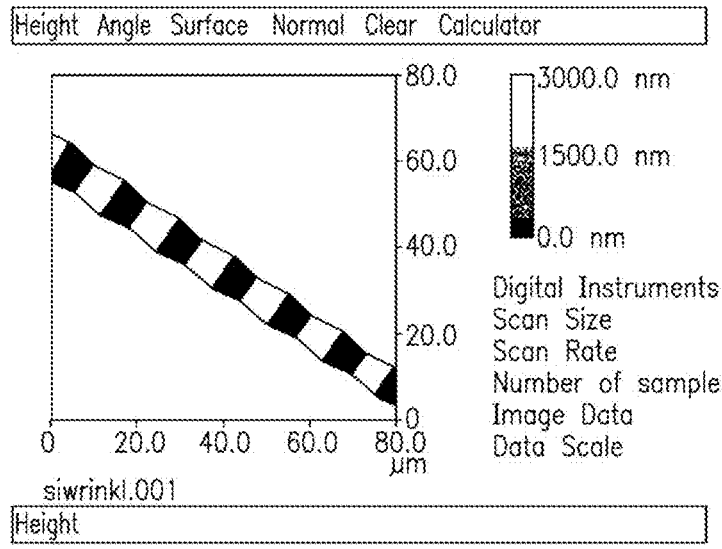
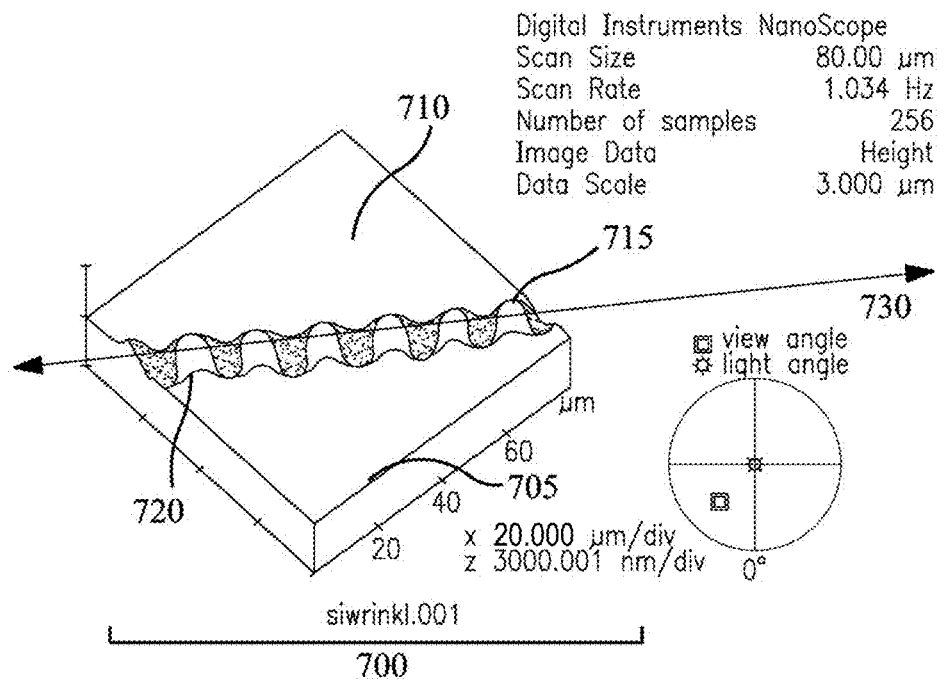
Fig. 1

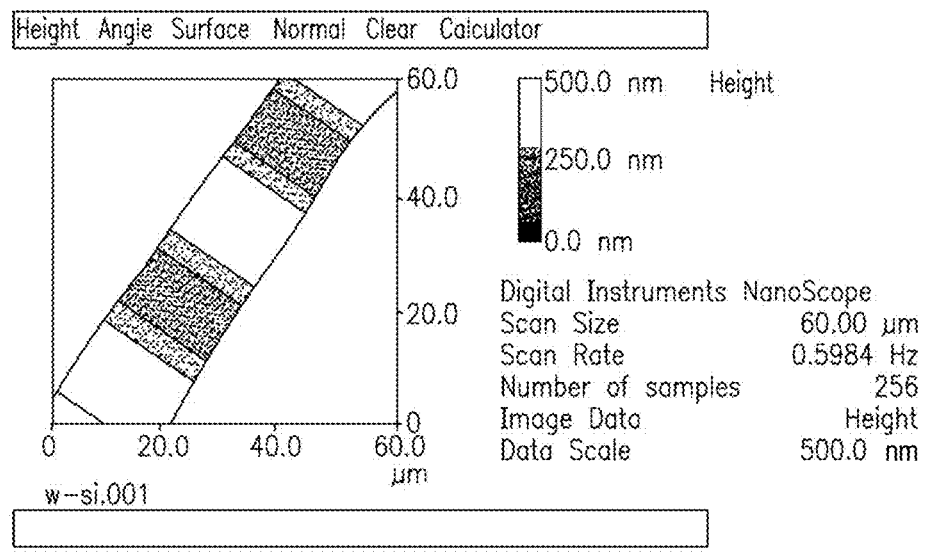
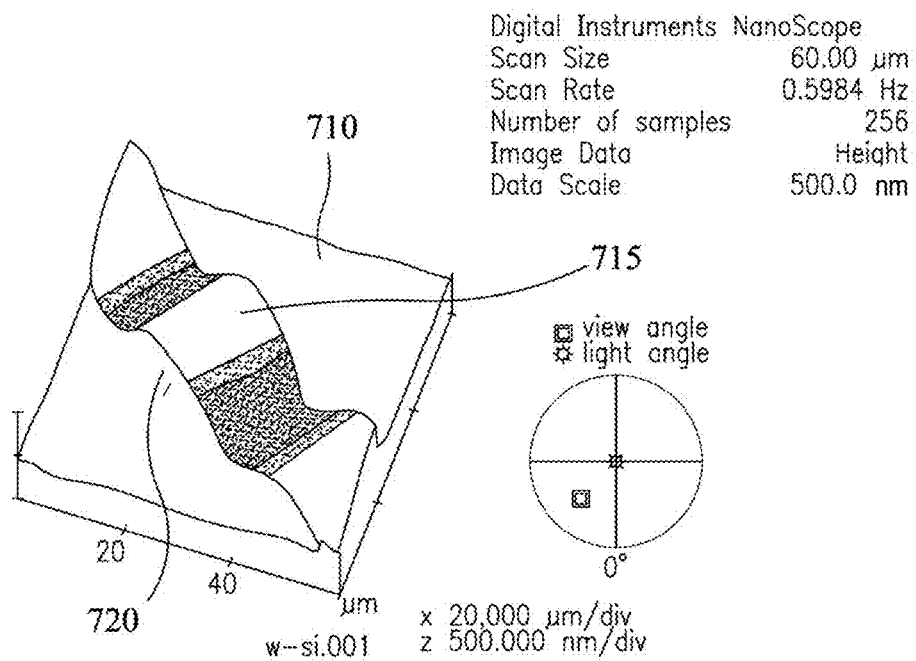
Fig. 2

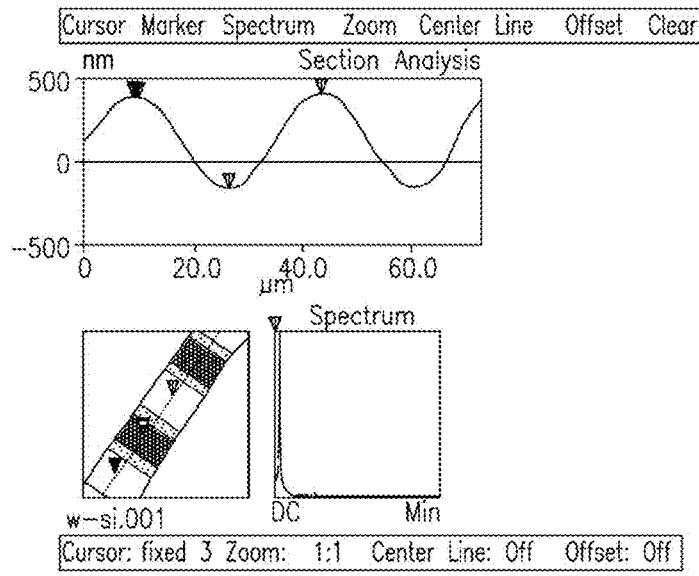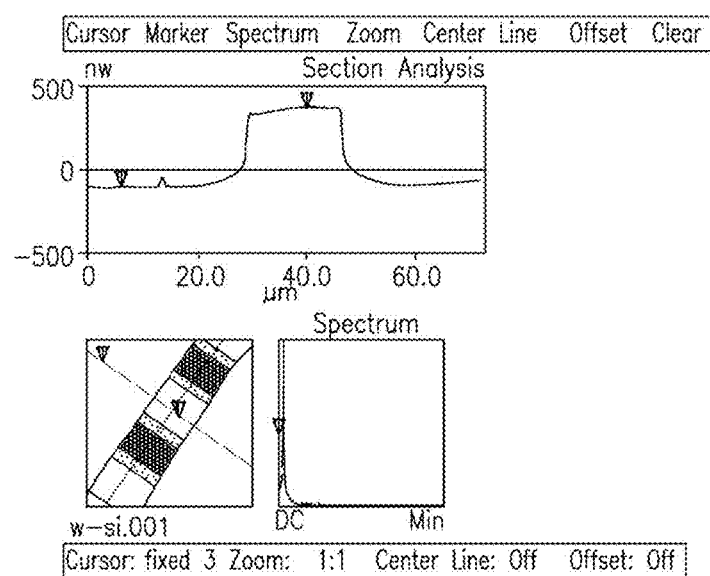
Fig. 2 (Cont'd)

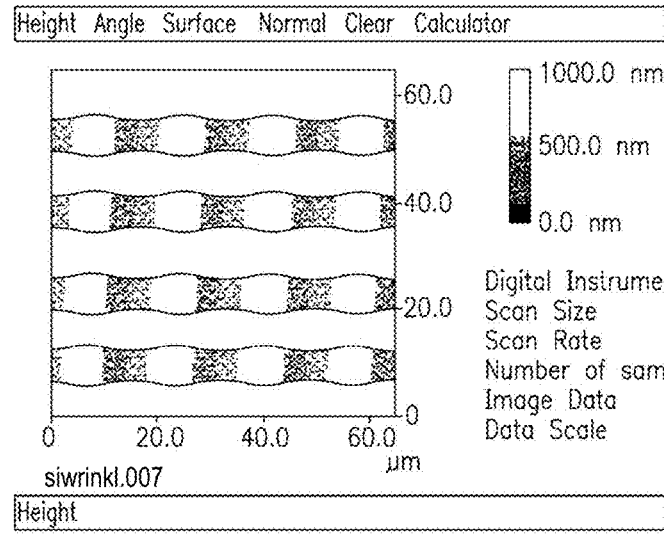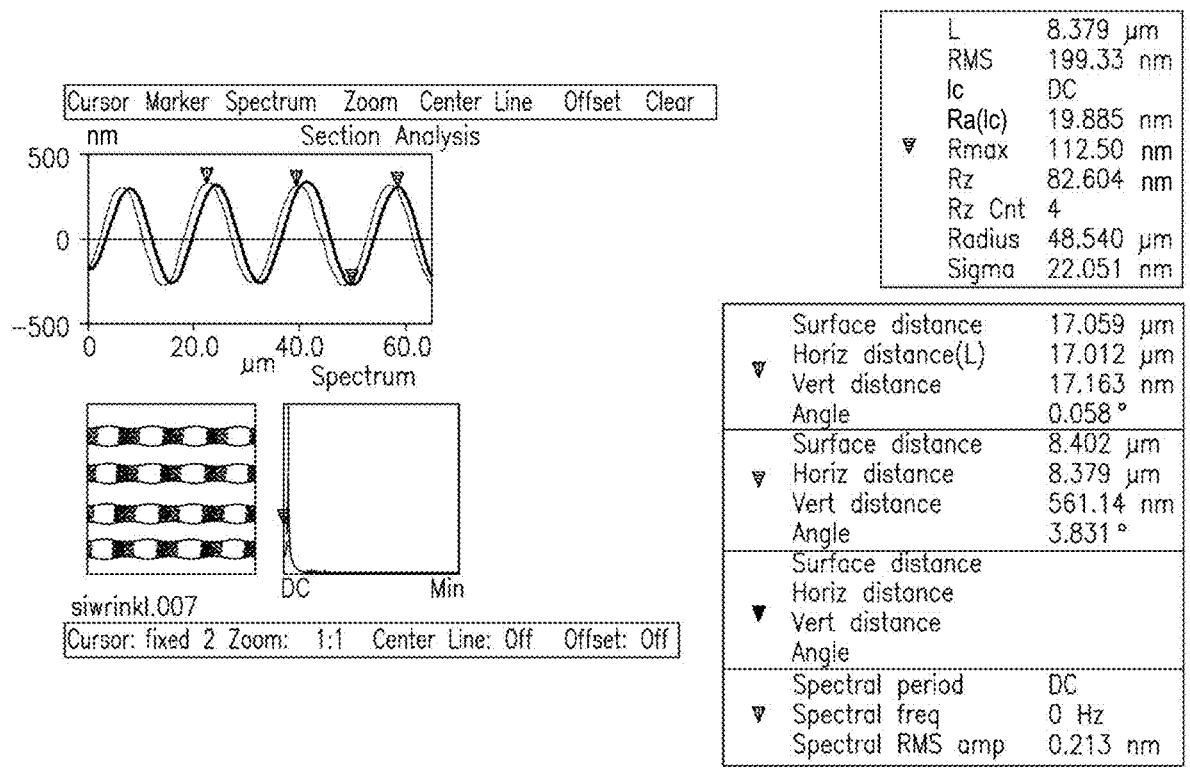
Fig. 3

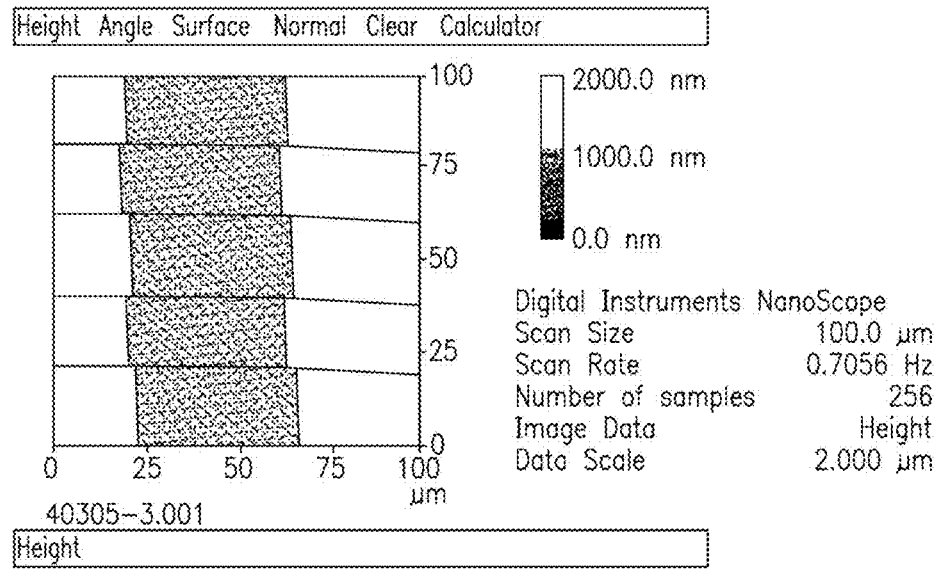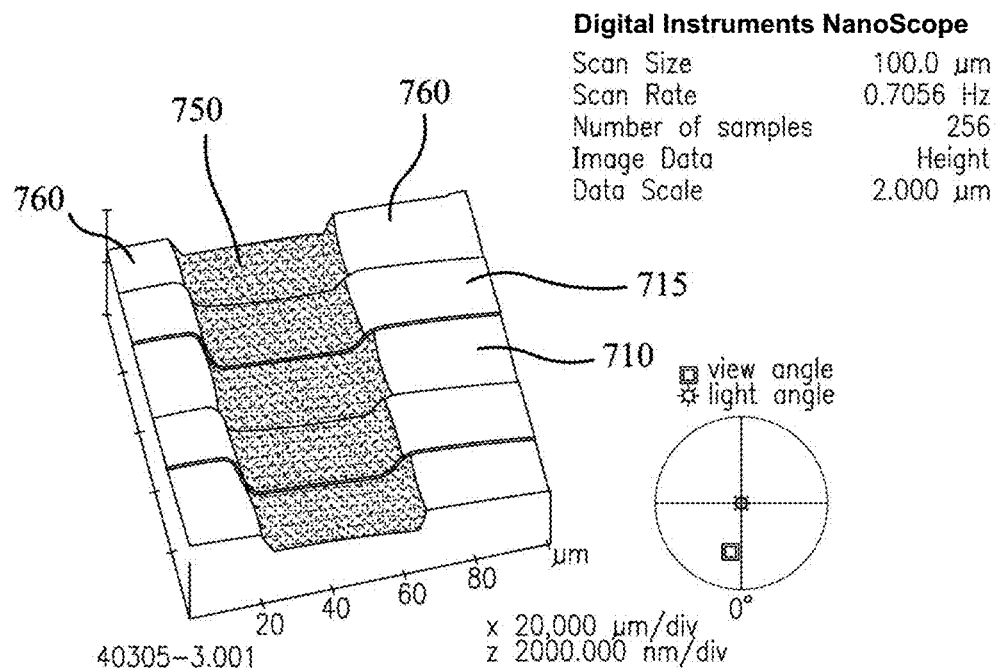
Fig. 5

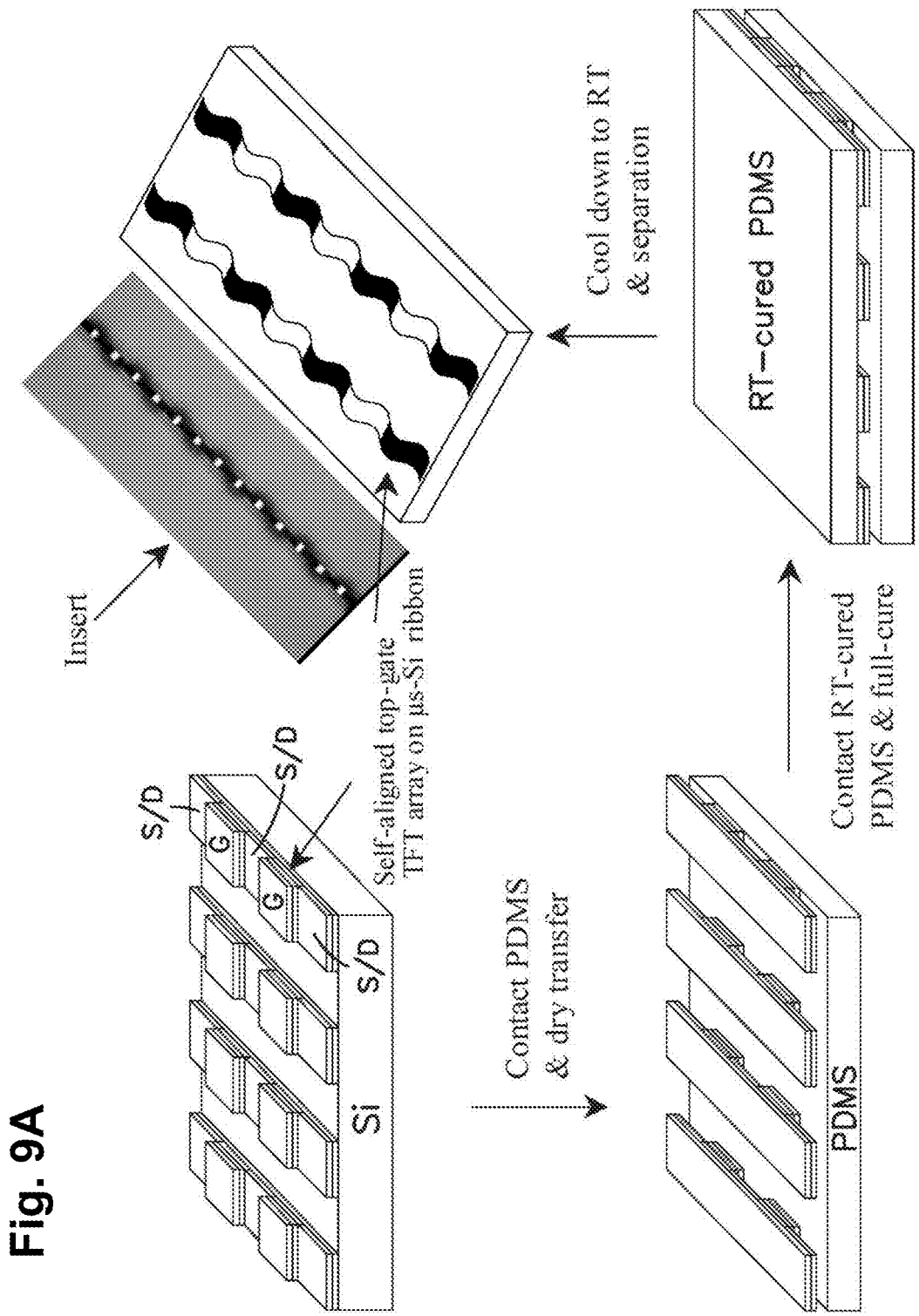

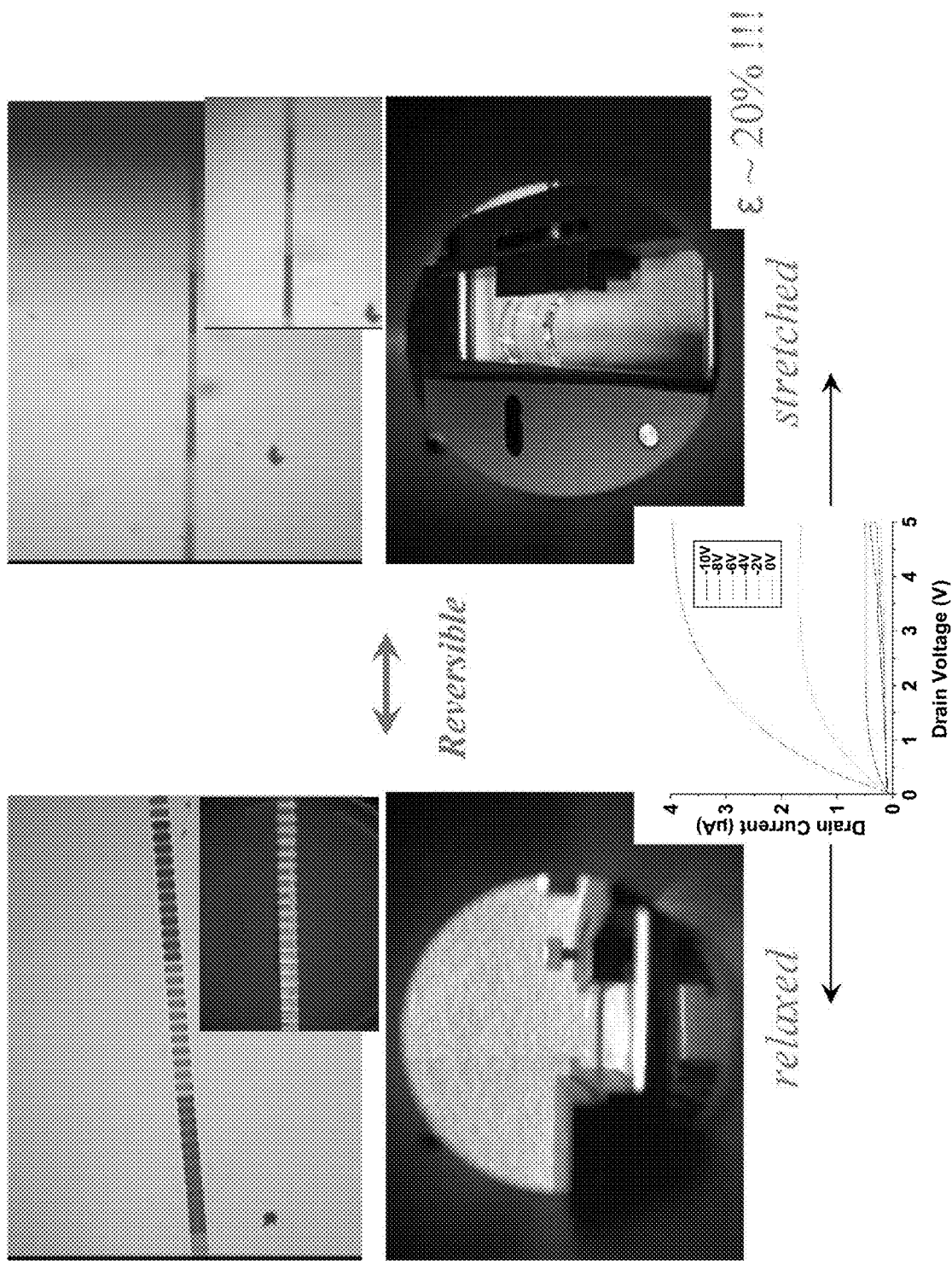

Si: 2.5 μm thick
Ribbon width: 50 μm, gate length: 500 μm
Gox: thermal oxide 40nm
Gate metal: Cr(2nm)/Au(25nm)
S/D metal: Cr(25nm)
Self-aligned, Schottky S/D MOSFET

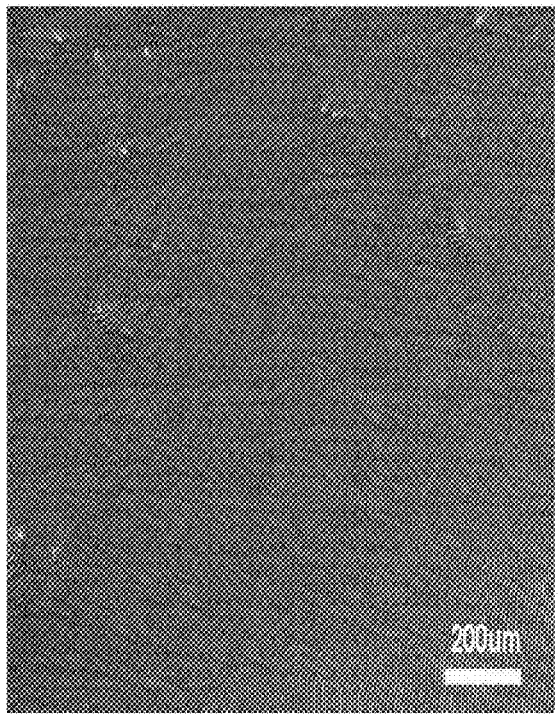
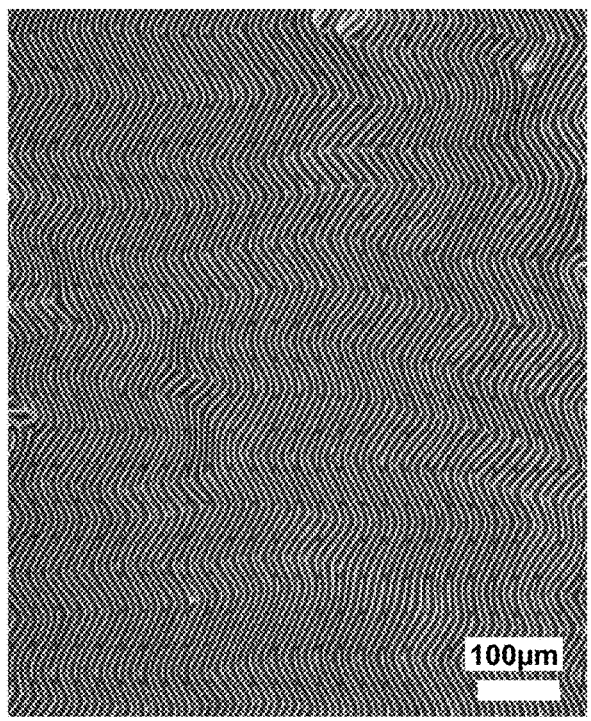
Fig. 27A
Fig. 27B
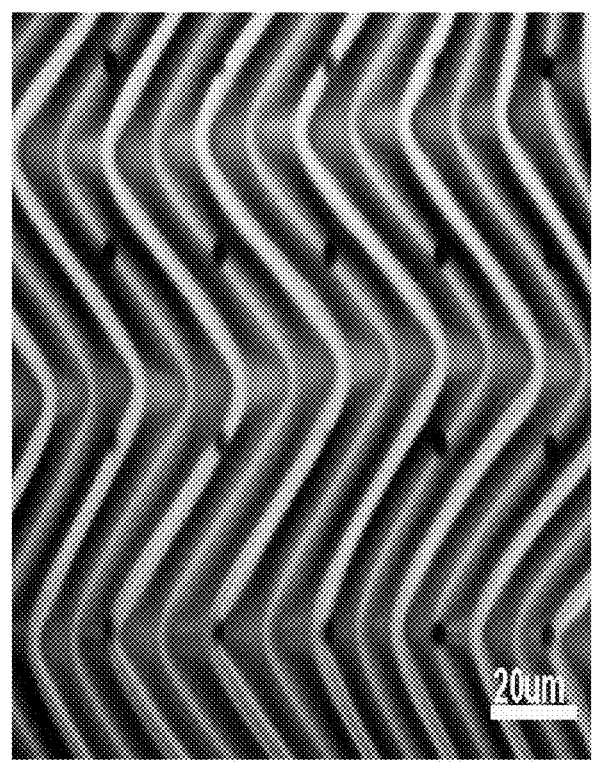
Fig. 27C

- Herringbone wavy

- Edge; line wavy

STRETCHABLE FORM OF SINGLE CRYSTAL SILICON FOR HIGH PERFORMANCE ELECTRONICS ON RUBBER SUBSTRATES

CROSS REFERENCE TO RELATED APPLICATIONS

This application is a continuation of U.S. patent application Ser. No. 15/339,338, filed Oct. 31, 2016 (now U.S. Pat. No. 10,204,864 issued Feb. 12, 2019 ), which is a continuation of U.S. patent application Ser. No. 14/789,645 filed Jul. 1, 2015 (now U.S. Pat. No. 9,515,025 issued Dec. 6, 2016 ), which is a continuation of U.S. patent application Ser. No. 14/220,923 filed Mar. 20, 2014 (now U.S. Pat. No. 9,105,555 issued Aug. 11, 2015), which is a continuation of U.S. patent application Ser. No. 13/441,618 filed Apr. 6, 2012 (now U.S. Pat. No. 8,754,396 issued Jun. 17, 2014 ), which is a continuation of U.S. patent application Ser. No. 12/405,475 filed Mar. 17, 2009 (now U.S. Pat. No. 8,198,621 issued Jun. 12, 2012), which is a divisional of U.S. patent application Ser. No. 11/423,287 filed on Jun. 9, 2006 (now U.S. Pat. No. 7,521,292 issued Apr. 21, 2009 ), which is a continuation-in-part of U.S. patent application Ser. No. 11/145,542 filed Jun. 2, 2005 (now U.S. Pat. No. 7,557,367 issued Jul. 7, 2009 ) and U.S. patent application Ser. No. 11/145,574 filed Jun. 2, 2005 (now U.S. Pat. No. 7,622,367 issued Nov. 24, 2009), both of which claim the benefit under 35 U.S.C. 119(e) of U.S. Provisional Patent Application Nos. 60/577,077, 60/601,061, 60/650,305, 60/663,391 and 60/677,617 filed on Jun. 4, 2004, Aug. 11, 2004, Feb. 4, 2005, Mar. 18, 2005, and May 4, 2005, respectively, and application Ser. No. 11/423,287 (now U.S. Pat. No. 7,521,292 issued Apr. 21, 2009) also claims the benefit under 35 U.S.C. 119(e) of U.S. Provisional Patent Application No. 60/790,104 filed on Apr. 7, 2006, all of which are hereby incorporated by reference in their entireties to the extent not inconsistent with the disclosure herein.

STATEMENT REGARDING FEDERALLY SPONSORED RESEARCH OR DEVELOPMENT

This invention was made, at least in part, with United States governmental support awarded by DARPA-funded AFRL-managed Macroelectronics Program Contract FA8650-04-C-7101, and the U. S. Department of Energy under grant DEFG02-91-ER45439. The United States Government has certain rights in this invention

BACKGROUND OF INVENTION

Since the first demonstration of a printed, all polymer transistor in 1994, a great deal of interest has been directed at a potential new class of electronic systems comprising flexible integrated electronic devices on plastic substrates. [Garnier, F., Hajlaoui, R., Yassar, A. and Srivastava, P., Science, Vol. 265, pgs 1684-1686] Recently, substantial research has been directed toward developing new solution processable materials for conductors, dielectrics and semi-conductors elements for flexible plastic electronic devices. Progress in the field of flexible electronics, however, is not only driven by the development of new solution processable materials but also by new device component geometries, efficient device and device component processing methods and high resolution patterning techniques applicable to plastic substrates. It is expected that such materials, device configurations and fabrication methods will play an essential role in the rapidly emerging new class of flexible integrated electronic devices, systems and circuits.

Interest in the field of flexible electronics arises out of several important advantages provided by this technology. First, the mechanical ruggedness of plastic substrate materials provides electronic devices less susceptible to damage and/or electronic performance degradation caused by mechanical stress. Second, the inherent flexibility of these substrate materials allows them to be integrated into many shapes providing for a large number of useful device configurations not possible with brittle conventional silicon based electronic devices. Finally, the combination of solution processable component materials and plastic substrates enables fabrication by continuous, high speed, printing techniques capable of generating electronic devices over large substrate areas at low cost.

The design and fabrication of flexible electronic devices exhibiting good electronic performance, however, present a number of significant challenges. First, the well developed methods of making conventional silicon based electronic devices are incompatible with most plastic materials. For example, traditional high quality inorganic semiconductor components, such as single crystalline silicon or germanium semiconductors, are typically processed by growing thin films at temperatures (>1000 degrees Celsius) that significantly exceed the melting or decomposition temperatures of most plastic substrates. In addition, most inorganic semiconductors are not intrinsically soluble in convenient solvents that would allow for solution based processing and delivery. Second, although many amorphous silicon, organic or hybrid organic-inorganic semiconductors are compatible with incorporation into plastic substrates and can be processed at relatively low temperatures, these materials do not have electronic properties capable of providing integrated electronic devices capable of good electronic performance. For example, thin film transistors having semiconductor elements made of these materials exhibit field effect mobilities approximately three orders of magnitude less than complementary single crystalline silicon based devices. As a result of these limitations, flexible electronic devices are presently limited to specific applications not requiring high performance, such as use in switching elements for active matrix flat panel displays with non-emissive pixels and in light emitting diodes.

Progress has recently been made in extending the electronic performance capabilities of integrated electronic devices on plastic substrates to expand their applicability to a wider range of electronics applications. For example, several new thin film transistor (TFT) designs have emerged that are compatible with processing on plastic substrate materials and exhibit significantly higher device performance characteristics than thin film transistors having amorphous silicon, organic or hybrid organic-inorganic semiconductor elements. One class of higher performing flexible electronic devices is based on polycrystalline silicon thin film semiconductor elements fabricated by pulse laser annealing of amorphous silicon thin films. While this class of flexible electronic devices provides enhanced device electronic performance characteristics, use of pulsed laser annealing limits the ease and flexibility of fabrication of such devices, thereby significantly increasing costs. Another promising new class of higher performing flexible electronic devices is devices that employ solution processable nanoscale materials, such as nanowires, nanoribbons, nanoparticles and carbon nanotubes, as active functional components in a number of macroelectronic and microelectronic devices.

Use of discrete single crystalline nanowires or nanoribbons has been evaluated as a possible means of providing printable electronic devices on plastic substrates that exhibit enhanced device performance characteristics. Duan et al. describe thin film transistor designs having a plurality of selectively oriented single crystalline silicon nanowires or CdS nanoribbons as semiconducting channels [Duan, X., Niu, C., Sahl, V., Chen, J., Parce, J., Empedocles, S. and Goldman, J., Nature, Vol. 425, pgs, 274-278]. The authors report a fabrication process allegedly compatible with solution processing on plastic substrates in which single crystalline silicon nanowires or CdS nanoribbons having thicknesses less than or equal to 150 nanometers are dispersed into solution and assembled onto the surface of a substrate using flow-directed alignment methods to produce the semiconducting element of at thin film transistor. An optical micrograph provided by the authors suggests that the disclosed fabrication process prepares a monolayer of nanowires or nanoribbons in a substantially parallel orientation and spaced apart by about 500 nanometers to about 1,000 nanometers. Although the authors report relatively high intrinsic field affect mobilities for individual nanowires or nanoribbons ($\approx$119 $cm^2$ $V^{-1}$ $s^{-1}$), the overall device field effect mobility has recently been determined to be "approximately two orders of magnitude smaller" than the intrinsic field affect mobility value reported by Duan et al. [Mitzi, D. B, Kosbar, L. L., Murray, C. E., Copel, M. Afzali, A., Nature, Vol. 428, pgs. 299-303]. This device field effect mobility is several orders of magnitude lower than the device field effect mobilities of conventional single crystalline inorganic thin film transistors, and is likely due to practical challenges in aligning, densely packing and electrically contacting discrete nanowires or nanoribbons using the methods and device configurations disclosed in Duan et al.

Use of nanocrystal solutions as precursors to polycrystalline inorganic semiconductor thin films has also been explored as a possible means of providing printable electronic devices on plastic substrates that exhibit higher device performance characteristics. Ridley et al. disclose a solution processing fabrication method wherein a solution cadmium selenide nanocrystals having dimensions of about 2 nanometers is processed at plastic compatible temperatures to provide a semiconductor element for a field effect transistor. [Ridley, B. A., Nivi, B. and Jacobson, J. M., Science, Vo. 286, 746-749 (1999)] The authors report a method wherein low temperature grain growth in a nanocrystal solution of cadmium selenide provides single crystal areas encompassing hundreds of nanocrystals. Although Ridley et al. report improved electronic properties relative to comparable devices having organic semiconductor elements, the device mobilities achieved by these techniques ($\approx$1 $cm^2$ $V^{-1}$ $s^{-1}$) are several orders of magnitude lower than the device field effect mobilities of conventional single crystalline inorganic thin film transistors. Limits on the field effect mobilities achieved by the device configurations and fabrication methods of Ridley et al. are likely to arise from the electrical contact established between individual nanoparticles. Particularly, the use of organic end groups to stabilize nanocrystal solutions and prevent agglomeration may impede establishing good electrical contact between adjacent nanoparticles that is necessary for providing high device field effect mobilities.

Although Duan et al. and Ridley et al. provide methods for fabricating thin film transistors on plastic substrates, the device configurations described are transistors comprising mechanically rigid device components, such as electrodes, semiconductors and/or dielectrics. Selection of a plastic substrate with good mechanical properties may provide electronic devices capable of performing in flexed or distorted orientations, however, such deformation is expected to generate mechanical strain on the individual rigid transistor device components. This mechanical strain may induce damage to individual components, for example by cracking, and also may degrade or disrupt electrical contact between device components.

Moreover, it is unclear if the plastic substrate-based electronic systems developed by Duan et al., Ridley et al. and others provide mechanical extensibility necessary for many important device applications, including flexible sensor arrays, electronic paper, and wearable electronic devices. While these groups demonstrate electronic devices having the ability to undergo deformation caused by flexing, it is unlikely that these plastic substrate-based systems are capable of stretching appreciably without damage, mechanical failure or significant degradation in device performance. Therefore, it is unlikely that these systems are capable of deformation caused by expansion or compression, or capable of deformation required to conformally cover highly contoured surfaces, such as curved surfaces having a large radius of curvature.

As discussed above, progress in the field of flexible electronics is expected to play a critical role in a number of important emerging and established technologies. The success of these applications of flexible electronics technology depends strongly, however, on the continued development of new materials, device configurations and commercially feasible fabrication pathways for making integrated electronic circuits and devices exhibiting good electronic, mechanical and optical properties in flexed, deformed and bent conformations. Particularly, high performance, mechanically extensible materials and device configurations are needed exhibiting useful electronic and mechanical properties in stretched or contracted conformations.

SUMMARY OF THE INVENTION

The present invention provides stretchable semiconductors and stretchable electronic devices, device components and circuits. As used herein, the term "stretchable" refers to materials, structures, devices and device components capable of withstanding strain without fracturing or mechanical failure. Stretchable semiconductors and electronic devices of the present invention are extensible and, thus, are capable of stretching and/or compression, at least to some degree, without damage, mechanical failure or significant degradation in device performance. Stretchable semiconductors and electronic circuits of the present invention preferred for some applications are flexible, in addition to being stretchable, and thus are capable of significant elongation, flexing, bending or other deformation along one or more axes.

Useful stretchable semiconductors and electronic devices of the present invention are capable of elongation, compression, distortion and/or expansion without mechanical failure. In addition, stretchable semiconductor conductors and electronic circuits of the present invention exhibit good electronic performance even when undergoing significant strain, such as strain greater or equal about 0.5%, preferably 1% and more preferably 2%. Stretchable semiconductors and electronic devices, device components and circuits that are flexible also exhibit good electronic performance when in flexed, bent and/or deformed states. Stretchable semiconductor elements and stretchable electronic devices, device components and circuits of the present invention are suitable for a wide range of device applications and device configurations as they provide useful electronic properties and mechanical ruggedness in flexed, stretched, compressed or deformed device orientations.

Stretchable and/or flexible semiconductors of the present invention may also, optionally, be printable, and may, optionally, comprise composite semiconductor elements having a semiconductor structure operationally connected to other structures, materials and/or device components, such as dielectric materials and layers, electrodes and other semiconductor materials and layers. The present invention includes a wide range of stretchable and/or flexible electronic and/or optoelectronic devices having stretchable and/or flexible semiconductors, including but not limited to, transistors, diodes, light emitting diodes (LEDs), organic light emitting diodes (OLEDS), lasers, micro- and nano-electromechanical devices, micro- and nano-fluidic devices, memory devices, and systems level integrated electronic circuits, such as complementary logic circuits.

In one aspect, the present invention provides stretchable semiconductor elements providing useful functional properties when in flexed, expanded, compressed, bent and/or deformed states. As used herein the expression "semiconductor element" and "semiconductor structure" are used synonymously in the present description and broadly refer to any semiconductor material, composition or structure, and expressly includes high quality single crystalline and polycrystalline semiconductors, semiconductor materials fabricated via high temperature processing, doped semiconductor materials, organic and inorganic semiconductors and composite semiconductor materials and structures having one or more additional semiconductor components and/or non-semiconductor components, such as dielectric layers or materials and/or conducting layers or materials.

A stretchable semiconductor element of the present invention comprises a flexible substrate having a supporting surface and a semiconductor structure having a curved internal surface, for example a curved internal surface provided by a bent conformation of the semiconductor structure. In this embodiment, at least a portion of the curved internal surface of the semiconductor structure is bonded to the supporting surface of the flexible substrate. Exemplary semiconductor structures having curved internal surfaces useful in present invention comprise bent structures. In the context of this description, a "bent structure" refers to a structure having a curved conformation resulting from the application of a force. Bent structures in the present invention may have one or more folded regions, convex regions and/or concave regions. Bent structures useful in the present invention, for example, may be provided in a coiled conformation, a wrinkled conformation, a buckled conformation and/or a wavy (ie., wave-shaped) configuration.

Bent structures, such as stretchable bent semiconductor structures and electronic circuits having curved internal surfaces, may be bonded to a flexible substrate, such as a polymer and/or elastic substrate, in a conformation wherein the bent structure is under strain. In some embodiments, the bent structure, such as a bent ribbon structure, is under a strain equal to or less than about 30%, a strain equal to or less than about 10% in embodiments preferred for some applications, a strain equal to or less than about 5% in embodiments preferred for some applications and a strain equal to or less than about 1% in embodiments preferred for some applications. In some embodiments, the bent structure, such as a bent ribbon structure, is under a strain selected from the range of about 0.5% to about 30%, preferably for some applications a strain selected from the range of about 0.5% to about 10%, preferably for some applications a strain selected from the range of about 0.5% to about 5%.

In a useful embodiment, the semiconductor structure having a curved internal surface comprises a transferable semiconductor element bonded, at least partially, to the supporting flexible substrate. In the context of this description, a "transferable semiconductor element" is a semiconductor structure that is capable of being transferred from a donor surface to a receiving surface, for example via deposition techniques, printing techniques, patterning techniques and/or other material transfer methods. Transferable semiconductor elements useful in the present methods, compositions and devices include, but are not limited to, printable semiconductor elements.

Useful flexible substrates include, but are not limited to, polymer substrates, plastic substrates and/or elastic substrates. In one embodiment, for example, the present invention comprises a transferable, and optionally printable, semiconductor element that is transferred and bonded to a prestrained elastic substrate. Useful transfer methods in this aspect of the invention include printing techniques, such as contact printing or solution printing. Subsequent relaxation of the elastic substrate generates a strain on the transferable, and optionally printable, semiconductor element resulting in formation of the curved internal surface, for example via bending and/or buckling of the semiconductor element.

In some embodiments, the semiconductor element having a curved internal surface is fabricated (as described above for example) and subsequently transferred from the elastic substrate used to generate its curved surface to a different flexible substrate, and is bonded to the different flexible substrate. Useful embodiments of this aspect of the present invention include a transferable, and optionally printable, semiconductor structure comprising a bent semiconductor ribbon, wire, strip, discs, platelet, block, post, or cylinder with a curved internal surface having a wrinkled, buckled and/or wave-shaped configuration. The present invention includes, however, stretchable semiconductors wherein the semiconductor element is not provided to the flexible substrate via printing means and/or wherein the semiconductor element is not printable.

The present invention includes stretchable semiconductors comprising a single semiconductor element having a curved internal surface supported by a single flexible substrate. Alternatively, the present invention stretchable semiconductors comprising a plurality of stretchable semiconductor elements having curved internal surfaces supported by a single flexible substrate. Embodiments of the present invention include an array or pattern of stretchable semiconductor elements having curved internal surfaces supported by a single flexible substrate. Optionally, stretchable semiconductor elements in the array or pattern have well defined, preselected physical dimensions, positions and relative spatial orientations.

The present invention also includes stretchable electronic devices, device components and/or circuits comprising one or more stretchable semiconductor structures, and additional integrated device components, such as electrical contacts, electrodes, conducting layers, dielectric layers, and/or additional semiconductor layers (e.g. doped layers, P-N junctions etc.). In this embodiment, stretchable semiconductor structures and additional integrated device components are operationally coupled so as to provide a selected device functionality, and may be in electrical contact or insulated with respect to each other. In some useful embodiments, at least a portion of, or all of, the additional integrated device components (and the stretchable semiconductor(s)) have curved internal surfaces that are, optionally supported by supporting surfaces of a flexible substrate and, are provided in a bent structure, for example a bent structure having a coiled, wave-shaped, buckled and/or wrinkled conformation. Curved internal surfaces of additional integrated device components and stretchable semiconductors may have substantially the same or different contour profiles. The present invention includes embodiments wherein stretchable device components are interconnected via metal interconnects that exhibit intrinsic stretchablility or metal interconnects that also have a wave-shaped, wrinkled, bent and/or buckled conformation.

The curved internal surface configurations of additional integrated device components are provided in some embodiments by an overall bent structure of the electronic device, such as a coiled, wave-shaped, buckled and/or wrinkled configuration. In these embodiments, the bent structure enables these devices to exhibit good electronic performance even when undergoing significant strain, such as maintaining electrical conductivity or insulation with a semiconductor element while in a stretched, compressed and/or bent configuration. Stretchable electronic circuits may be fabricated using techniques similar to those used to fabricate stretchable semiconductor elements, as described herein. In one embodiment, for example, stretchable device components, including a stretchable semiconductor element, are fabricated independently and then interconnected. Alternatively, a semiconductor containing device may be fabricated in a planar configuration, and the resulting planar device is subsequently processed to provide an overall bent device structure having curved internal surfaces of some or all of the device components.

The present invention includes stretchable electronic devices comprising a single electronic device having a curved internal surface supported by a single flexible substrate. Alternatively, the present invention includes stretchable electronic device arrays comprising a plurality of stretchable electronic devices or device components, each having curved internal surfaces supported by a single flexible substrate. Optionally, stretchable electronic devices in devices arrays of the present invention have well defined, preselected physical dimensions, positions and relative spatial orientations.

In some embodiments of the present invention the curved internal surface of the semiconductor structure or electronic device is provided by a bent structure. Bent structures and curved internal surfaces of semiconductors and/or electronic devices of the present invention may have any contour profile providing stretchability and/or flexibility including, but not limited to, contour profiles characterized by at least one convex region, at least one concave region or a combination of at least one convex region and at least one concave region. Contour profiles useful in the present invention include contour profiles varying in one or two spatial dimensions. Use of a bent structure having an internal surface with a contour profile exhibiting periodic or aperiodic variations in more than one spatial dimension are useful for providing stretchable semiconductors and/or electronic devices capable of stretching, compression, flexing or otherwise deformation in more than one direction, including orthogonal directions.

Useful embodiments include curved internal surfaces provided by bent semiconductor structures and/or electronic devices having conformations comprising a plurality of convex and concave regions, for example an alternating pattern of convex and concave regions provided in a wave-shaped configuration. In an embodiment, the curved internal surface, or optionally the entire cross sectional component, of a stretchable and/or flexible semiconductor element or electronic device has a contour profile characterized by a substantially periodic wave or, alternatively, a substantially aperiodic wave. In the context of this description, periodic waves may comprise any two or three dimensional wave form including but not limited to, one or more sine waves, square waves, Aries functions, Gaussian wave forms, Lorentzian wave forms, or any combination of these. In another embodiment, the curved internal surface, or optionally the entire cross sectional component, of a semiconductor or electronic device has a contour profile comprising a plurality of aperiodic buckles having relatively large amplitudes and widths. In another embodiment, the curved internal surface, or optionally the entire cross section component, of a semiconductor or electronic device has a contour profile comprising both a periodic wave and a plurality of aperiodic buckles.

In one embodiment, a stretchable semiconductor element or electronic device of the present invention comprises a bent structure, such as a bent ribbon structure, having a periodic or aperiodic wave-shaped conformation extending along at least a portion of its length, and optionally width. The invention includes, for example, bent structures, including bent ribbon structures, having a sine wave conformation with periodicities between about 500 nanometers and 100 microns, and preferably for some applications periodicities between about 5 microns to about 50 microns. The invention includes, for example, bent structures, including bent ribbon structures, having a sine wave conformation with amplitudes between about 50 nanometers and about 5 microns and preferably for some applications amplitudes between about 100 nanometers to about 1.5 microns. Bent structures may be provided in other periodic wave form conformations such as square wave and/or Gaussian waves, extending along at least a portion of the lengths and/or widths of these structures. Stretchable and flexible semiconductor elements and stretchable electronic devices comprising bent ribbon structures may be expandable, compressible, bendable and/or deformable along an axis extending along the length of the semiconductor ribbon, such as an axis extending along the direction of a first wave form of the curved internal surface, and, optionally, may be expandable, compressible, bendable and/or deformable along one or more other axes, such as axes extending along the directions of other wave forms of the bent structures and curved internal surface.

In some embodiments, the conformation of semiconductor structures and electronic devices of this aspect of the present invention changes when mechanically stressed or when forces are applied. For example, the periodicities and/or amplitudes of bent semiconductor structures and electronic devices having wave-shaped or buckled conformations may change in response to applied mechanical stress and/or forces. In some embodiments, this ability to change conformation provides for the ability of stretchable semiconductor structures and electronic circuits to expand, compress, flex, deform and/or bend without experiencing significant mechanical damage, fracture or a substantial reduction in electronic properties and/or electronic device performance.

The curved internal surface of the semiconductor structure and/or stretchable electronic device may be continuously bonded to the supporting surface (i.e. bound at substantially all points (e.g. about 90%) along the curved internal surface). Alternatively, the curved internal surface of the semiconductor structure and/or stretchable electronic device may be discontinuously bonded to the supporting surface, wherein the curved internal surface is bonded to the supporting surface at selected points along the curved internal surface. The present invention includes embodiments wherein the internal surface of the semiconductor structure or electronic device is bonded to the flexible substrate at discrete points and the internal surface is in a curved conformation between the discrete points of binding between the internal surface and the flexible substrate. The present invention includes bent semiconductor structures and electronic devices having an internal surface that is bound to the flexible substrate at discrete points, wherein the discrete points of bonding are separated from each other by buckled regions that are not directly bound to the flexible substrate.

In some stretchable semiconductors and/or stretchable electronic devices of the present invention, only the internal surface of the semiconductor structure or electronic device is provided in a curved conformation. Alternatively, the present invention includes stretchable semiconductors and stretchable electronic devices provided in a bent conformation wherein an entire cross-sectional component of the bent semiconductor structure or electronic device is provided in a curved conformation, such as a wave-shaped, wrinkled, buckled or coiled conformation. In these embodiments, the curved conformation extends across the entire thickness of at least a portion of the semiconductor structure or electronic device. For example, stretchable semiconductors of the present invention include bent semiconductor ribbons or strips having a wave-shaped, wrinkled, buckled and/or coiled configuration. The present invention also includes compositions and electronic devices wherein the entire semiconductor structure or electronic device, or at least the majority of the semiconductor structure or electronic device, is provided in a curved conformation, such as a wave-shaped, wrinkled or bent conformation.

In some embodiments, the wave-shaped, buckled and/or stretchable conformation provides a way to mechanically tune useful the properties of compositions, materials and devices of the present invention. For example, the mobility of a semiconductor and the properties of its contacts, depend, at least in part, on strain. Spatially varying strain in the present invention is useful for modulating the materials and device properties in useful ways. As another example, spatially varying strain in a waveguide causes spatially varying index properties (through the elasto-optic effect), which can also be used to advantage for different types of grating couplers.

Bonding between the internal surface(s) of stretchable semiconductor structures and/or electronic devices to the external surface of flexible substrates may be provided using any composition, structure or bonding scheme providing a mechanically useful system capable of undergoing stretching and/or compression displacement without mechanical failure or significant degradation of electronic properties and/or performance, and optionally capable of flexing displacement without mechanical failure or significant degradation of electronic properties and/or performance. Useful bonding between the semiconductor structure and/or electronic device and the flexible substrate provides mechanically robust structures exhibiting beneficial electronic properties when in a variety of stretched, compressed and/or flexed configurations or deformations. In one embodiment of this aspect of the present invention, bonding between at least a portion of the internal surface of the semiconductor structure and/or electronic device and an external surface of the flexible substrate is provided by covalent and/or non covalent bonding between the semiconductor structure or electronic device and the external surface of the flexible substrate. Exemplary bonding schemes useful in these structures include the use of van der Waals interactions, dipole-diople interactions and/or hydrogen bonding interactions between the semiconductor structure or electronic device and the external surface of the flexible substrate. The present invention also includes embodiments wherein bonding is provided by an adhesive or laminating layer, coating or thin film provided between the semiconductor structure or electronic device and the external surface of the flexible substrate. Useful adhesive layers include, but are not limited to, metal layers, polymer layers, partial polymerized polymer precursor layers, and composite material layers. The present invention also includes use of flexible substrates having a chemically modified external surface to facilitate bonding with the semiconductor element or electronic device, for example a flexible substrate, such as a polymer substrate, having a plurality of hydroxyl groups disposed on its external surfaces. The invention includes flexible semiconductors and electronic circuits wherein the semiconductor structure or electronic circuit is entirely or partially encapsulated by an encapsulating layer or coating, such as a polymer layer.

The physical dimensions and composition of the semiconductor structure or electronic device at least in part influences the overall mechanical and electronic properties of the stretchable semiconductor elements of the present invention. As used herein, the term thin refers to a structure having a thickness less than or equal to about 100 microns, and preferably for some applications a thickness less than or equal to about 50 microns for some applications. Use of thin semiconductor structures or electronic devices, such as thin semiconductor ribbons, platelets and strips or thin film transistors, is important in some embodiments for facilitating formation of a curved internal surface, such as a wave-shaped, coiled or bent curved internal surface, providing a conformation able to stretch, contract and/or flex without damage, mechanical failure or significant degradation of electronic properties. Use of thin semiconductor structures and electronic devices, such as thin printable semiconductor structures, is particularly useful for stretchable semiconductors and stretchable electronic devices comprising brittle semiconductor materials, such as single crystalline and/or polycrystalline inorganic semiconductors. In a useful embodiment, the semiconductor structure or electronic circuit has a width selected over the range of about 1 microns to about 1 centimeter and a thickness selected over the range of about 50 nanometers to about 50 microns.

The composition and physical dimension of the supporting flexible substrate may also influence, at least in part, the overall mechanical properties of stretchable semiconductor elements and stretchable electronic devices of the present invention. Useful flexible substrates included, but are not limited to, flexible substrates having a thickness selected over the range of about 0.1 millimeter to about 100 microns. In a useful embodiment, the flexible substrate comprises a poly(dimethylsiloxane) PDMS layer and has a thickness selected over the range of about 0.1 millimeters to about 10 millimeters, preferably for some applications a thickness selected over the range of about 1 millimeters to about 5 millimeters.

The present invention also includes partially-processed stretchable semiconductor elements or partially-processed stretchable semiconductor circuits. In one embodiment, for example, the present invention includes Si ribbons having pn-diode devices on it. The Si ribbons are provided in a wave-shaped confirmation are optionally provided on a PDMS substrate. Interconnections are provided among these (isolated) diodes so that the diode output (ex. photocurrent) is capable of being amplified, for example via metal evaporation through shadow mask. In one embodiment, a plurality of separated stretchable transistors are fabricated on elastomer. Individual transistors are wired in some way (evaporation with shadow mask, for instance) to produce other useful circuits, for example circuits made of several transistors connected in specific way. For these cases, the interconnection metal wires are also stretchable, thus we have fully stretchable circuit on elastomer.

In another aspect, the present invention provides methods for making a stretchable semiconductor element, comprising the steps of: (1) providing a transferable semiconductor structure having an internal surface; (2) providing a prestrained elastic substrate in an expanded state, wherein the elastic substrate has an external surface; (3) bonding at least a portion of the internal surface of the transferable semiconductor structure to the external surface of the prestrained elastic substrate in an expanded state; and (4) allowing the elastic substrate to at least partially relax to a relaxed state, wherein relaxation of the elastic substrate bends the internal surface of the transferable semiconductor structure, thereby generating the stretchable semiconductor element having a curved internal surface. In some embodiments of this aspect of the invention, the prestrained elastic substrate is expanded along a first axis, and optionally along a second axis orthogonally positioned relative to the first axis. In a useful embodiment, the transferable semiconductor element provided to the prestrained elastic substrate is a printable semiconductor element.

In another aspect, the present invention provides a method for making a stretchable electronic circuit comprising the steps of: (1) providing a transferable electronic circuit having an internal surface; (2) providing a prestrained elastic substrate in an expanded state, wherein the elastic substrate has an external surface; (3) bonding at least a portion of the internal surface of the transferable electronic circuit to the external surface of the prestrained elastic substrate in an expanded state; and (4) allowing the elastic substrate to relax at least partially to a relaxed state, wherein relaxation of the elastic substrate bends the internal surface of the electronic circuit, thereby making the stretchable electronic circuit. In a useful embodiment, the transferable electronic circuit provided to the prestrained elastic substrate is a printable electronic circuit, such as an electronic circuit that is capable of transfer via printing techniques, such as dry transfer contact printing. In some embodiments, the electronic circuit comprises a plurality of integrated device components, including but not limited to, one or more semiconductor elements such as transferable, and optionally, printable semiconductor elements; dielectric elements; electrodes; conductive elements including superconductive elements; and doped semiconductor elements.

Optionally, the methods of the aspect of the present invention may further comprise the step of transferring the stretchable semiconductor or stretchable electronic circuit from the supporting elastic substrate to the receiving surface of a receiving substrate (different from the elastic substrate) in a manner which retains, at least in part, the curved internal surface and/or bent structure of the semiconductor element or electronic circuit. The semiconductor structure or electronic circuit is transferred to a receiving substrate that is flexible, such as a polymer receiving substrate, or a receiving substrate comprising paper, metal or a semiconductor. In this embodiment, the stretchable semiconductor or stretchable electronic device transferred may be bound to the receiving substrate, such as a flexible, polymer receiving substrate, via a wide range of means including, but not limited to, use of adhesive and/or laminating layers, thin films and/or coatings, such as adhesive layers (e.g. polyimide glue layers). Alternatively, the stretchable semiconductor or stretchable electronic device transferred may be bound to the receiving substrate, such as a flexible, polymer receiving substrate, via hydrogen bonding, covalent bonding, dipole-dipole interactions and van der Waals interactions between the transferred stretchable semiconductor or stretchable electronic device and the receiving substrate.

In one embodiment, after making bent semiconductor structures and/or electronic circuits having wave-shaped, buckled, wrinkled or coiled conformations supported by an elastic substrate, these structures are transferred onto another substrate using a proper adhesive layer or coating. In one embodiment, for example, wave-shaped photovoltaic devices are prepared on an elastomer substrate, and then transferred onto metal foil for example using polyimide as a glue layer. Electrical connection is established between the photovoltaic devices and underlying metal foil (which can act as one of collector electrodes; for example by patterning, etching to make through-holes to expose metal surface, metal deposition, etc.). The wavy surface of the photovoltaic devices in this configuration can be exploited for enhanced light trapping (or, reduced light reflection). To get better anti-reflection result, we can do further processing on this wavy surface, such as make surface roughness much smaller than wavelength of wavy semiconductor, for example. In short, the partially- or fully-processed wavy/bent semiconductors/circuits can be transferred onto other substrate (not limited to PDMS), and can be used with more enhanced performance, by adding further processing if necessary.

Optionally, the methods of the present invention may further comprise the step of encapsulating, encasing or laminating the stretchable semiconductor or stretchable electronic device. In this context, encapsulating includes in the case of delaminated buckled structures, geometries and conformations wherein the encapsulating material is provided under the raised regions of the buckles to fully embed all sides of the buckled structure. Encapsulating also includes providing an encapsulating layer, such as a polymer layer, on top of raised and non-raised features of the bent semiconductor structure or electronic circuit. In one embodiment, a prepolymer, such as a PDMS pre-polymer, is cast and cured on the stretchable semiconductor or stretchable electronic device. Encapsulation or encasing processing step is useful for some applications to enhance the mechanical stability and robustness of stretchable semiconductors and electronic devices of the present invention. The present invention includes encapsulated, encased and/or laminated stretchable semiconductors and electronic devices exhibiting good mechanical and electronic performance when in stretched, compressed, bent and/or flexed conformations.

Optionally, methods of this aspect of the present invention include the step of assembling semiconductor elements, device components and/or functional devices on a donor substrate, such a polymer substrate (e.g. 2D ultrathin polymer substrate) or an inorganic substrate (e.g. $SiO_2$). In this embodiment, the structures assembled on the donor substrate are then transferred to the prestrained elastomeric substrate to form stretchable materials, devices or device components. In one embodiment, transistors, transistor arrays or electronic devices having transistors are first assembled on a donor substrate, for example via printing techniques using printable semiconductor elements. Next, the entire device and/or device array is transferred to the prestrained elastic substrate, for example by contact printing, to form a stretchable wave-shaped and/or buckled system. This approach is useful for cases where it is beneficial to prepare the device interconnects and full scale circuit fabrication on a thin, non-elastomeric material (like polyimide or benzocyclobutene or PET, etc.) before transferring to the stretchable elastomeric support. In this type of system, one would yield aperiodic 2D wave-shaped or buckled structures in the combined transistor/polymer film/elastomer substrate system.

Methods of prestraining elastic substrates useful for the present methods include bending, rolling, flexing, and expanding the elastic substrate prior to and/or during contact and bonding with the semiconductor structure and/or electronic device, for example by using a mechanical stage. A particularly useful means of prestraining the elastic substrates in more than one direction comprises thermally expanding the elastic substrate by raising the temperature of the elastic substrate prior and/or during contact and bonding with the semiconductor structure and/or electronic device. Relaxation of the elastic substrate is achieved in these embodiments by lowering the temperature of the elastic substrate after contact and/or bonding with the transferable, and optionally printable, printable semiconductor element or electronic device. In some methods, the elastic substrate is prestrained by introducing a strain of about 1% to about 30%, and preferably for some applications by introducing a strain of about 3% to about 15%.

In the context of this description, the expression "elastic substrate" refers to a substrate which can be stretched or deformed and return, at least partially, to its original shape without substantial permanent deformation. Elastic substrates commonly undergo substantially elastic deformations. Exemplary elastic substrates useful in the present include, but are not limited to, elastomers and composite materials or mixtures of elastomers, and polymers and copolymers exhibiting elasticity. In some methods, the elastic substrate is prestrained via a mechanism providing for expansion of the elastic substrate along one or more principle axes. For example, prestraining may be provided by expanding the elastic substrate along a first axes. The present invention also includes, however, methods wherein the elastic substrate is expanded along a plurality of axes, for example via expansion along first and second axis orthogonally positioned relative to each other. Means of prestraining elastic substrates via mechanisms providing expansion of the elastic substrate useful for the present methods include bending, rolling, flexing, flattening, expanding or otherwise deforming the elastic substrate. The present invention also includes means wherein prestraining is provided by raising the temperature of the elastic substrate, thereby providing for thermal expansion of the elastic substrate.

The methods of the present invention are also capable of fabricating stretchable elements, devices and device components from materials other than semiconductor materials. The present invention includes methods wherein non-semiconductor structures, such as insulators, super conductors, and semi-metals are transferred to and bonded to a prestrain elastic substrate. Allowing the elastic substrate to relax, at least partially, results in formation of stretchable non-semiconductor structures having curved internal surfaces, for example non-semiconductor structures having a wave-shaped and/or buckled contour profile. This aspect of the present invention includes stretchable non-semiconductor structures that have a bent structure, such as internal, and optionally external, surfaces provided in a coiled conformation, in a wrinkled conformation, buckled conformation and/or in a wave-shaped configuration.

Flexible substrates useful in stretchable semiconductors, electronic devices and/or device components of the present invention include, but are not limited to, polymer substrates and/or plastic substrates. Stretchable semiconductors include compositions comprising one or more transferable, an optionally printable, semiconductor structures, such as printable semiconductor elements, supported by an elastic substrate that is prestrained during fabrication to generate the curved internal semiconductor surface. Alternatively, stretchable semiconductors include compositions comprising one or more transferable semiconductor structures, such as printable semiconductor elements, supported by a flexible substrate that is different than the elastic substrate that is prestrained during fabrication to generate the curved internal semiconductor surface. For example, the present invention includes stretchable semiconductors wherein the semiconductor structure having a curved internal surface is transferred from the elastic substrate to a different flexible substrate.

BRIEF DESCRIPTION OF THE DRAWINGS

FIG. 5 shows an atomic force micrograph of a stretchable semiconductor structure of the present invention having a semiconductor structure bonded to a flexible substrate having a three dimensional relief pattern on its supporting surface.

As shown in FIG. 8, printable semiconductor structures 776 have internal surfaces having a contour profile of a periodic wave.

FIG. 9A shows a process flow diagram illustrating an exemplary method of making an array of stretchable thin film transistors. FIG. 9B shows optical micrographs of an array of stretchable thin film transistors in relaxed and stretched configurations.

FIGS. 27A-C provides images at different degrees of magnification of a stretchable semiconductor of the present invention exhibiting stretchability in two dimensions.

DETAILED DESCRIPTION OF THE INVENTION

Figure 1:
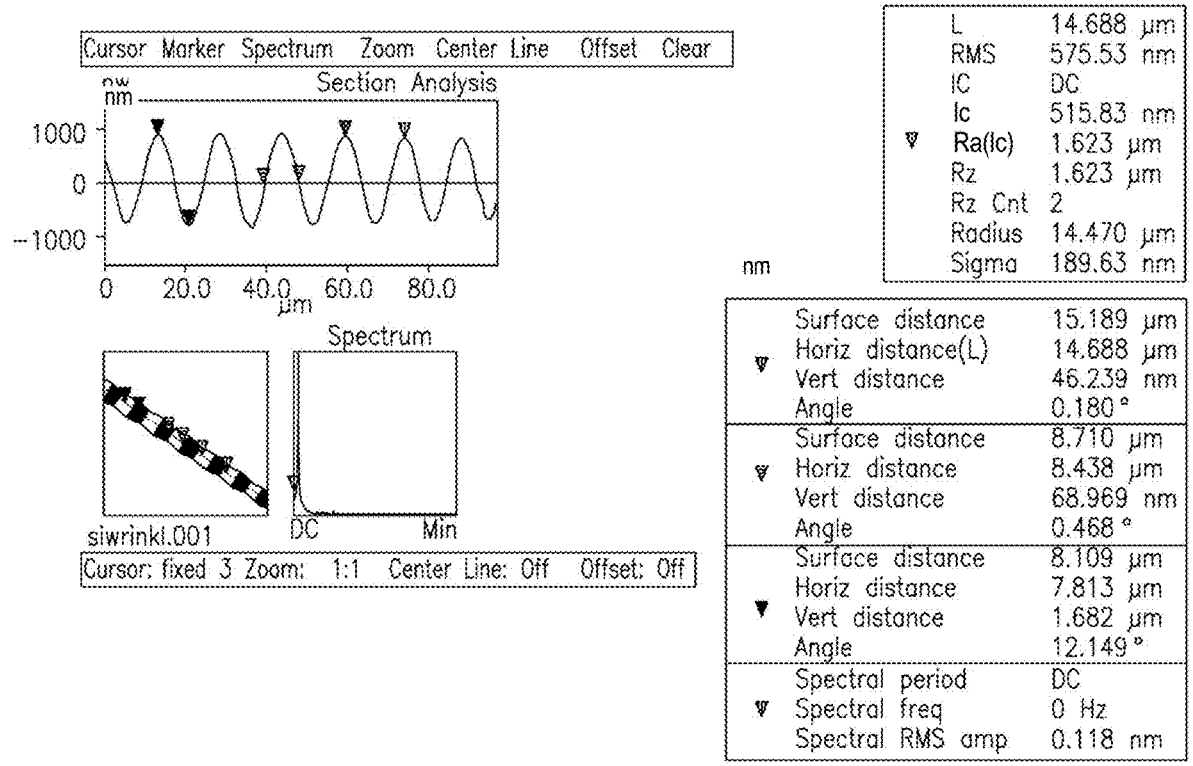
FIG. 1 provides an atomic force micrograph showing a stretchable semiconductor structure of the present invention.

Referring to the drawings, like numerals indicate like elements and the same number appearing in more than one drawing refers to the same element. In addition, hereinafter, the following definitions apply:

"Printable" relates to materials, structures, device components and/or integrated functional devices that are capable of transfer, assembly, patterning, organizing and/or integrating onto or into substrates. In one embodiment of the present invention, printable materials, elements, device components and devices are capable of transfer, assembly, patterning, organizing and/or integrating onto or into substrates via solution printing or dry transfer contact printing.

"Printable semiconductor elements" of the present invention comprise semiconductor structures that are able to be assembled and/or integrated onto substrate surfaces, for example using by dry transfer contact printing and/or solution printing methods. In one embodiment, printable semiconductor elements of the present invention are unitary single crystalline, polycrystalline or microcrystalline inorganic semiconductor structures. In this context of this description, a unitary structure is a monolithic element having features that are mechanically connected. Semiconductor elements of the present invention may be undoped or doped, may have a selected spatial distribution of dopants and may be doped with a plurality of different dopant materials, including P and N type dopants. The present invention includes microstructured printable semiconductor elements having at least one cross sectional dimension greater than or equal to about 1 micron and nanostructured printable semiconductor elements having at least one cross sectional dimension less than or equal to about 1 micron. Printable semiconductor elements useful in many applications comprises elements derived from "top down" processing of high purity bulk materials, such as high purity crystalline semiconductor wafers generated using conventional high temperature processing techniques. In one embodiment, printable semiconductor elements of the present invention comprise composite structures having a semiconductor operational connected to at least one additional device component or structure, such as a conducting layer, dielectric layer, electrode, additional semiconductor structure or any combination of these. In one embodiment, printable semiconductor elements of the present invention comprise stretchable semiconductor elements and/or heterogeneous semiconductor elements.

"Cross sectional dimension" refers to the dimensions of a cross section of device, device component or material. Cross sectional dimensions include width, thickness, radius, and diameter. For example, semiconductor elements having a ribbon shape are characterized by a length and two cross sectional dimensions; thickness and width. For example, printable semiconductor elements having a cylindrical shape are characterized by a length and the cross sectional dimension diameter (alternatively radius).

"Supported by a substrate" refers to a structure that is present at least partially on a substrate surface or present at least partially on one or more intermediate structures positioned between the structure and the substrate surface. The term "supported by a substrate" may also refer to structures partially or fully embedded in a substrate.

"Solution printing" is intended to refer to processes whereby one or more structures, such as printable semiconductor elements, are dispersed into a carrier medium and delivered in a concerted manner to selected regions of a substrate surface. In an exemplary solution printing method, delivery of structures to selected regions of a substrate surface is achieved by methods that are independent of the morphology and/or physical characteristics of the substrate surface undergoing patterning. Solution printing methods useable in the present invention include, but are not limited to, ink jet printing, thermal transfer printing, and capillary action printing.

"Substantially longitudinally oriented" refers to an orientation such that the longitudinal axes of a population of elements, such as printable semiconductor elements, are oriented substantially parallel to a selected alignment axis. In the context of this definition, substantially parallel to a selected axis refers to an orientation within 10 degrees of an absolutely parallel orientation, more preferably within 5 degrees of an absolutely parallel orientation.

"Stretchable" refers to the ability of a material, structure, device or device component to be strained without undergoing fracture. In an exemplary embodiment, a stretchable material, structure, device or device component may undergo strain larger than about 0.5% without fracturing, preferably for some applications strain larger than about 1% without fracturing and more preferably for some applications strain larger than about 3% without fracturing.

The terms "flexible" and "bendable" are used synonymously in the present description and refer to the ability of a material, structure, device or device component to be deformed into a curved shape without undergoing a transformation that introduces significant strain, such as strain characterizing the failure point of a material, structure, device or device component. In an exemplary embodiment, a flexible material, structure, device or device component may be deformed into a curved shape without introducing strain larger than or equal to about 5%, preferably for some applications larger than or equal to about 1%, and more preferably for some applications larger than or equal to about 0.5%.

The term "buckle" refers to a physical deformation that occurs when a thin element, structure and/or device responds to a compressive strain by bending in a direction out of the plane of the element, structure and/or device. The present invention includes stretchable semiconductors, devices and components having one or more surfaces with a contour profile comprising one or more buckles.

"Semiconductor" refers to any material that is a material that is an insulator at a very low temperature, but which has a appreciable electrical conductivity at a temperatures of about 300 Kelvin. In the present description, use of the term semiconductor is intended to be consistent with use of this term in the art of microelectronics and electronic devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Plastic" refers to any synthetic or naturally occurring material or combination of materials that can be molded or shaped, generally when heated, and hardened into a desired shape. Exemplary plastics useful in the devices and methods of the present invention include, but are not limited to, polymers, resins and cellulose derivatives. In the present description, the term plastic is intended to include composite plastic materials comprising one or more plastics with one or more additives, such as structural enhancers, fillers, fibers, plasticizers, stabilizers or additives which may provide desired chemical or physical properties.

"Dielectric" and "dielectric material" are used synonymously in the present description and refer to a substance that is highly resistant to flow of electric current. Useful dielectric materials include, but are not limited to, $SiO_2$, $Ta_2O_5$, $TiO_2$, $ZrO_2$, $Y_2O_3$, $SiN_4$, STO, BST, PLZT, PMN, and PZT.

"Polymer" refers to a molecule comprising a plurality of repeating chemical groups, typically referred to as monomers. Polymers are often characterized by high molecular masses. Polymers useable in the present invention may be organic polymers or inorganic polymers and may be in amorphous, semi-amorphous, crystalline or partially crystalline states. Polymers may comprise monomers having the same chemical composition or may comprise a plurality of monomers having different chemical compositions, such as a copolymer. Cross linked polymers having linked monomer chains are particularly useful for some applications of the present invention. Polymers useable in the methods, devices and device components of the present invention include, but are not limited to, plastics, elastomers, thermoplastic elastomers, elastoplastics, thermostats, thermoplastics and acrylates. Exemplary polymers include, but are not limited to, acetal polymers, biodegradable polymers, cellulosic polymers, fluoropolymers, nylons, polyacrylonitrile polymers, polyimide-imide polymers, polyimides, polyarylates, polybenzimidazole, polybutylene, polycarbonate, polyesters, polyetherimide, polyethylene, polyethylene copolymers and modified polyethylenes, polyketones, poly(methyl methacrylate, polymethylpentene, polyphenylene oxides and polyphenylene sulfides, polyphthalamide, polypropylene, polyurethanes, styrenic resins, sulphone based resins, vinyl-based resins or any combinations of these.

"Elastomer" refers to a polymeric material which can be stretched or deformed and return to its original shape without substantial permanent deformation. Elastomers commonly undergo substantially elastic deformations. Elastic substrates useful in the present invention comprise, at least in part, one or more elastomers. Exemplary elastomers useful in the present invention may comprise, polymers, copolymers, composite materials or mixtures of polymers and copolymers. Elastomeric layer refers to a layer comprising at least one elastomer. Elastomeric layers may also include dopants and other non-elastomeric materials. Elastomers useful in the present invention may include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones.

"Good electronic performance" and "high performance" are used synonymously in the present description and refer to devices and device components have electronic characteristics, such as field effect mobilities, threshold voltages and on-off ratios, providing a desired functionality, such as electronic signal switching and/or amplification. Exemplary transferable, and optionally printable, semiconductor elements of the present invention exhibiting good electronic performance may have intrinsic field effect mobilities greater than or equal 100 $cm^2$ $V^{-1}$ $s^{-1}$, preferably for some applications greater than or equal to about 300 $cm^2$ $V^{-1}$ $s^{-1}$. Exemplary transistors of the present invention exhibiting good electronic performance may have device field effect mobilities great than or equal to about 100 $cm^2$ $V^{-1}$ $s^{-1}$, preferably for some applications greater than or equal to about 300 $cm^2$ $V^{-1}$ $s^{-1}$, and more preferably for some applications greater than or equal to about 800 $cm^2$ $V^{-1}$ $s^{-1}$. Exemplary transistors of the present invention exhibiting good electronic performance may have threshold voltages less than about 5 volts and/or on-off ratios greater than about $1 \times 10^4$.

"Large area" refers to an area, such as the area of a receiving surface of a substrate used for device fabrication, greater than or equal to about 36 inches squared.

"Device field effect mobility" refers to the field effect mobility of an electronic device, such as a transistor, as computed using output current data corresponding to the electronic device.

"Young's modulus" is a mechanical property of a material, device or layer which refers to the ratio of stress to strain for a given substance. Young's modulus may be provided by the expression;

$$E = \frac{(\text{stress})}{(\text{strain})} = \left(\frac{L_0}{\Delta L} \times \frac{F}{A}\right); \quad \text{(II)}$$

wherein E is Young's modulus, $L_0$ is the equilibrium length, $\Delta L$ is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu}; \quad \text{(III)}$$

wherein $\lambda$ and $\mu$ are Lame constants. High Young's modulus (or "high modulus") and low Young's modulus (or "low modulus") are relative descriptors of the magnitude of Young's modulus in a give material, layer or device. In the present invention, a High Young's modulus is larger than a low Young's modulus, preferably about 10 times larger for some applications, more preferably about 100 times larger for other applications and even more preferably about 1000 times larger for yet other applications.

In the following description, numerous specific details of the devices, device components and methods of the present invention are set forth in order to provide a thorough explanation of the precise nature of the invention. It will be apparent, however, to those of skill in the art that the invention can be practiced without these specific details.

The present invention provides stretchable semiconductors and electronic circuits capable of providing good performance when stretched, compressed flexed or otherwise deformed. Further, stretchable semiconductors and electronic circuits of the present invention may be adapted to a wide range of device configurations to provide fully flexible electronic and optoelectronic devices.

Figure 2:
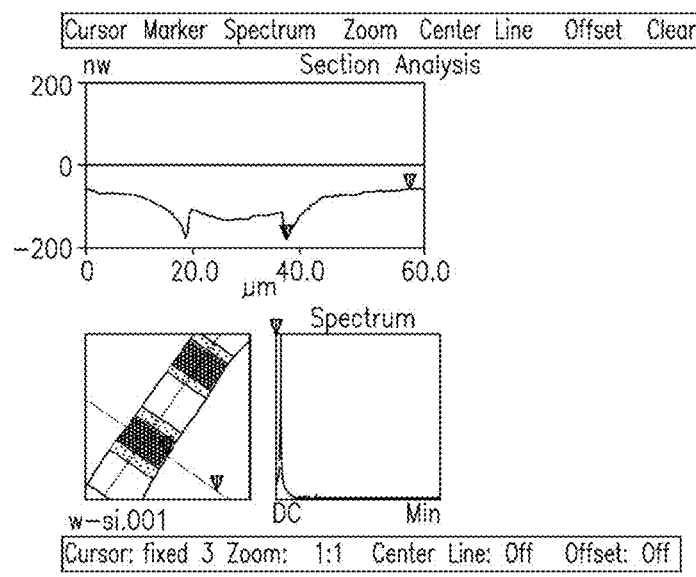
FIG. 2 shows an atomic force micrograph providing an expanded view of a semiconductor structure having curved internal surface.
Figure 3:
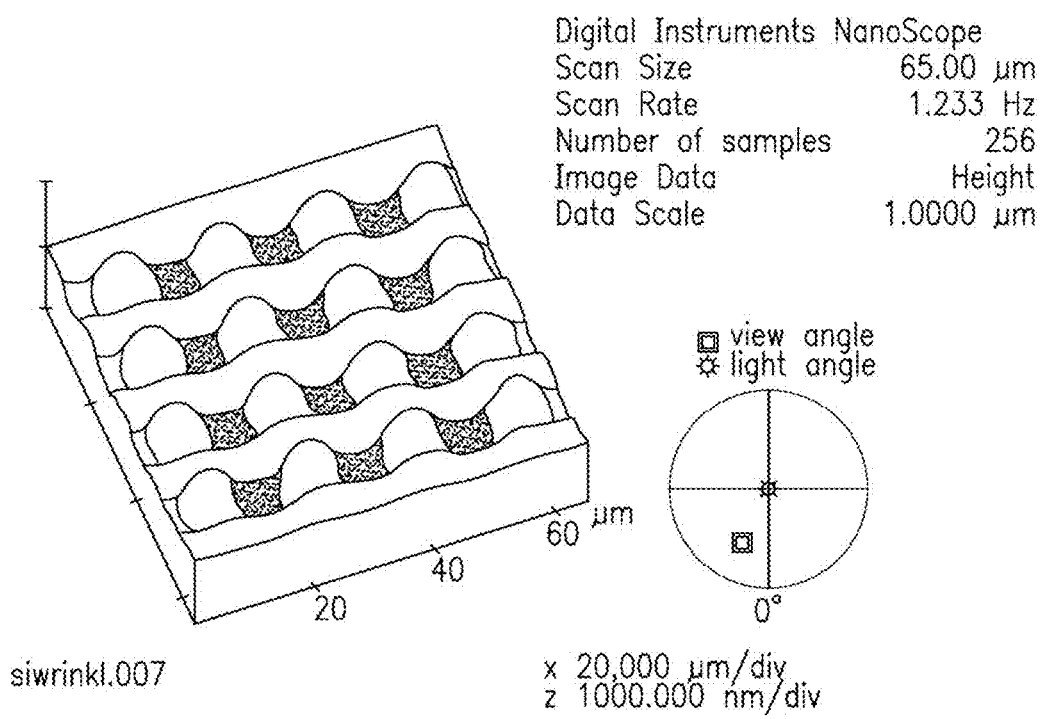
FIG. 3 shows an atomic force micrograph of an array of stretchable semiconductor structures of the present invention.
Figure 4:
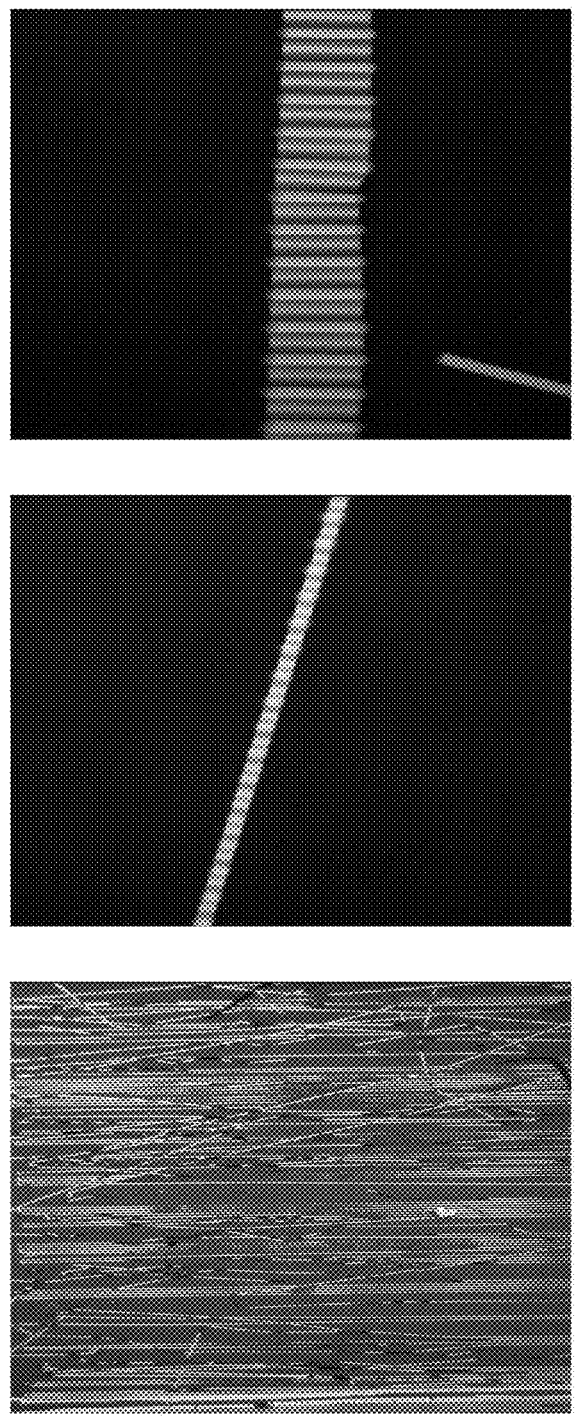
FIG. 4 shows optical micrographs of stretchable semiconductor structures of the present invention.

FIG. 1 provides an atomic force micrograph showing a stretchable semiconductor structure of the present invention. The stretchable semiconductor element 700 comprises a flexible substrate 705, such as a polymer and/or elastic substrate, having a supporting surface 710 and a bent semiconductor structure 715 having a curved internal surface 720. In this embodiment, at least a portion of the curved internal surface 720 of bent semiconductor structure 715 is bonded to the supporting surface 710 of the flexible substrate 705. The curved internal surface 720 may be bonded supporting surface 710 at selected points along internal surface 720 or at substantially all points along internal surface 720. The exemplary semiconductor structure illustrated in FIG. 1 comprises a bent ribbon of single crystalline silicon having a width equal to about 100 microns and a thickness equal to about 100 nanometers. The flexible substrate illustrated in FIG. 1 is a PDMS substrate having a thickness of about 1 millimeter. Curved internal surface 720 has a bent structure comprising a substantially periodic wave extending along the length of the ribbon. As shown in FIG. 1, the amplitude of the wave is about 500 nanometers and the peak spacing is approximately 20 microns. FIG. 2 shows an atomic force micrograph providing an expanded view of a bent semiconductor structure 715 having curved internal surface 720. FIG. 3 shows an atomic force micrograph of an array of stretchable semiconductor structures of the present invention. Analysis of the atomic force micrograph in FIG. 3 shows that the bent semiconductor structures are compressed by about 0.27%. FIG. 4 shows optical micrographs of stretchable semiconductor structures of the present invention.

The contour profile of curved surface 720 allows the bent semiconductor structure 715 to be expanded or compressed along deformation axis 730 without undergoing substantial mechanical strain. This contour profile may also allow the semiconductor structure to be bent, flexed or deformed in directions other than along deformation axis 730 without significant mechanical damage or loss of performance induced by strain. Curved surfaces of semiconductor structures of the present invention may have any contour profile providing good mechanical properties, such as stretchabilty, flexibility and/or bendability, and/or good electronic performance, such as exhibiting good field effect mobilities when flexed, stretched or deformed. Exemplary contour profiles may be characterized by a plurality of convex and/or concave regions, and by a wide variety of wave forms including sine waves, Gaussian waves, Aries functions, square waves, Lorentzian waves, periodic waves, aperiodic waves or any combinations of these. Wave forms useable in the present invention may vary with respect to two or three physical dimensions.

FIG. 5 shows an atomic force micrograph of a stretchable semiconductor structure of the present invention having a bent semiconductor structure 715 bonded to a flexible substrate 705 having a three dimensional relief pattern on its supporting surface 710. The three-dimensional relief pattern comprises recessed region 750 and relief features 760. As shown in FIG. 5, bent semiconductor structure 715 is bound to supporting surface 710 in recessed region 750 and on relief features 760.

Figure 6:
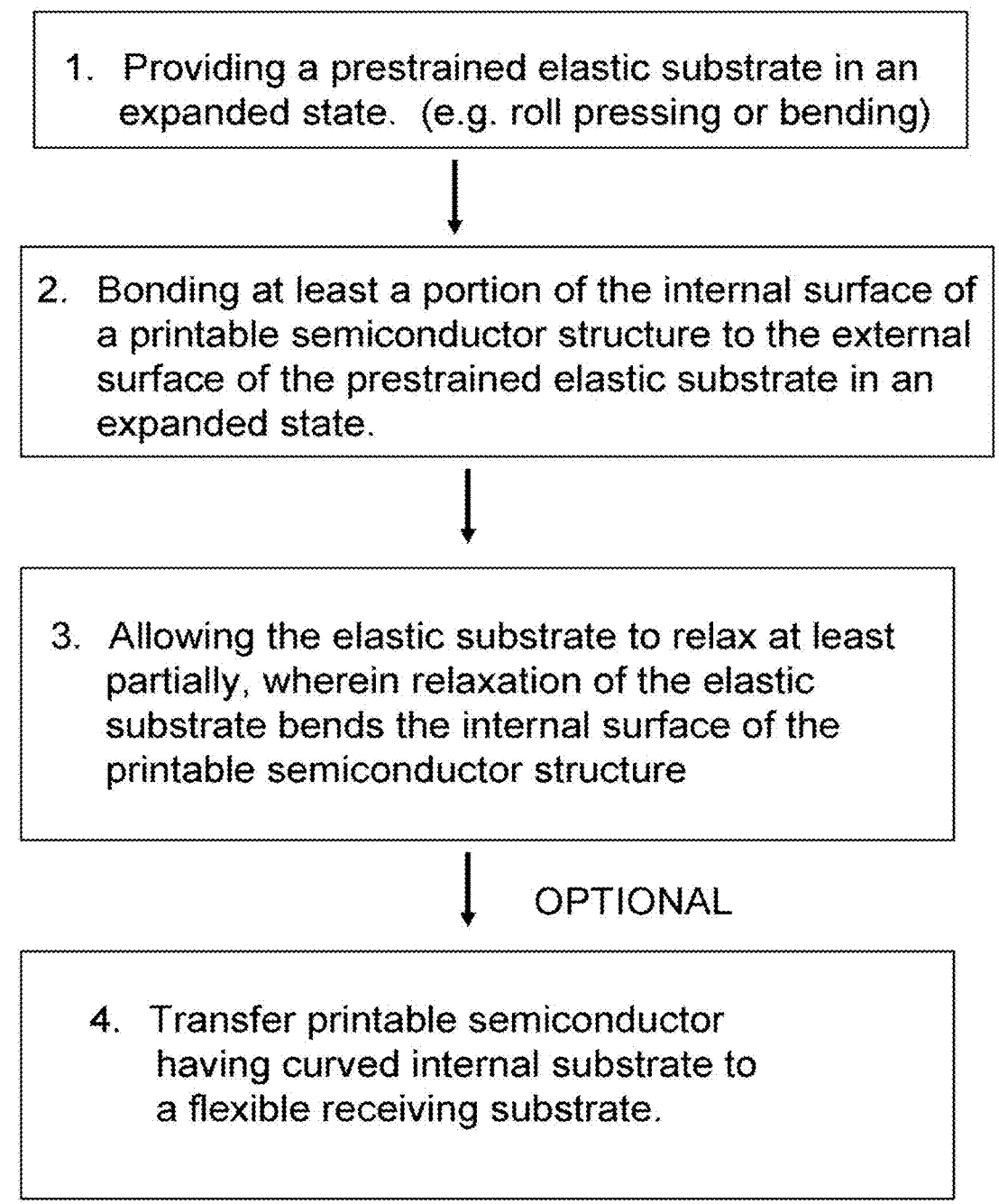
FIG. 6 shows a flow diagram illustrating an exemplary method of making a stretchable semiconductor element of the present invention.

FIG. 6 shows a flow diagram illustrating an exemplary method of making a stretchable semiconductor structure of the present invention. In the exemplary method, a pre-strained elastic substrate in an expanded state is provided. Prestraining can be achieved by any means known in the art including, but not limited to, roll pressing and/or prebending the elastic substrate. Prestraining may also be achieved via thermal means, for example, by thermal expansion induced by raising the temperature of the elastic substrate. An advantage of prestraining via thermal means is that expansion along a plurality of different axes, such as orthogonal axes, is achievable.

An exemplary elastic substrate useable in this method of the present invention is a PDMS substrate having a thickness equal to about 1 millimeter. The elastic substrate may be prestrained by expansion along a single axis or by expansion along a plurality of axes. As shown in FIG. 6, at least a portion of the internal surface of a printable semiconductor element is bonded to the external surface of the prestrained elastic substrate in an expanded state. Bonding may be achieved by covalent bonding between the internal surface of the semiconductor surface, by van der Waals forces, by using adhesive or any combinations of these. In an exemplary embodiment wherein the elastic substrate is PDMS, the supporting surface of the PDMS substrate is chemically modified such that is has a plurality of hydroxyl groups extending from its surface to facilitate covalent bonding with a silicon semiconductor structure. Referring back to FIG. 6, after binding the prestrained elastic substrate and semiconductor structure, the elastic substrate is allowed to relax at least partially to a relaxed state. In this embodiment, relaxation of the elastic substrate bends the internal surface of said semiconductor structure, thereby generating a semiconductor element having a curved internal surface.

As shown in FIG. 6, the fabrication method may optionally include a second transfer step and, optional bonding step, wherein the transferable semiconductor element 715 having a curved internal surface 720 is transferred from the elastic substrate to another substrate, preferably a flexible substrate, such as a polymer substrate. This second transfer step may be achieved by bringing an exposed surface of the semiconductor structure 715 having a curved internal surface 720 in contact with a receiving surface of the other substrate that binds to the exposed surface of the semiconductor structure 715. Bonding to the other substrate may be accomplished by any means capable of maintaining, at least partially, the bent structure of the semiconductor element, including covalent bonds, bonding via van der Waals forces, dipole-dipole interactions, London forces and/or hydrogen bonding. The present invention also includes the use of adhesives layers, coatings and/or thin films provided between an exposed surface of the transferable semiconductor structure and the receiving surface.

Stretchable semiconductor elements of the present invention may be effectively integrated into a large number functional devices and device components, such as transistors, diodes, lasers, MEMS, NEMS, LEDS and OLEDS. Stretchable semiconductor elements of the present invention have certain functional advantages over conventional rigid inorganic semiconductors. First, stretchable semiconductor elements may be flexible, and thus, less susceptible to structural damage induced by flexing, bending and/or deformation than conventional rigid inorganic semiconductors. Second, as a bent semiconductor structure may be in a slightly mechanically strained state to provide a curved internal surface, stretchable semiconductor elements of the present invention may exhibit higher intrinsic field effect mobilities than conventional unstrained inorganic semiconductors. Finally, stretchable semiconductor elements are likely to provide good thermal properties because they are capable of expanding and contracting freely upon device temperature cycling.

Figure 7:
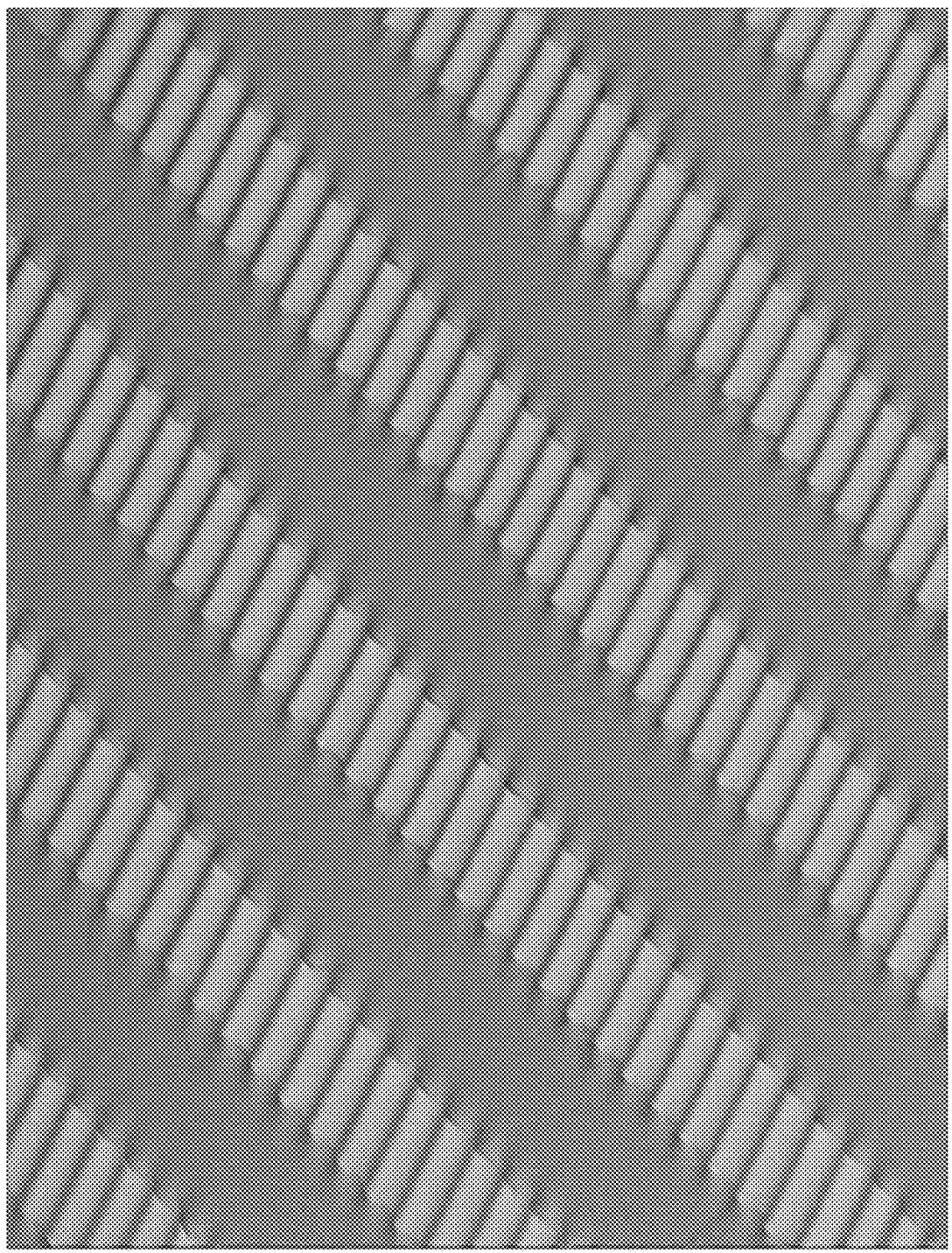
FIG. 7 shows an image of an array of longitudinal aligned stretchable semiconductors structures having wave-shaped curved internal surfaces supported by a flexible rubber substrate.

FIG. 7 shows an image of an array of longitudinal aligned stretchable semiconductors having a wavy conformation As shown in FIG. 7, the semiconductor ribbons are provided in a periodic wave conformation and are supported by a single flexible rubber substrate.

Figure 8:
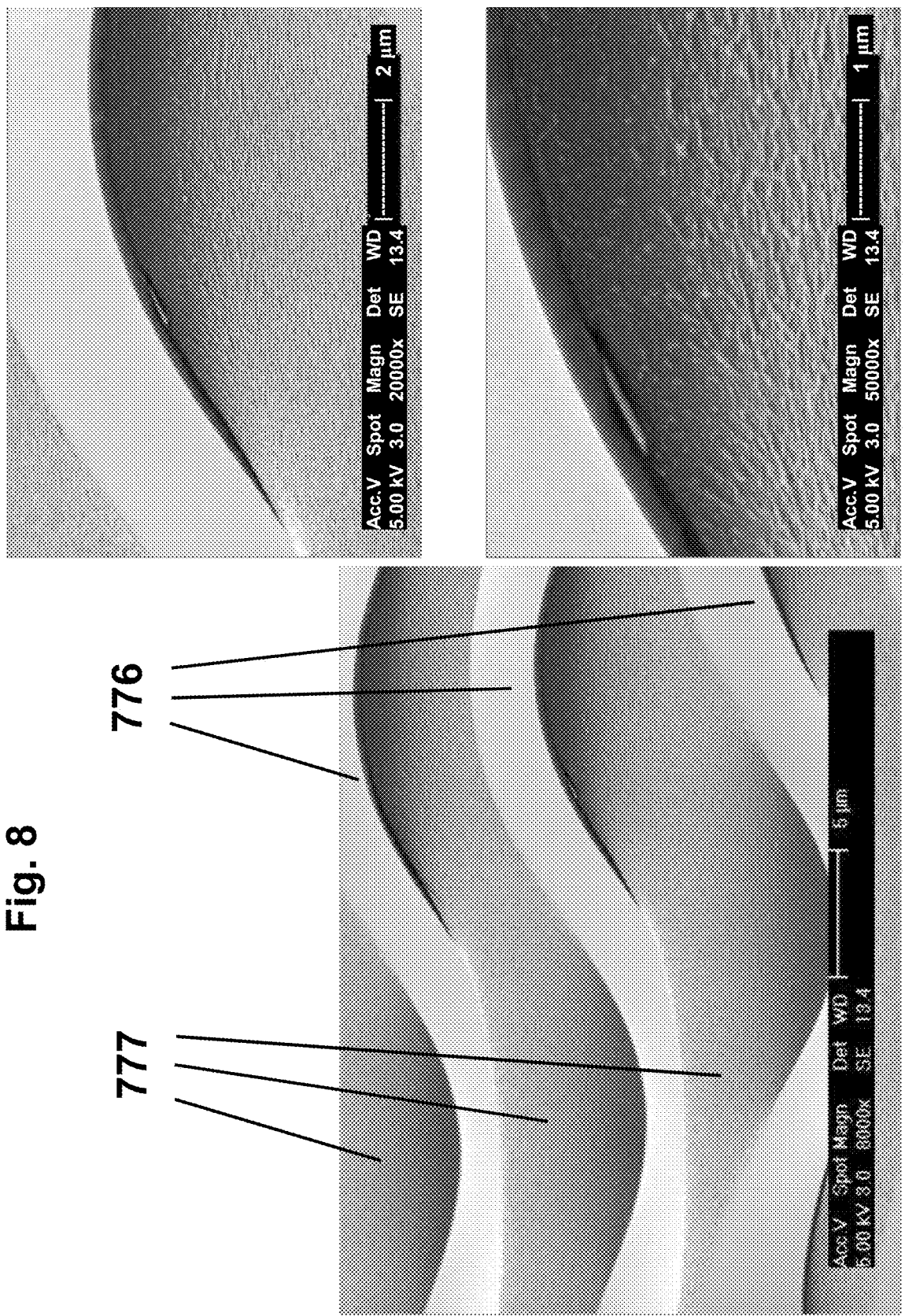
FIG. 8 shows a cross sectional image of a stretchable semiconductor structure of the present invention, wherein printable semiconductor structures 776 are supported by flexible substrate 777.

FIG. 8 shows a cross sectional image of a stretchable semiconductor element of the present invention, wherein semiconductor structures 776 are supported by flexible substrate 777. As shown in FIG. 8, semiconductor structures 776 have internal surfaces having a contour profile of a periodic wave. As also shown in FIG. 8, the periodic wave conformation extends through the entire cross sectional dimension of the semiconductor structures 776.

The present invention also provides stretchable electronic circuits, devices and device arrays capable of good performance when stretched, flexed or deformed. Similar to the stretchable semiconductor elements described above, the present invention provides stretchable circuits and electronic devices comprising a flexible substrate having a supporting surface in contact with a device, device array or circuit having a curved internal surface, such as a curved internal surface exhibiting a wave structure. In this structural arrangement, at least a portion of the curved internal surface of the device, device array or circuit structure is bonded to the supporting surface of the flexible substrate. The device, device array or circuit of this aspect of the present invention is a multicomponent element comprising a plurality of integrated device components, such as semiconductors, dielectrics, electrodes, doped semiconductors and conductors. In an exemplary embodiment, flexible circuits, devices and device arrays having a net thickness less than about 10 microns comprise a plurality of integrated device components at least a portion of which have a periodic wave curved structure.

In a useful embodiment of the present invention, a free standing electronic circuit or device comprising a plurality of interconnected components is provided. An internal surface of the electronic circuit or device is contacted and at least partially bonded to a prestrained elastic substrate in an expanded state. Prestraining can be achieved by any means known in the art including, but not limited to, roll pressing and/or prebending the elastic substrate, and the elastic substrate may be prestrained by expansion along a single axis or by expansion along a plurality of axes. Bonding may be achieved directly by covalent bonding or van der Waals forces between at least a portion of the internal surface of the electronic circuit or device and the prestrained elastic substrate, or by using adhesive or an intermediate bonding layer. After binding the prestrained elastic substrate and the electronic circuit or device, the elastic substrate is allowed to relax at least partially to a relaxed state, which bends the internal surface of the semiconductor structure. Bending of the internal surface of the electronic circuit or device generates a curved internal surface which in some useful embodiments has a periodic or aperiodic wave configuration. The present invention includes embodiments wherein all the components comprising the electronic device or circuit are present in a periodic or aperiodic wave configuration.

Periodic or aperiodic wave configurations of stretchable electronic circuits, devices and device arrays allow them to conform to stretch or bent configurations without generating large strains on individual components of the circuits or devices. This aspect of the present invention provides useful electronic behavior of stretchable electronic circuits, devices and device arrays when present in bent, stretched or deformed states. The period of periodic wave configurations formed by the present methods may vary with (i) the net thickness of the collection of integrated components comprising the circuit or device and (ii) the mechanical properties, such as Young's modulus and flexural rigidity, of the materials comprising integrated device components.

FIG. 9A shows a process flow diagram illustrating an exemplary method of making an array of stretchable thin film transistors. As shown in FIG. 9A, an array of free standing printable thin film transistors is provided using the techniques of the present invention. The array of thin film transistors is transferred to a PDMS substrate via dry transfer contact printing methods in a manner which exposes internal surfaces of the transistors. The exposed internal surfaces are next contacted with a room temperature cured prestrained PDMS layer present in an expanded state. Subsequent full curing of the prestrained PDMS layer bonds the internal surfaces of the transistors to the prestrained PDMS layer. The prestrained PDMS layer is allowed to cool and assume an at least partially relaxed state. Relaxation of PDMS layers introduces a periodic wave structure to the transistors in the array, thereby making them stretchable. The inset in FIG. 9A provides an atomic force micrograph of a array of stretchable thin film transistors made by the present methods. The atomic force micrograph shows the periodic wave structure that provides for good electronic performance in stretched or deformed states.

FIG. 9B shows provides optical micrographs of an array of stretchable thin film transistors in relaxed and stretched configurations. Stretching the array in a manner generating a net strain of about 20% on the array did not fracture or damage the thin film transistors. The transition from a relax configuration to a strain configuration was observed to be a reversible process. FIG. 9B also provides a plot of drain current verse drain voltage for several potentials applied to the gate electrode showing that the stretchable thin film transistors exhibit good performance in both relaxed and stretched configurations.

Example 1: A Stretchable Form of Single Crystal Silicon for High Performance Electronics on Rubber Substrates We have produced a stretchable form of silicon that consists of sub-micrometer single crystal elements structured into shapes with microscale periodic, wave-like geometries. When supported by an elastomeric substrate, this 'wavy' silicon can be reversibly stretched and compressed to large strains without damaging the silicon. The amplitudes and periods of the waves change to accommodate these deformations, thereby avoiding significant strains in the silicon itself. Dielectrics, patterns of dopants, electrodes and other elements directly integrated with the silicon yield fully formed, high performance 'wavy' metal oxide semiconductor field effect transistors, pn diodes and other devices for electronic circuits that can be stretched or compressed to similarly large levels of strain.

Progress in electronics is driven mainly by efforts to increase circuit operating speeds and integration densities, to reduce their power consumption and, for display systems, to enable large area coverage. A more recent direction seeks to develop methods and materials that enable high performance circuits to be formed on unconventional substrates with unusual form factors: flexible plastic substrates for paperlike displays and optical scanners, spherically curved supports for focal plane arrays and conformable skins for integrated robotic sensors. Many electronic materials can provide good bendability when prepared in thin film form and placed on thin substrate sheets or near neutral mechanical planes in substrate laminates. In those cases, the strains experienced by the active materials during bending can remain well below typical levels required to induce fracture (~1%). Full stretchability, a much more challenging characteristic, is required for devices that can flex, stretch or reach extreme levels of bending as they are operated or for those that can be conformally wrapped around supports with complex, curvilinear shapes. In these systems, strains at the circuit level can exceed the fracture limits of nearly all known electronic materials, especially those that are well developed for established applications. This problem can be circumvented, to some extent, with circuits that use stretchable conducting wires to interconnect electronic components (e.g. transistors) supported by rigid, isolated islands. Promising results can be obtained with this strategy, although it is best suited to applications that can be achieved with active electronics at relatively low coverages. We report a different approach, in which stretchability is achieved directly in thin films of high quality single crystal silicon that have micron scale periodic, 'wave'-like geometries. These structures accommodate large compressive and tensile strains through changes in the wave amplitudes and wavelengths rather than through potentially destructive strains in the materials themselves. Integrating such stretchable 'wavy' silicon elements with dielectrics, patterns of dopants and thin metal films leads to high performance, stretchable electronic devices.

Figure 10:
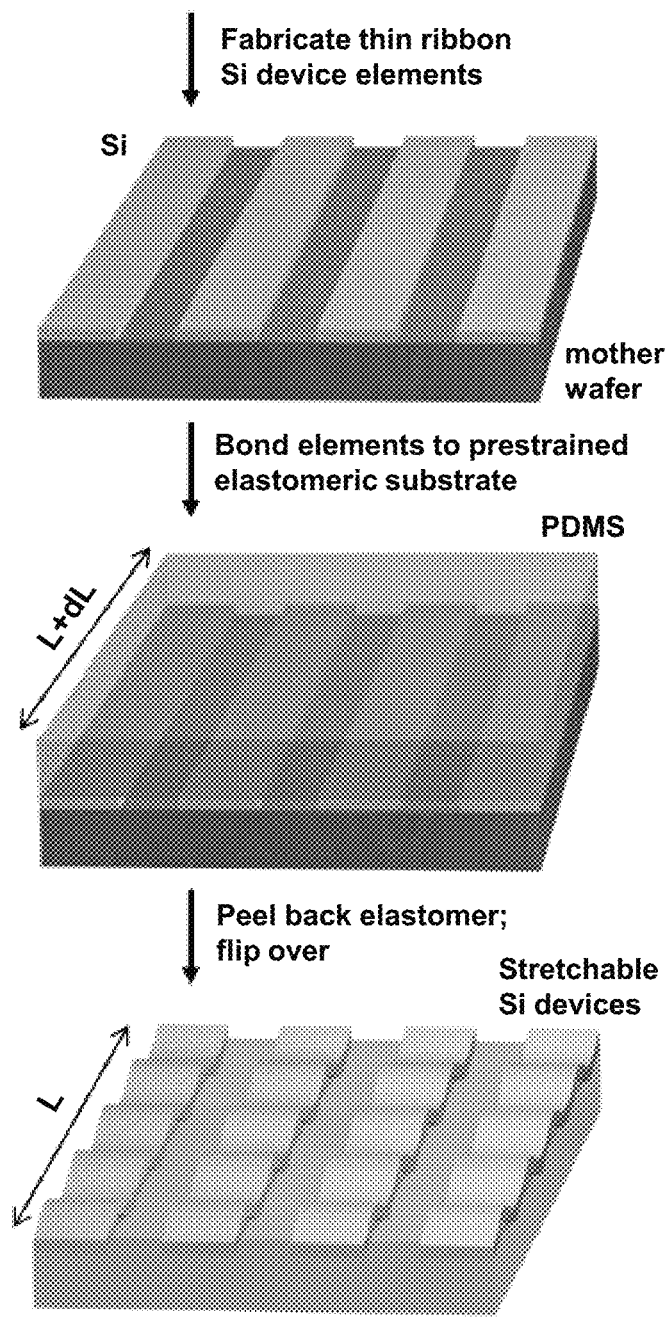
FIG. 10: Schematic illustration of the process for building stretchable single crystal silicon devices on elastomeric substrates. The first step (top frame) involves fabrication of thin (thicknesses between 20 and 320 nm) elements of single crystal silicon or complete integrated devices (i.e. transistors, diodes, etc.) by conventional lithographic processing followed by etching of the top silicon and $SiO_2$ layers of a silicon-on-insulator (SOI) wafer. After these procedures, the ribbon structures are supported by but not bonded to the underlying wafer (top frame). Contacting a pre-strained elastomeric substrate (poly(dimethylsiloxane) PDMS—stretched by dL) to the ribbons leads to bonding between these materials (middle frame). Peeling back the PDMS, with the ribbons bonded on its surface, and then releasing the pre-strain causes the PDMS to relax back to its unstrained state (unstressed length, L). This relaxation leads to the spontaneous formation of well controlled, highly periodic, stretchable 'wave-shaped' structures in the ribbons (bottom frame).

FIG. 10 presents a fabrication sequence for wavy single crystal silicon ribbons on elastomeric (i.e. rubber) substrates. The first step (top frame) involves photolithography to define a resist layer on a silicon-on-insulator (SOI) wafer, followed by etching to remove the exposed parts of the top silicon. Removing the resist with acetone and then etching the buried $SiO_2$ layer with concentrated hydrofluoric acid releases the ribbons from the underlying silicon substrate. The ends of the ribbons connect to the wafer to prevent them from washing away in the etchant. The widths (5~50 μm) and lengths (~15 mm) of the resist lines define the dimensions of the ribbons. The thickness of the top silicon (20~320 nm) on the SOI wafers defines the ribbon thicknesses. In the next step (middle frame), a flat elastomeric substrate (poly (dimethylsiloxane), PDMS; 1~3 mm thick) is elastically stretched and then brought into conformal contact with the ribbons. Peeling the PDMS away lifts the ribbons off of the wafer and leaves them adhered to the PDMS surface. Releasing the strain in the PDMS (i.e. the prestrain) leads to surface deformations that cause well-defined waves to form in the silicon and the PDMS surface. (FIGS. 11A and 11B) The relief profiles are sinusoidal (top frame, FIG. 11C) with periodicities between 5 and 50 μm and amplitudes between 100 nm and 1.5 μm, depending on the thickness of the silicon and the magnitude of prestrain in the PDMS. For a given system, the periods and amplitudes of the waves are uniform to within ~5%, over large areas (~$cm^2$). The flat morphology of the PDMS between the ribbons and the absence of correlated phases in waves of adjacent ribbons suggest that the ribbons are not strongly coupled mechanically. FIG. 11C (bottom frame) shows micro Raman measurements of the Si peak, measured as a function of distance along one of the wavy ribbons. The results provide insights into the stress distributions.

Figure 11:
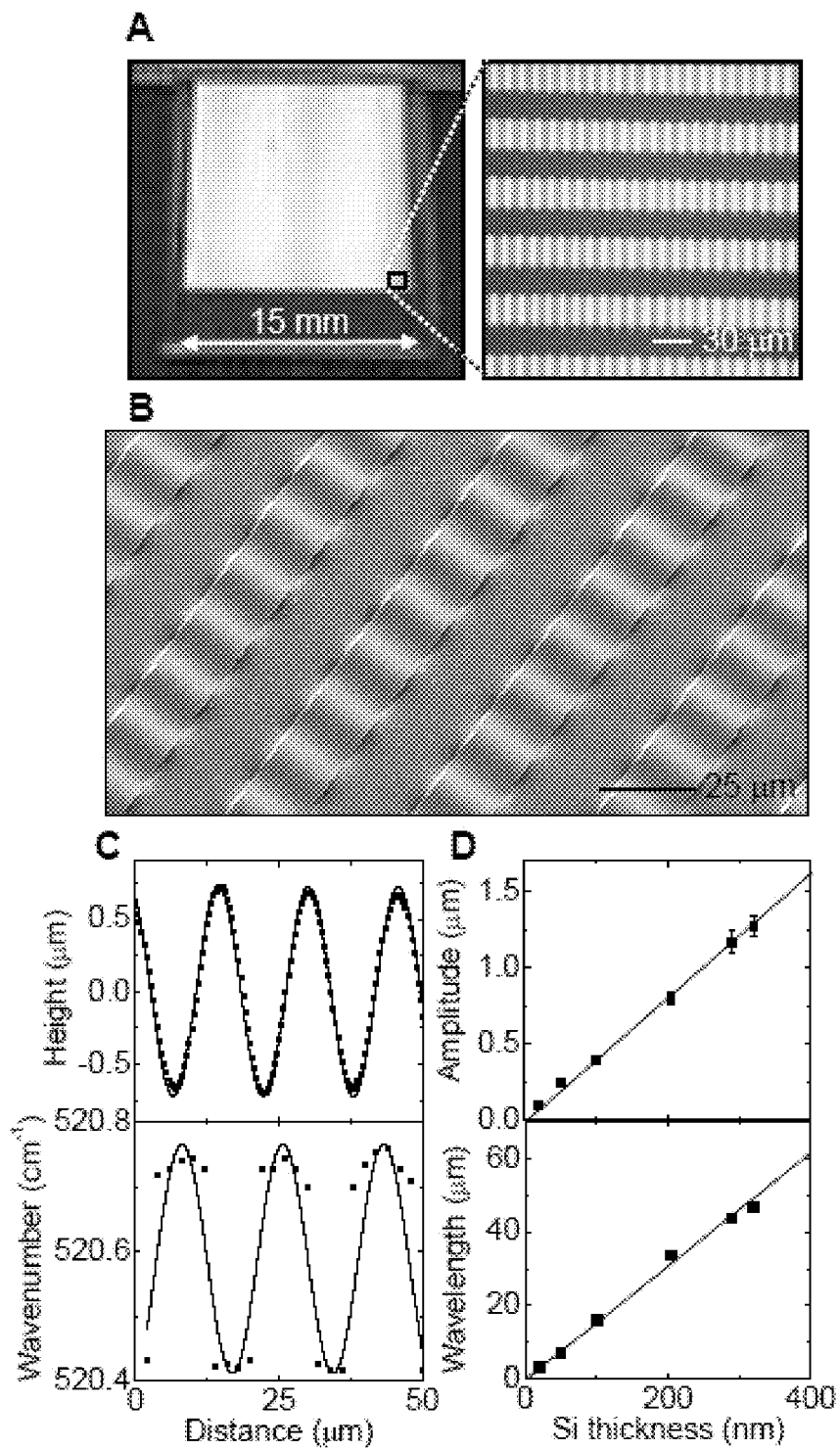
FIG. 11: (A) Optical images of a large scale aligned array of wavy single crystal silicon ribbons (widths=20 µm; spacings=20 µm; thicknesses=100 nm) on PDMS. (B) Angled view scanning electron micrograph of four wavy silicon ribbons from the array shown in (A). The wavelengths and amplitudes of the wave structures are highly uniform across the array. (C) Surface height (top frame) and wavenumber of the Si Raman peak (bottom frame) as a function of position along a wavy Si ribbon on PDMS, measured by atomic force and Raman microscopy, respectively. The lines represent sinusoidal fits to the data. (D) Amplitudes (top frame) and wavelengths (bottom frame) of wavy silicon ribbons as a function of the thickness of the silicon, all for a given level of prestrain in the PDMS. The lines correspond to calculations, without any fitting parameters.
Figure 12:
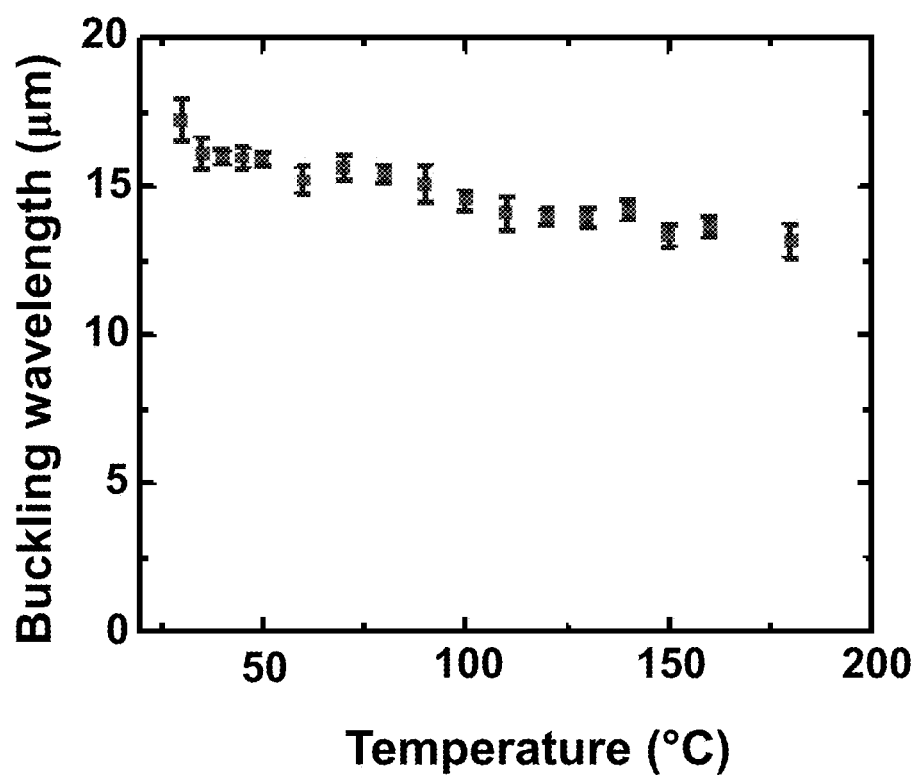
FIG. 12: Buckling wavelength as a function of temperature. The slight decrease in wavelength with increasing temperature is due to thermal shrinkage of the PDMS, which leads to shorter wavelengths for samples prepared at higher temperatures.
Figure 13:
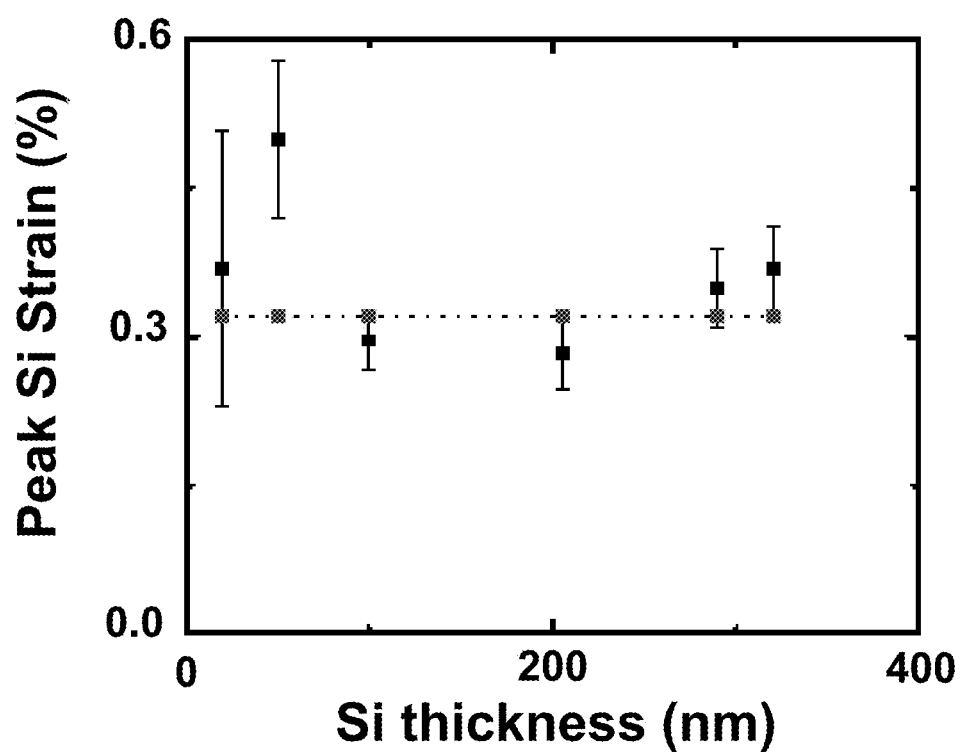
FIG. 13: Peak silicon strain as a function of silicon thickness, for a prestrain value of ~0.9%. The red symbols correspond to bending strains computed using wavelengths and amplitudes extracted based on equations that describe the buckling process. The black symbols correspond to similar calculations but using wavelengths and amplitudes measured by AFM.

The behavior in this static wavy configuration is consistent with non-linear analysis of the initial buckled geometry in a uniform, thin high modulus layer on a semi-infinite low modulus support:

$$\lambda_0 = \frac{\pi h}{\sqrt{\varepsilon_c}}, \; A_0 = h\sqrt{\frac{\varepsilon_{pre}}{\varepsilon_c} - 1} \tag{1}$$

$$\text{where } \varepsilon_c = 0.52\left[\frac{E_{PDMS}(1-v_{Si}^2)}{E_{Si}(1-v_{PDMS}^2)}\right]^{2/3}$$

is the critical strain for buckling, $\varepsilon_{pre}$ is the level of prestrain, $\lambda_0$ is the wavelength and $A_0$ is the amplitude. The Poisson ratio is $v$, the Young's modulus is E, and the subscripts refer to properties of the Si or PDMS. The thickness of the silicon is h. This treatment captures many features of the as-fabricated wavy structures. FIG. 11D shows, for example, that when the prestrain value is fixed (~0.9% for these data), the wavelengths and amplitudes both depend linearly on the Si thickness. The wavelengths do not depend on the level of prestrain (FIG. 12). Furthermore, calculations that use literature values for the mechanical properties of the Si and PDMS ($E_{Si}$=130 GPa, $E_{PDMS}$=2 MPa, $v_{Si}$=0.27, $v_{PDMS}$=0.48) yield amplitudes and wavelengths that are within ~10% (maximum deviation) of the measured values. The "ribbon strain" is computed from the ratio of the effective lengths of the ribbons (as determined from the wavelength) to their actual lengths (as determined from surface distances measured by AFM), and yield values that are approximately equal to the prestrain in the PDMS, for prestrains up to ~3.5%. The peak (i.e. maximum) strains in the silicon itself, which we refer to as silicon strains, are estimated from the ribbon thicknesses and radii of curvature at the extrema of the waves according to κh/2, where κ is the curvature, in regimes of strain where the waves exist and where the critical strain (~0.03% for the cases examined here) is small compared to the peak strains associated with bending. For the data of FIG. 11, the peak silicon strains are ~0.36(±0.08)%, which is more than a factor of two smaller than the ribbon strains. This silicon strain is the same for all ribbon thicknesses, for a given prestrain (FIG. 13). The resulting mechanical advantage, in which the peak silicon strain is substantially less than the ribbon strain, is critically important for achieving stretchability. We note that buckled thin films have also been observed in metals and dielectrics evaporated or spin cast onto PDMS (in contrast to pre-formed, transferred single crystal elements and devices, as described herein).

Figure 14:
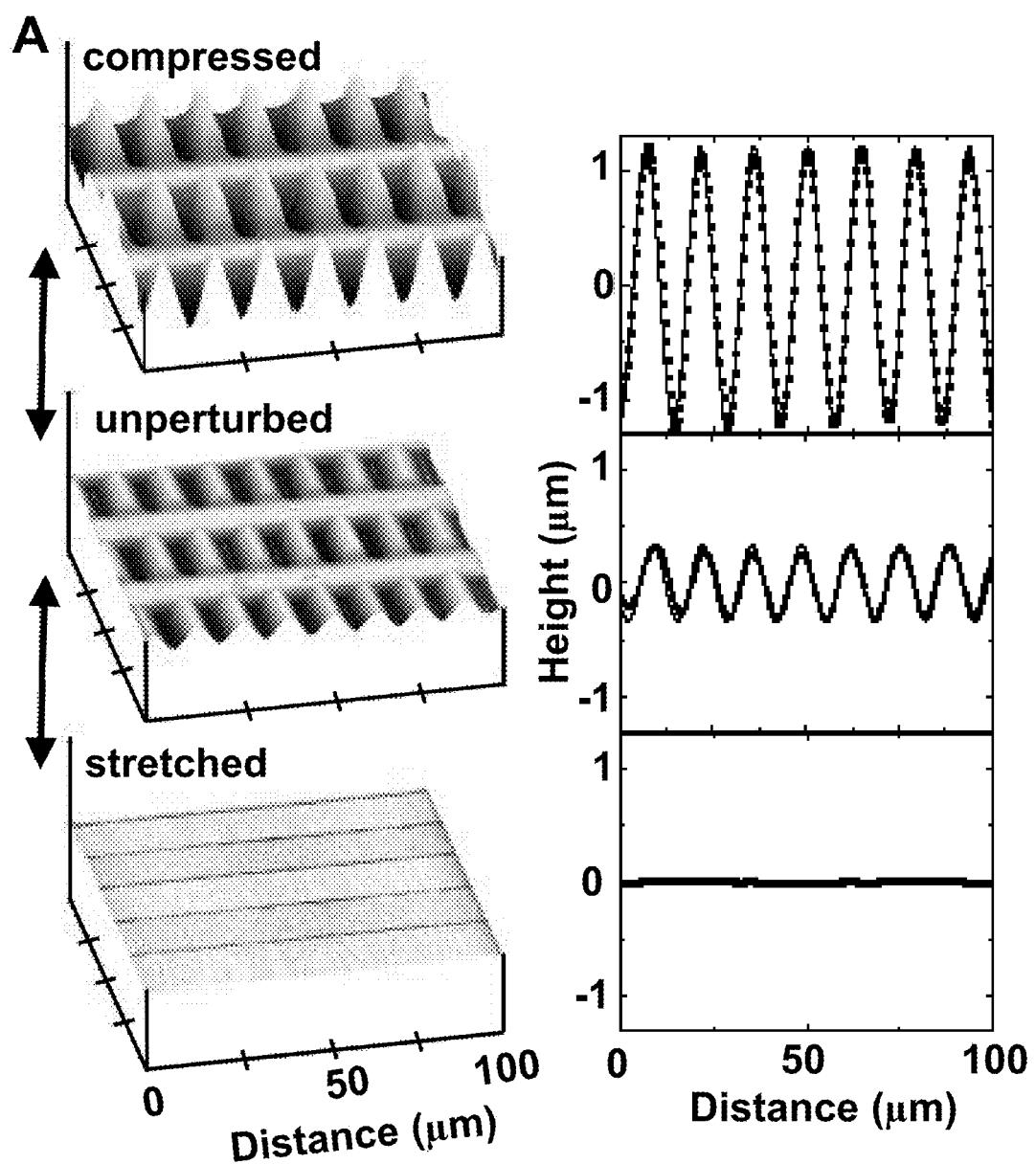
FIG. 14: (A) Atomic force micrographs (AFM; left frames) and relief profiles (right frames; the lines are the sinusoidal fit to experimental data) of wavy single crystal silicon ribbons (width=20 µm; thickness=100 nm) on PDMS substrates. The top, middle, and bottom parts correspond to configurations when the PDMS is strained, along the ribbon lengths, by −7% (compression), 0% (unperturbed) and 4.7% (stretching), respectively. (B) Average amplitudes (black) and changes in wavelength (red) of wavy silicon ribbons as a function of strain applied to the PDMS substrate (top frame). For the wavelength measurements, different substrates are used for tension (circles) and compression (squares). Peak silicon strains as a function of applied strain (bottom frame). The lines in these graphs represent calculations, without any free fitting parameters.
Figure 14:
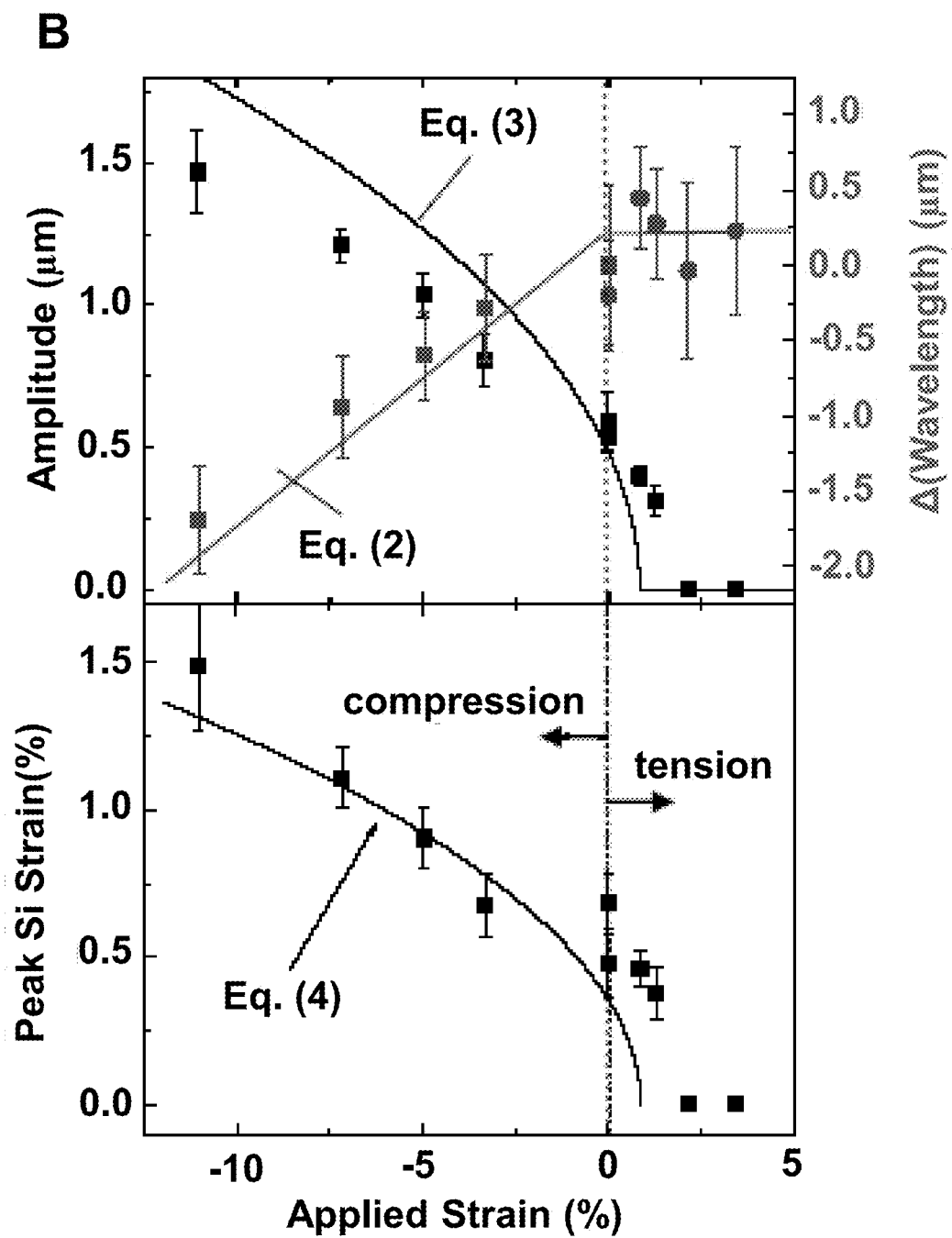
Figure 15:
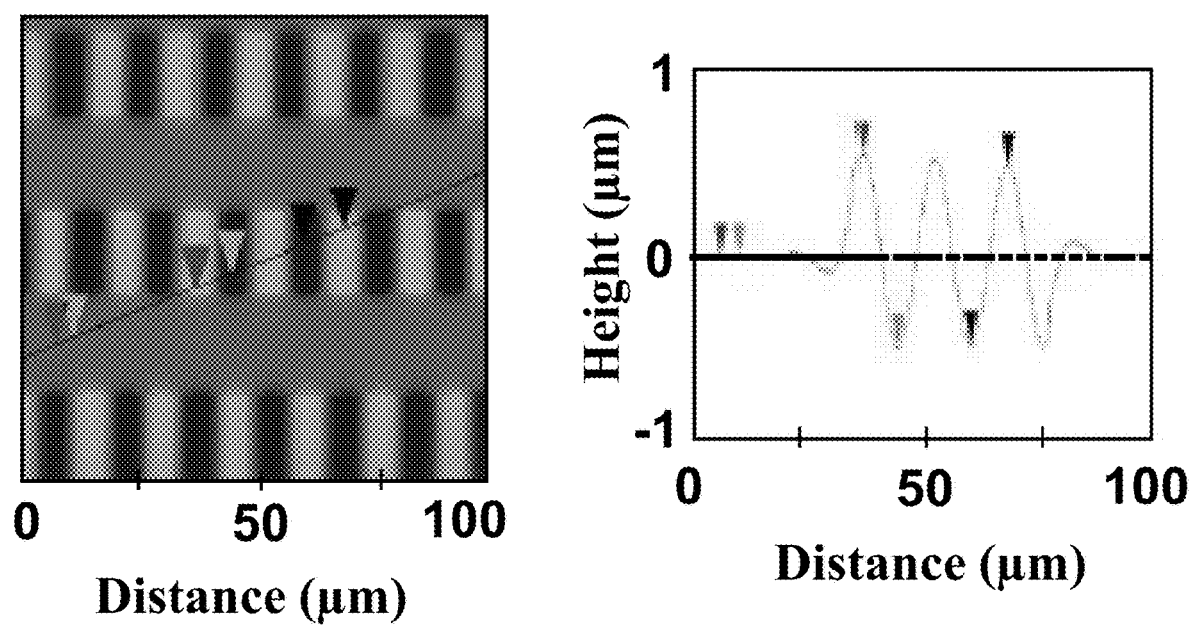
FIG. 15: Top view AFM image of wavy silicon ribbons on PDMS, and line cut evaluated at an angle relative to the long dimension of the ribbons.

The dynamic response of the wavy structures to compressive and tensile strains applied to the elastomeric substrate after fabrication is of primary importance for stretchable electronic devices. To reveal the mechanics of this process, we measure the geometries of wavy Si ribbons by AFM as force is applied to the PDMS to compress or stretch it parallel to the long dimension of the ribbons. This force creates strains both along the ribbons and perpendicular to them, due to the Poisson effect. The perpendicular strains lead primarily to deformations of the PDMS in the regions between the ribbons. The strains along the ribbons, on the other hand, are accommodated by changes in the structure of the waves. The three-dimensional height images and surface profiles in FIG. 14A present representative compressed, unperturbed and stretched states (collected from slightly different locations on the sample). In these and other cases, the ribbons maintain their sinusoidal (lines in the right hand frames of FIG. 14A) shapes during deformation, in which approximately half of the wave structure lies beneath the unperturbed position of the PDMS surface as defined by the regions between the ribbons (FIG. 15). FIG. 14B shows the wavelength and amplitude for compressive (negative) and tensile (positive) applied strains relative to the unperturbed state (zero). The data correspond to averaged AFM measurements collected from a large number (>50) of ribbons per point. The applied strains are determined from the measured end-to-end dimensional changes of the PDMS substrate. Direct surface measurements by AFM as well as contour integrals evaluated from the sinusoidal wave shapes show that the applied strains are equal to the ribbons strains (FIG. 16) for the cases examined here. (The small amplitude (<5 nm) waves that persist at tensile strains larger than the prestrain minus the critical strain might result from slight slippage of the Si during the initial buckling process. The computed peak silicon strains and ribbon strains in this small (or zero) amplitude regime underestimate the actual values.) Interestingly, the results indicate two physically different responses of the wavy ribbons to applied strain. In tension, the waves evolve in a non-intuitive way: the wavelength does not change appreciably with applied strain, consistent with post-buckling mechanics. Instead, changes in amplitude accommodate the strain. In this regime, the silicon strain decreases as the PDMS is stretched; it reaches ~0% when the applied strain equals the prestrain. By contrast, in compression, the wavelengths decrease and amplitudes increase with increasing applied strain. This mechanical response is similar to that of an accordion bellows, which is qualitatively different than the behavior in tension. During compression, the silicon strain increases with the applied strain, due to the decreasing radii of curvature at the wave peaks and troughs. The rates of increase and magnitudes of the silicon strains are, however, both much lower than the ribbon strains, as shown in FIG. 14B. This mechanics enables stretchability.

The full response in regimes of strain consistent with the wavy geometries can be quantitatively described by equations that give the dependence of the wavelength λ on its value in the initial buckled state, $\lambda_0$, and the applied strain $\varepsilon_{applied}$ according to:

$$\lambda = \begin{cases} \lambda_0 & \text{for tension} \\ \lambda_0(1 + \varepsilon_{applied}) & \text{for compression} \end{cases}, \quad (2)$$

This tension/compression asymmetry can arise, for example, from slight, reversible separations between the PDMS and the raised regions of Si, formed during compression. For this case, as well as for systems that do not exhibit this asymmetric behavior, the wave amplitude A, for both tension and compression, is given by a single expression, valid for modest strains (<10-15%):

$$A = \sqrt{A_0^2 - h^2 \frac{\varepsilon_{applied}}{\varepsilon_c}} = h\sqrt{\frac{\varepsilon_{pre} - \varepsilon_{applied}}{\varepsilon_c} - 1}, \quad (3)$$

where $A_0$ is the value corresponding to the initial buckled state. These expressions yield quantitative agreement with the experiments without any parameter fitting, as shown in FIG. 14A. When the waviness, which accommodates the tensile/compressive strains, remains, the peak silicon strain is dominated by the bending term and is given by (33)

$$\varepsilon_{Si}^{peak} = 2\varepsilon_c \sqrt{\frac{\varepsilon_{pre} - \varepsilon_{applied}}{\varepsilon_c} - 1}, \quad (4)$$

which agrees well with the strain measured from curvature, in FIG. 14B. (See also FIG. 18). Such an analytic expression is useful to define the range of applied strain that the system can sustain without fracturing the silicon. For a prestrain of 0.9%, this range is −27% to 2.9%, if we assume that the silicon failure strain is ~2% (for either compression or tension). Controlling the level of prestrain allows this range of strains (i.e. nearly 30%) to balance desired degrees of compressive and tensile deformability. For example, a prestrain of 3.5% (the maximum that we examined) yields a range of −24% to 5.5%. We note that such calculations assume that the applied strain equals the ribbons strain, even at extreme levels of deformation. Experimentally, we find that these estimates are often exceeded due to the ability of the PDMS beyond the ends of the ribbons and between the ribbons to accommodate strains so that the applied strain is not completely transferred to the ribbons.

Figure 17:
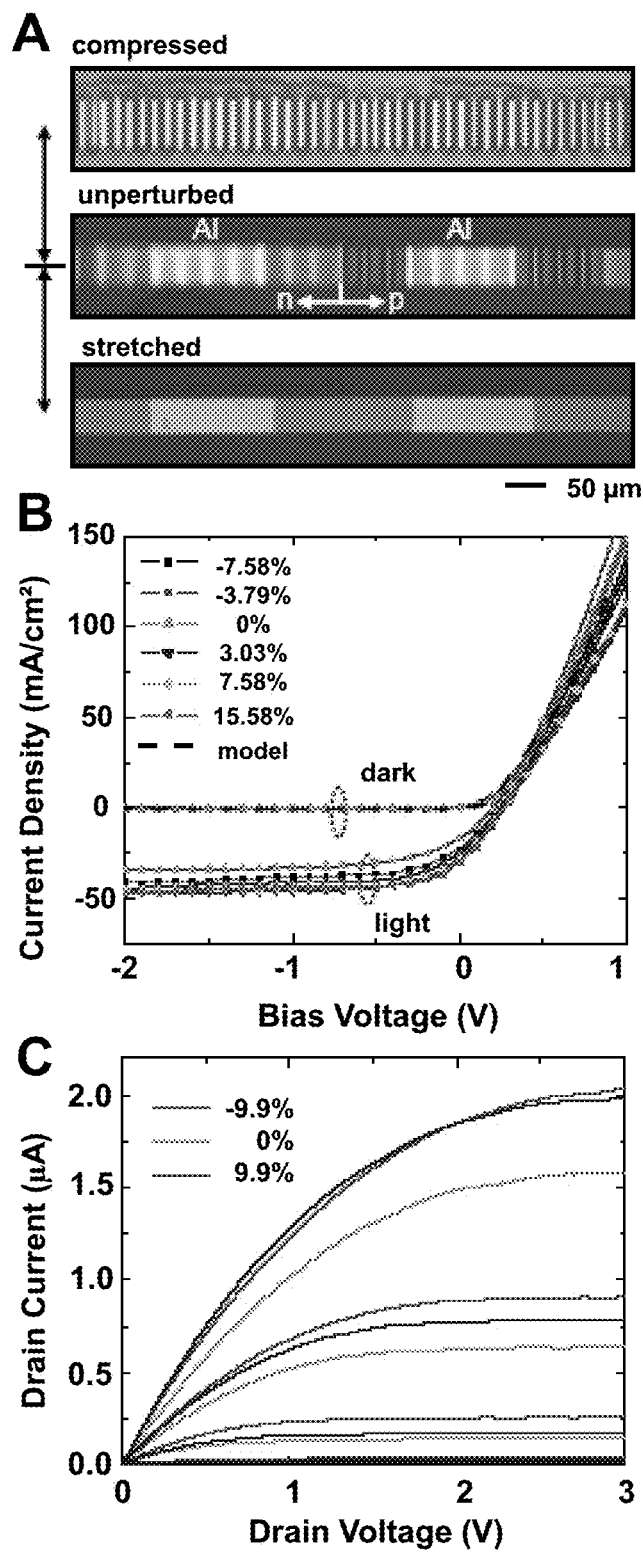
FIG. 17: (A) Optical images of a stretchable single crystal silicon pn diode on a PDMS substrate at −11% (top), 0% (middle) and 11% (bottom) applied strains. The aluminum regions correspond to thin (20 nm) Al electrodes; the pink and green regions correspond to n (boron) and p (phosphorous) doped areas of the silicon. (B) Current density as a function of bias voltage for stretchable silicon pn diodes, measured at various levels of applied strain. The curves labeled 'light' and 'dark' correspond to devices exposed to or shielded from ambient light, respectively. The solid curves show modeling results. (C) Current-voltage characteristics of a stretchable Schottky barrier silicon MOSFET, measured at −9.9%, 0% and 9.9% applied strains (The gate voltage varies from 0V to −5V with a 1V step).
Figure 19:
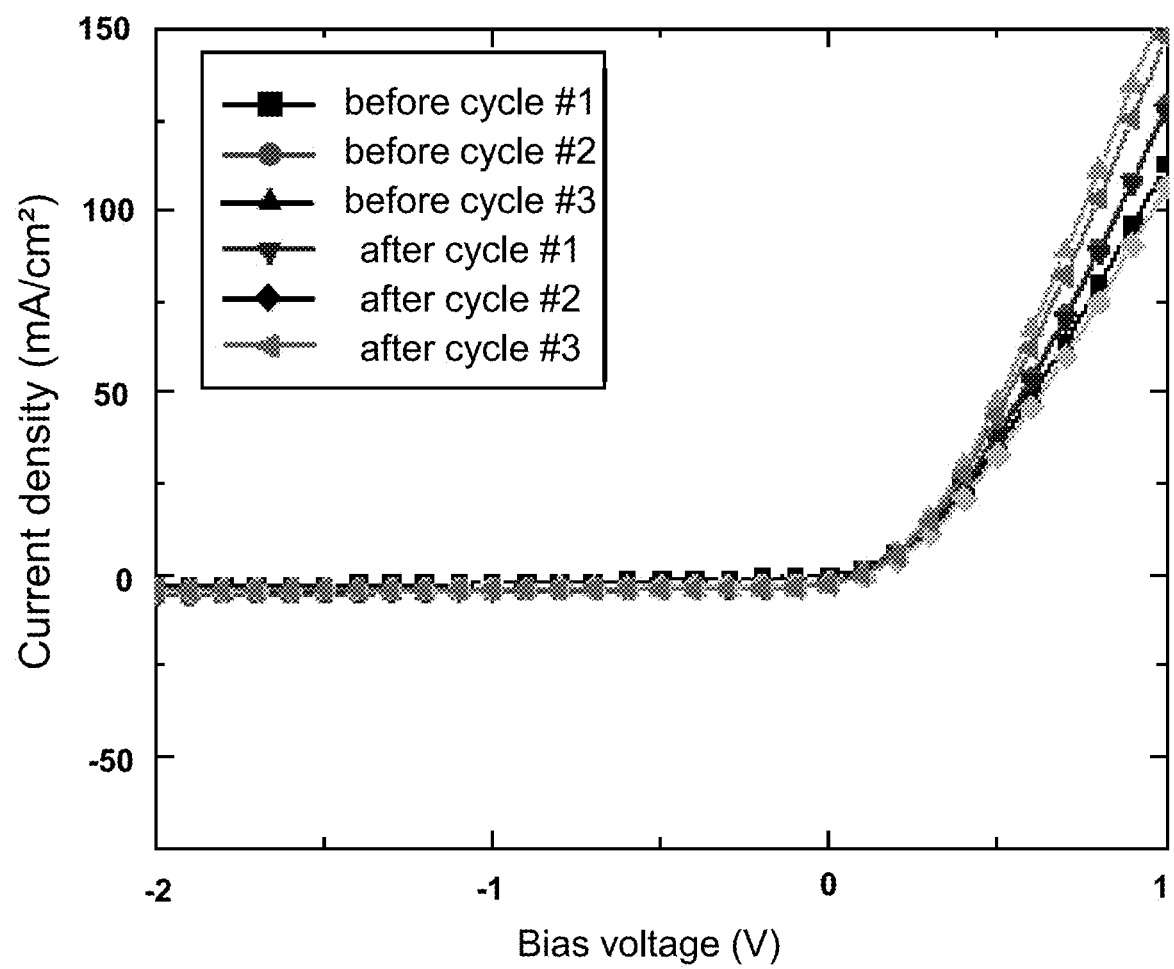
FIG. 19: Electrical measurements of wavy pn diodes, evaluated in three different devices before (before cycle) and after (after cycle) ~100 cycles of compressing (to ~5% applied strain), stretching (to ~15% applied strain) and releasing for three different devices (#1, #2 and #3). The data indicate no systematic changes in device properties. The level of observed variation is comparable to that associated with repeated probing of a single device without changing the applied strain, and is likely due to slight differences in probe contacts.
Figure 20:
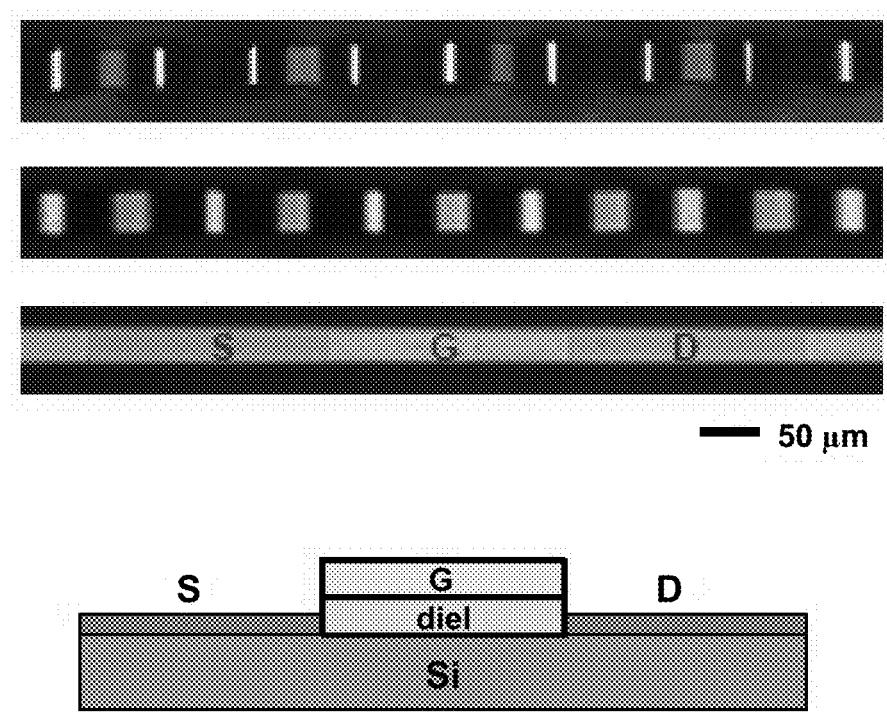
FIG. 20: Optical images (top frames) of a wavy silicon Schottky barrier MOSFET in its unperturbed state (middle) and in compression (top) and tension (bottom). Schematic illustration (bottom frame) of the device.
Figure 21:
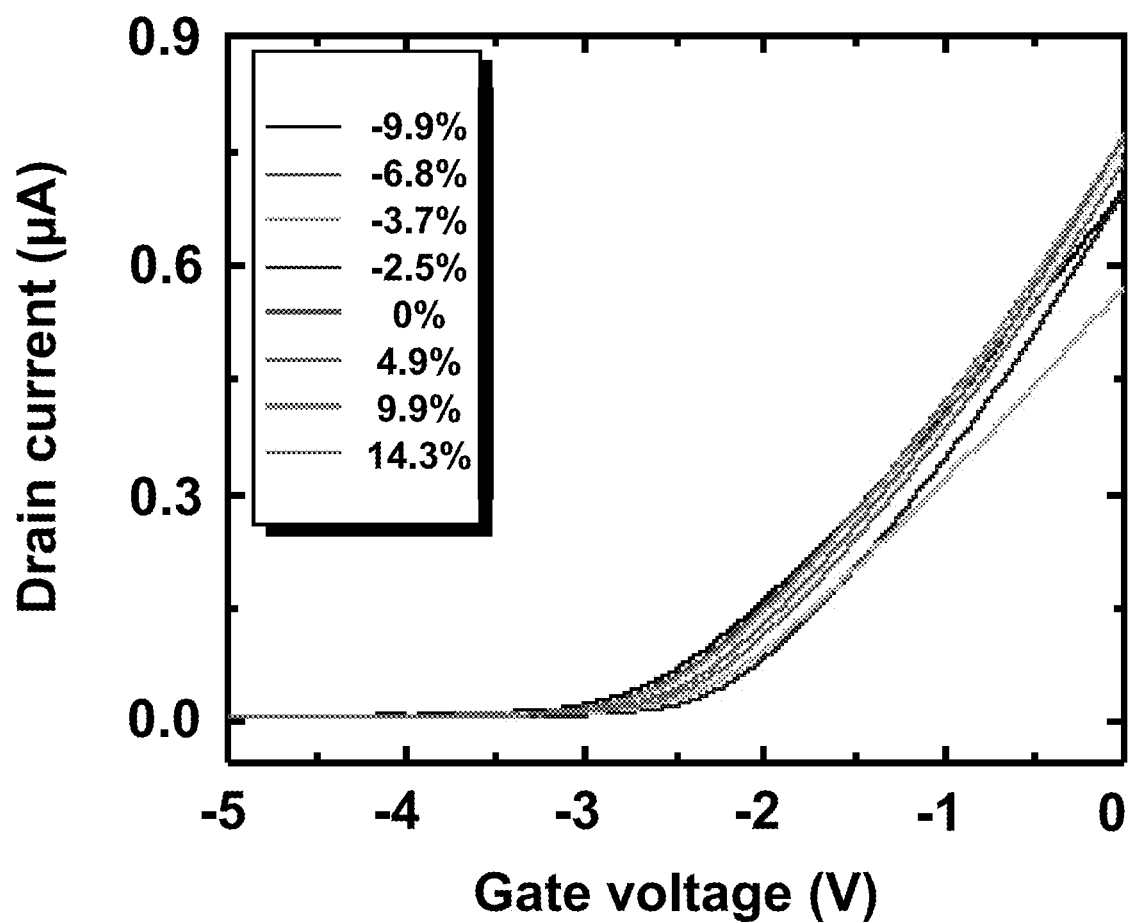
FIG. 21: Transfer curves measured in a 'wavy' silicon Schottky barrier MOSFET at different applied strains.

We have created functional, stretchable devices by including at the beginning of the fabrication sequence (FIG. 10, top frame) additional steps to define patterns of dopants in the silicon, thin metal contacts and dielectric layers using conventional processing techniques. Two and three terminal devices, diodes and transistors respectively, fabricated in this manner provide basic building blocks for circuits with advanced functionality. A dual transfer process in which the integrated ribbon devices are first lifted off of the SOI onto an undeformed PDMS slab, and then to a prestrained PDMS substrate created wavy devices with metal contacts exposed for probing. FIGS. 17A and 17B show optical images and electrical responses of a stretchable pn-junction diode for various levels of strain applied to the PDMS. We observe no systematic variation in the electrical properties of the devices with stretching or compressing, to within the scatter of the data. The deviation in the curves is due mainly to variations in the quality of probe contacts. These pn-junction diodes can be used as a photodetector (at reverse-biased state) or as photovoltaic devices, in addition to normal rectifying devices. The photocurrent density is ~35 mA/cm$^2$ at a reverse bias voltage of ~−1V. At forward bias, the short-circuit current density and open-circuit voltage are ~17 mA/cm$^2$ and 0.2V, respectively, which yields a fill factor of 0.3. The shape of the response is consistent with modeling (solid curves in FIG. 17B). The device properties do not change significantly, even after ~100 cycles of compressing, stretching and releasing (FIG. 19). FIG. 17C shows current-voltage characteristics of a stretchable, wavy silicon Schottky barrier metal oxide semiconductor field effect transistor (MOSFET) formed with procedures similar to those used for the pn diode, and with an integrated thin layer (40 nm) of thermal SiO$_2$ as a gate dielectric (33). The device parameters extracted from electrical measurements of this wavy transistor—linear regime mobility ~100 cm$^2$/Vs (likely contact limited), threshold voltage ~−3 V—are comparable those of devices formed on the SOI wafers using the same processing conditions. (FIGS. 20 and 21). As with the pn diodes, these wavy transistors can be reversibly stretched and compressed to large levels of strain without damaging the devices or significantly altering the electrical properties. In both the diodes and the transistors, deformations in the PDMS beyond the ends of the devices lead to device (ribbon) strains that are smaller than the applied strains. The overall stretchability results from the combined effects of device stretchability and these types of PDMS deformations. At compressive strains larger than those examined here, the PDMS tended to bend in a manner that made probing difficult. At larger tensile strains, the ribbons either fractured, or slipped and remained intact, depending on the silicon thickness, the ribbon lengths and the strength of bonding between the silicon and PDMS.

These stretchable silicon MOSFETs and pn diodes represent only two of the many classes of 'wavy' electronic devices that can be formed. Completed circuit sheets or thin silicon plates can also be structured into uniaxial or biaxial stretchable wavy geometries. Besides the unique mechanical characteristics of wavy devices, the coupling of strain to electronic properties, which occurs in many semiconductors, provides opportunities to design device structures that exploit mechanically tunable, periodic variations in strain to achieve unusual electronic responses.

Materials and Methods

Sample Preparation:

The silicon-on-insulator (SOI) wafers consist of Si (thicknesses of 20, 50, 100, 205, 290 or 320 nm) on SiO$_2$ (thicknesses of 145 nm, 145 nm, 200 nm, 400 nm, 400 nm or 1 µm) on Si substrates (Soitec, Inc.). In one case, we use an SOI wafer of Si (thickness of ~2.5 µm) and SiO$_2$ (thickness of ~1.5 µm) on Si (Shin-Etsu). In all cases, the top Si layer has a resistivity between 5~20 Ωcm, doped with boron (p-type) or phosphorous (n-type). The top Si of these SOI wafers is patterned with photolithoresist (AZ 5214 photoresist, Karl Suss MJB-3 contact mask aligner) and reactive ion etched (RIE) to define the Si ribbons (5~50 µm wide, 15 mm long) (PlasmaTherm RIE, SF6 40 sccm, 50 mTorr, 100 W). The SiO$_2$ layer is removed by undercut etching in HF (49%); the etching time is mainly dependent on the width of the Si ribbons. The lateral etch rate is typically 2~3 µm/min. Slabs of poly(dimethylsiloxane) (PDMS) elastomer (Sylgard 184, Dow Corning) are prepared by mixing base and curing agent in a 10:1 weight ratio and curing at 70° C. for >2 hrs or at room temperature for >12 hrs.

These flat slabs of PDMS (thicknesses of 1~3 mm) are brought into conformal contact with the Si on the etched SOI wafer to generate the wavy structures. Any method that creates controlled expansion of the PDMS prior to this contact followed by contraction after removal from the wafer, can be used. We examine three different techniques. In the first, mechanical rolling of PDMS after contacting the SOI substrate created the prestrains. Although the wavy structures could be made in this manner, they tended to have non-uniform wave periods and amplitudes. In the second, heating the PDMS (coefficient of thermal expansion=$3.1*10^{-4}$ K$^{-1}$) to temperatures of between 30° C. and 180° C. before contact and then cooling it after removal from the SOI, generated wavy Si structures with excellent uniformity over large areas, in a highly reproducible fashion. With this method, we control the prestrain level in PDMS very accurately by changing the temperature (FIG. 12). The third method uses PDMS stretched with mechanical stages before contact with the SOI and then physically released after removal. Like the thermal approach, this method enabled good uniformity and reproducibility, but is more difficult to finely tune the pre-strain level, compared to the thermal method.

For the devices such as pn junction diodes and transistors, electron beam evaporated (Temescal BJD1800) and photolithographically patterned (through etching or liftoff) metal layers (Al, Cr, Au) serve as contacts and gate electrodes. Spin-on-dopants (SOD) (B-75X, Honeywell, USA for p-type; P509, Filmtronics, USA for n-type) are used to dope the silicon ribbons. The SOD materials are first spin-coated (4000 rpm, 20 s) onto pre-patterned SOI wafers. A silicon dioxide layer (300 nm) prepared by plasma-enhanced chemical vapor deposition (PECVD) (PlasmaTherm) is used as a mask for the SOD. After heating at 950° C. for 10 sec, both the SOD and masking layer on SOI wafer are etched away using 6:1 buffered oxide etchant (BOE). For the transistor devices, thermally grown (1100° C., 10~20 min. dry oxidation with high purity oxygen flow in furnace to thicknesses between 25 nm and 45 nm) silicon dioxide provide the gate dielectric. After completing all device processing steps on the SOI substrate, the Si ribbons (typically 50 µm wide, 15 mm long) with integrated device structures are covered by photoresist (AZ5214 or Shipley S1818) to protect the device layer during HF etching of the underlying SiO$_2$. After removing the photoresist layer by oxygen plasma, a flat PDMS (70° C., >4 hrs) slab without any prestrain is used to remove the ribbon devices from the SOI substrate, in a flat geometry. A slab of partially cured PDMS (>12 hrs at room temperature after mixing the base and curing agent) is then contacted to the Si ribbon devices on the fully cured PDMS slab. Completing the curing of the partially cured PDMS (by heating at 70° C.), followed by removal of this slab, transfer the devices from the first PDMS slab to this new PDMS substrate. The shrinkage associated with cooling down to room temperature creates a prestrain such that removal and release creates the wavy devices, with electrodes exposed for probing.

Measurements:

Atomic force microscopy (AFM) (DI-3100, Veeco) is used to measure the wave properties (wavelength, amplitude) precisely. From the acquired images, the sectional profiles along the wavy Si are measured and analyzed statistically. A home built stretching stage was used, together with the AFM and a semiconductor parameter analyzer (Agilent, 5155C) to measure the mechanical and electrical responses of wavy Si/PDMS. Raman measurements are performed with Jobin Yvon HR 800 spectrometric analyzer using the 632.8 nm light from a He—Ne laser. The Raman spectrum is measured at 1 μm intervals along the wavy Si, with a focus adjusted at each position along the lengths of the structures to maximize the signal. The measured spectrum is fitted by Lorentzian functions to locate the peak wavenumber. Due to the slight dependence of the peak wavenumbers on the focal position of the microscope, the Raman results only provide qualitative insights into the stress distributions.

Calculation of Contour Length, Ribbon Strain and Silicon Strain:

The experimental results show that, for the range of materials and geometries explored here, the shape of wavy Si can be accurately represented with simple sine functions, i.e., $y = A \sin(kx)$ ($k = 2\pi/\lambda$). The contour length is then calculated as $L = \int_0^\lambda \sqrt{1+y'^2} dx$. The ribbon strain of wavy Si is calculated using $$\varepsilon = \frac{|\lambda - L|}{\lambda}.$$

The peak silicon strains occur at peaks and troughs of the waves, and are calculated using $$\varepsilon_{Si}^{peak} = \frac{h}{2R_c},$$

where h is the Si thickness, and $R_c$ is the radius of curvature at peak or trough, which is given by $$R_c = \frac{1}{y''}\bigg|_{x=\pm[\frac{(2n-1)\pi}{2k}]}$$

where n is an integer and y" is the second derivative of y with respect to x. Using the sine function approximation to the actual shape, the silicon peak strain is given by $$\varepsilon_{Si}^{peak} = \frac{2\pi^2 A h}{\lambda^2}.$$

Figure 16:
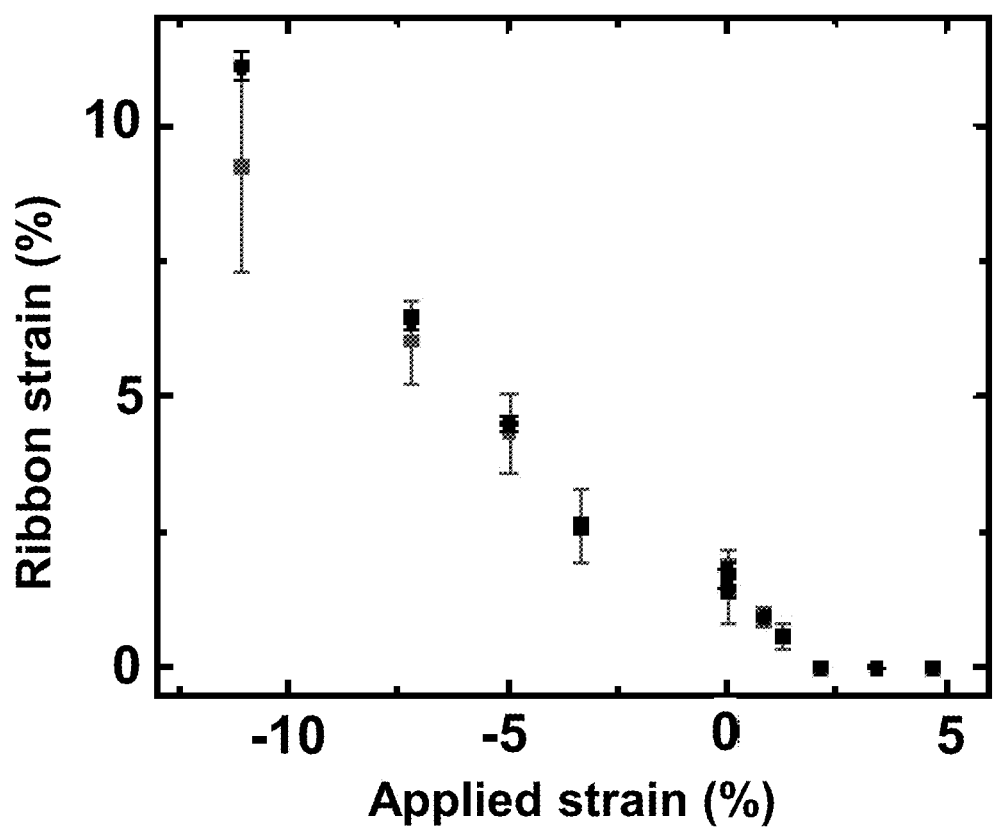
FIG. 16: Silicon ribbon strain as a function of applied strain. The red symbols correspond to strains computed by numerical integration of the contour length, using wavelengths and amplitudes extracted using equations that describe the buckling process. The black symbols correspond to strains measured from the ratio of surface to horizontal distance in AFM surface profile along the wavy Si ribbons.

FIG. 12 shows the wavelength as a function of temperature used to create the prestrain. As shown by FIG. 13, the peak strain is independent of Si thickness h due to the linear dependence of the wave amplitude and wavelength on thickness (A~h, λ~h). FIG. 15 shows that wavy structures involve nearly equal upward and downward displacements relative to the level of the PDMS surface between the ribbons. The silicon ribbon strain is equal to the applied strain for the systems examined here (FIG. 16).

An accordion bellows model: When the silicon can separate from the PDMS in compression, the system is governed by accordion bellows mechanics, rather than by buckling mechanics. In the bellows case, the wavelength for compressive applied strains ($\varepsilon_{applied}$) is $\lambda_0(1+\varepsilon_{applied})$ where λ is the wavelength in the unstrained configuration, as described by Eq. (2). Since the contour length of the silicon ribbon is approximately the same, prior to and after compressive strain, we can use the following relation to determine the wave amplitude A.

$$\int_0^{\lambda_0} \sqrt{1 + \left[\left(A_0 \sin\frac{2\pi}{\lambda_0}x\right)'\right]^2} dx = $$
$$\int_0^{\lambda_0(1+\varepsilon_{applied})} \sqrt{1 + \left[\left(A \sin\frac{2\pi}{\lambda_0(1+\varepsilon_{applied})}x\right)'\right]^2} dx$$

This equation has the asymptotic solution $$A = \sqrt{1+\varepsilon_{applied}} \sqrt{A_0^2 - h^2 \frac{\varepsilon_{applied}}{\varepsilon_c}} \text{ for } \frac{A_0}{\lambda_0} \ll 1.$$

At small compressive strain, this equation reduces to Eq. (3), which applies also to the case where separation of the Si from the PDMS is not possible and the system follows buckling mechanics. The peak silicon strain is given by $$\varepsilon_{Si}^{peak} = \frac{2\varepsilon_c}{(1+\varepsilon_{applied})^{3/2}} \sqrt{\frac{\varepsilon_{pre} - \varepsilon_{applied}}{\varepsilon_c} - 1}.$$

Figure 18:
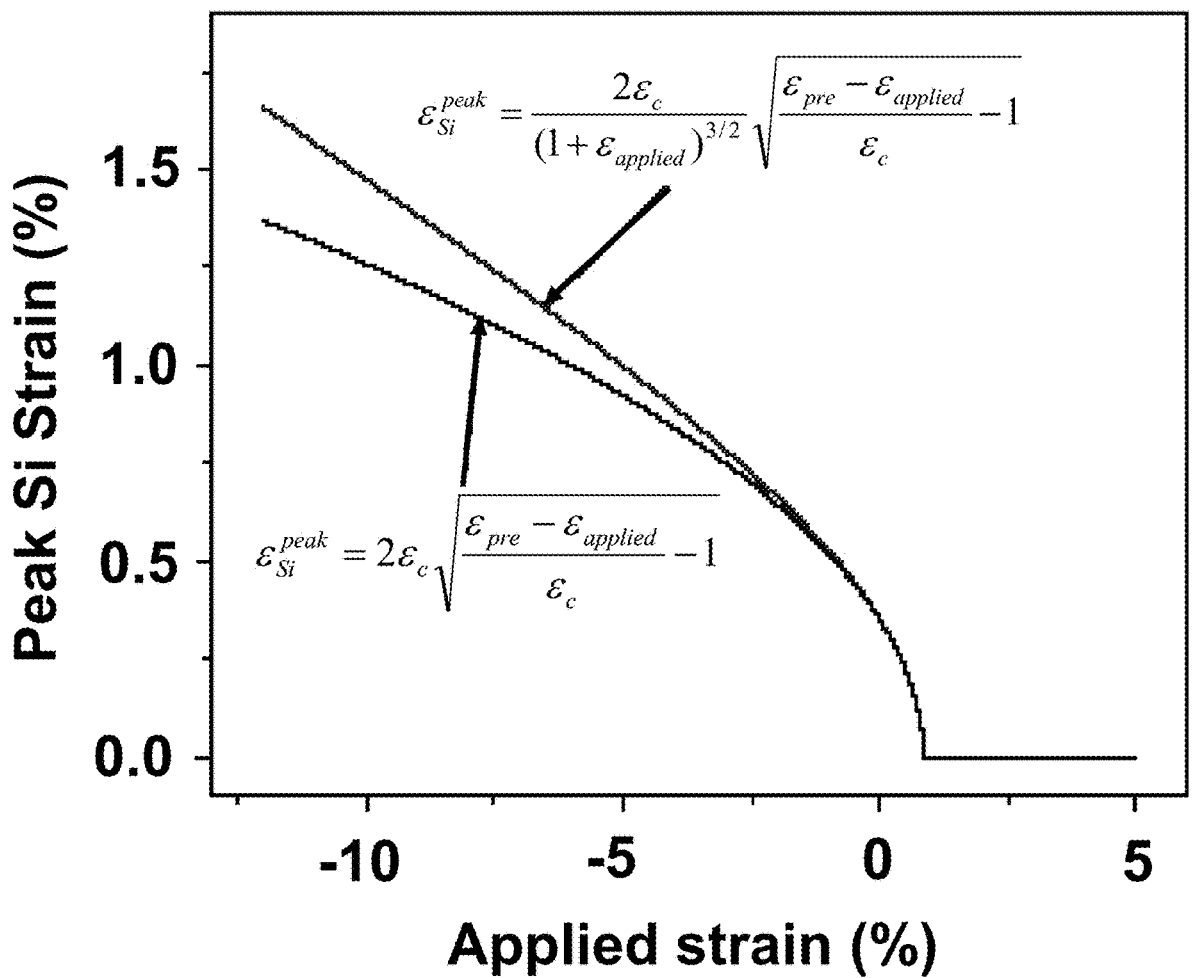
FIG. 18: Peak silicon strain as a function of applied strain. The blue line is based on an accordion bellows model, and the black is an approximation for small strain which is also consistent with buckling mechanics.

For modest compressive strains, this expression is approximately the same as Eq. (4). The peak silicon strains, like the wave amplitudes, have similar functional forms for both the bellows and the buckling models, in the limit of modest applied strains. FIG. 18 shows the peak strain computed according to the expression above, and according to Eq. (4).

Device Characterization:

A semiconductor parameter analyzer (Agilent, 5155C) and a conventional probing station are used for the electrical characterization of the wavy pn junction diodes and transistors. The light response of pn-diode is measured under an illumination intensity of ~1 W/cm², as measured by an optical power meter (Ophir Optronics, Inc., Laser Power Meter AN/2). We use mechanical stages to measure the devices during and after stretching and compressing. As a means to explore the reversibility of the process, we measure three different pn diodes before and after ~100 cycles of compressing (to ~5% strains), stretching (to ~15% strains) and releasing, in ambient light. FIG. 19 shows the results. FIGS. 20 and 21 show images, schematic illustrations and device measurements from the wavy transistors.

Example 2: Buckled and Wavy Ribbons of GaAs for High-Performance Electronics on Elastomeric Substrates Single crystalline GaAs ribbons with thicknesses in the submicron range and well-defined, 'wavy' and/or 'buckled' geometries are fabricated. The resulting structures, on the surface of or embedded in an elastomeric substrate, exhibit reversible stretchability and compressibility to strains >10%, more than ten times larger than that of GaAs itself. By integrating ohmic and Schottky contacts on these structured GaAs ribbons, high-performance stretchable electronic devices (e.g., metal-semiconductor field-effect transistors) can be achieved. This kind of electronic system can be used alone or in combination with similarly designed silicon, dielectric and/or metal materials to form circuits for applications that demand high frequency operation together with stretchability, extreme flexibility or ability to conform to surfaces with complex curvilinear shapes.

Performance capabilities in traditional microelectronics are measured mainly in terms of speed, power efficiency and level of integration. Progress in other, more recent forms of electronics, is driven instead by the ability to achieve integration on unconventional substrates (e.g., low-cost plastics, foils, paper) or to cover large-areas. For example, new forms of X-ray medical diagnosis are achievable with large-area imagers that conformally wrap around the body to digitally image desired tissues. Lightweight, wall-size displays or sensors that can be deployed onto a variety of surfaces and surface shapes provide new technologies for architectural design. Various materials including small organic molecules, polymers, amorphous silicon, polycrystalline silicon,]single crystalline silicon nanowires and microstructured ribbons have been explored to serve as semiconductor channels for the type of thin film electronics that might support these and other applications. These materials enable transistors with mobilities that span a wide range (i.e., from $10^{-5}$ to 500 $cm^2/V \cdot s$), and in mechanically bendable thin film formats on flexible substrates. Applications with demanding high speed operations, such as large-aperture interferometric synthetic aperture radar (InSAR) and radio frequency (RF) surveillance systems, require semiconductors with much higher mobilities, such as GaAs, or InP, etc. The fragility of single crystalline compound semiconductors creates a number of fabrication challenges that must be overcome in order to fabricate high-speed, flexible transistors with them. We establish a practical approach to build metal-semiconductor field-effect transistors (MESFETs) on plastic substrates by using printed GaAs wire arrays created from high-quality bulk wafers. These devices exhibit excellent mechanical flexibility and $f_T$'s that approach 2 GHz, even in moderately scaled devices (e.g. micron gate lengths). This example demonstrates GaAs ribbon based MESFETs (as opposed to wire devices) designed with special geometries that provide not only bendability, but mechanical stretchability to levels of strain (~10%) that significantly exceed the intrinsic yield points of the GaAs itself (~2%). The resulting type of stretchable high performance electronic systems can provide extremely high levels of bendability and the capacity to integrate conformally with curvilinear surfaces. This GaAs system example extends our described 'wavy' silicon in four important ways: (i) it demonstrates stretchability in GaAs, a material that is, in practical terms, much more mechanically fragile than Si, (ii) it introduces a new 'buckled' geometry that can be used for stretchability together with or independently of the previously described 'wavy' configuration, (iii) it achieves a new class of stretchable device (i.e. the MESFET), and (iv) it demonstrates stretching over a larger range and with greater symmetry in compression/tension than that achieved in silicon.

Figure 22:
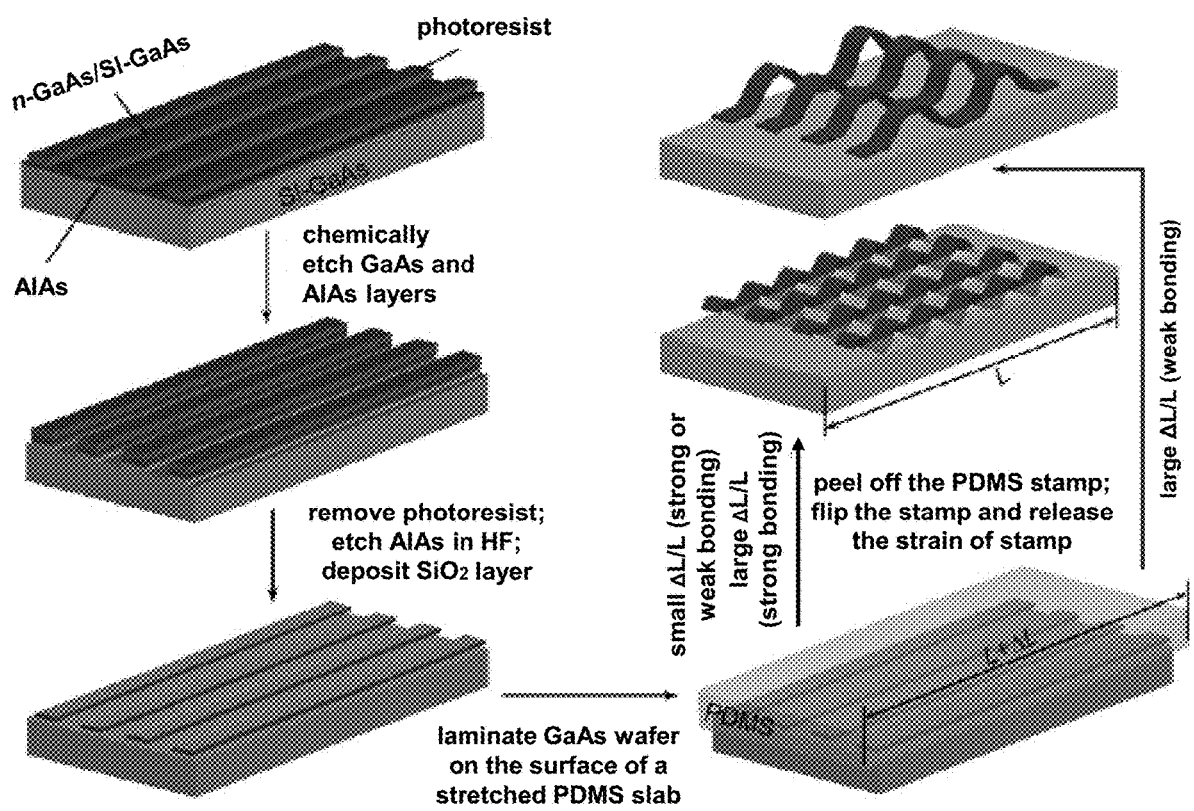
FIG. 22: Schematic illustration of steps for generating 'buckled' and 'wavy' GaAs ribbons on PDMS substrates. The left bottom frame shows the deposition of thin $SiO_2$ on the surfaces of the ribbons to promote strong bonding to the PDMS. This bonding leads to the formation of the wavy geometry shown in the right middle frame. Weak, van der Waals bonding (and moderate to high levels of prestrain) leads to the buckled geometry, as shown in the right top frame.

FIG. 22 illustrates steps for fabricating stretchable GaAs ribbons on an elastomeric substrate made of poly(dimethylsiloxane) (PDMS). The ribbons are generated from a high-quality bulk wafer of GaAs with multiple epitaxial layers. The wafer is prepared by growing a 200-nm thick AlAs layer on a (100) semi-insulating GaAs (SI-GaAs) wafer, followed by sequential deposition of a SI-GaAs layer with thickness of 150 nm and Si-doped n-type GaAs layer with thickness of 120 nm and carrier concentration of $4 \times 10^{17}$ $cm^{-3}$. A pattern of photoresist lines defined parallel to the (0 $\bar{1}$ $\bar{1}$) crystalline orientation serves as masks for chemical etching of the epilayers (including both GaAs and AlAs). Anisotropic etching with an aqueous etchant of $H_3PO_4$ and $H_2O_2$ isolated these top layers into individual bars with lengths and orientations defined by the photoresist, and with side walls that form acute angles relative to the wafer surface. Removing the photoresist after the anisotropic etching and then soaking the wafer in an ethanol solution of HF (2:1 in volume between ethanol and 49% aqueous HF) removes the AlAs layer and released ribbons of GaAs (n-GaAs/SI-GaAs). The use of ethanol, instead of water, for this step reduces cracking that can occur in the fragile ribbons due to the action of capillary forces during drying. The lower surface tension of ethanol compared to water also minimizes drying-induced disorder in the spatial layout of the GaAs ribbons. In the next step, the wafer with released GaAs ribbons is contacted to the surface of a prestretched flat slab of PDMS, with the ribbons aligned along the direction of stretching. In this case, van der Waals forces dominate the interaction between the PDMS and the GaAs. For cases that require stronger interaction strength, we deposit a thin layer of $SiO_2$ onto the GaAs, and expose the PDMS to ultraviolet induced ozone (i.e., product of oxygen in air) immediately prior to contact. The ozone creates —Si—OH groups on the surface of PDMS, which react with the surface of the $SiO_2$ upon contact to form bridging siloxane –Si—O—Si— bonds. The deposited $SiO_2$ is discontinuous at the edges of each ribbon because of the geometry of their sidewalls. For both the weak and strong bonding procedures, peeling the PDMS from the mother wafer transfers all the ribbons to the surface of the PDMS. Relaxing the prestrain in the PDMS led to the spontaneous formation of large scale buckles and/or sinusoidal wavy structures along the ribbons. The geometry of the ribbons depends strongly on the prestrain (defined by $\Delta L/L$) applied to the stamp, the interaction between the PDMS and ribbons, and the flexural rigidity of the ribbons. For the ribbons investigated here, small prestrains (<2%) create highly sinusoidal 'waves' with relatively small wavelengths and amplitudes (FIG. 22 right, middle frame), for both the strong and weak interaction cases. These geometries in GaAs are similar to those reported for Si. Higher prestrains (e.g., up to ~15%) can be applied to create similar type of waves where there is a strong bonding interaction between the ribbons and the substrate. A different type of geometry, comprising of aperiodic 'buckles' with relatively large amplitudes and widths, formed in the case of weak interaction strengths and large prestrains (FIG. 22 right, top frame). In addition, our results show that both kinds of structures—buckles and waves—can coexist in a single ribbon whose flexural rigidity varies along its length (due, for example, to thickness variations associated with device structures).

Figure 23:
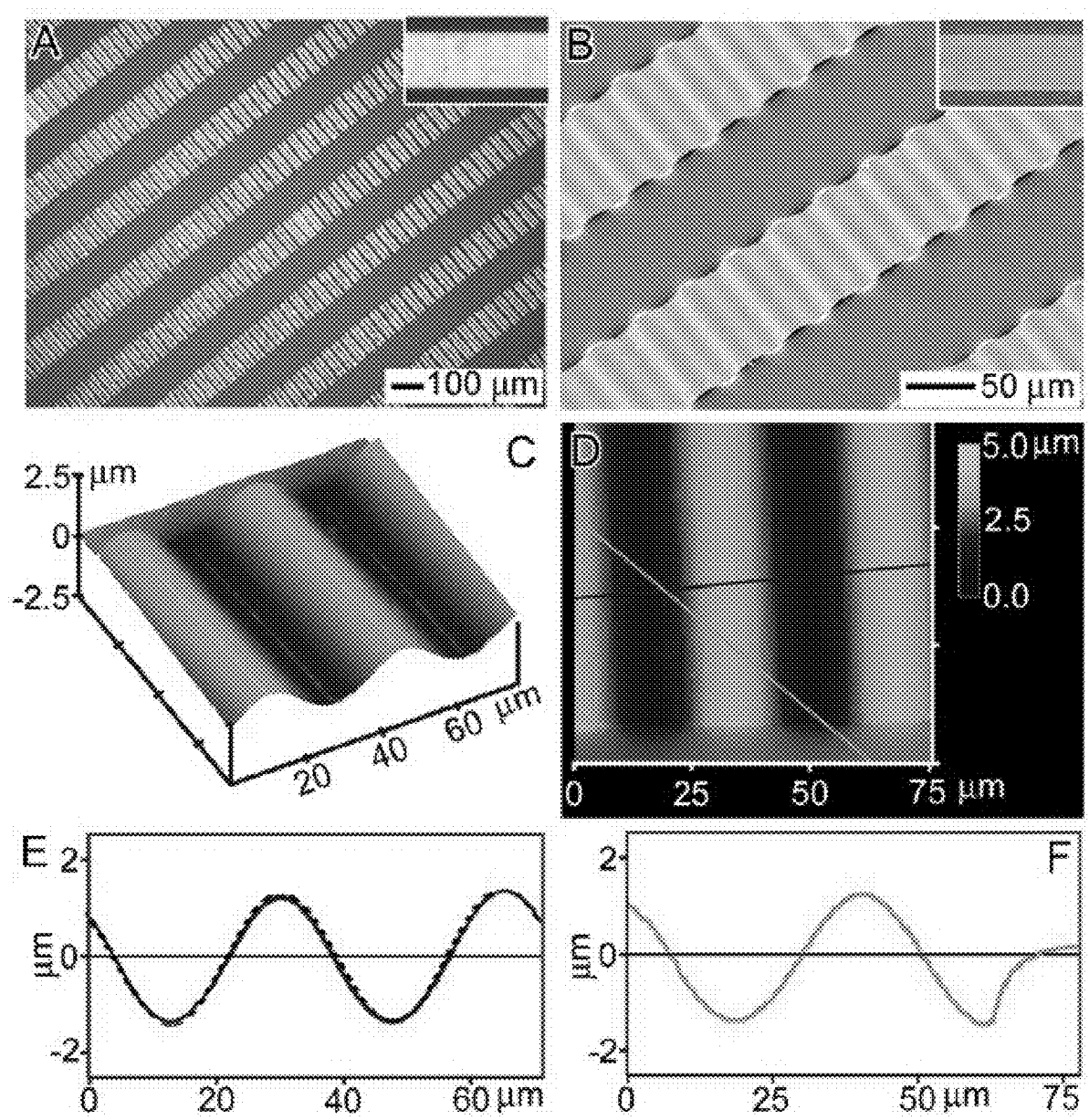
FIG. 23: Images of wavy GaAs ribbons on a PDMS substrate, as formed with a prestrain of ~1.9% generated through thermal expansion. Optical (A), SEM (B), three-dimensional AFM (C) and top-view AFM (D) images of the same sample. The SEM image is obtained by tilting the sample stage at the angle of 45° between sample surface and detection direction. (Spots on the ribbons might be residues from the sacrificial AlAs layers.) (E, F) Surface height profiles plotted along the lines in blue and green as shown in (D), respectively.

FIG. 23 shows several micrographs of wavy GaAs ribbons with thickness of 270 nm (including both n-GaAs and SI-GaAs layers) and widths of 100 μm (all of the ribbons discussed in this example have widths of 100 μm) formed with strong bonding between PDMS (thickness of ~5 mm) and ribbons. The fabrication followed the procedures for strong bonding, using 2-nm Ti and 28-nm $SiO_2$ layers on the GaAs. A biaxial prestrain of ~1.9% (calculated from the thermal response of PDMS) is created in the PDMS by thermal expansion (heating to 90° C. in an oven) immediately prior to and during bonding. This heating also accelerates the formation of interfacial siloxane bonds. Cooling the PDMS to room temperature (~27° C.) after transferring the GaAs ribbons released the prestrain. Frames A, B and C of FIG. 23 show images collected with an optical microscope, scanning electron microscope (SEM) and atomic force microscope (AFM), respectively, from the same sample. The images show the formation of periodic, wavy structures in the GaAs ribbons. The waves are quantitatively analyzed by evaluating linecuts (FIGS. 23E and 23F) from AFM image (FIG. 23D). The contour parallel to the longitudinal direction of the ribbon clearly shows a periodic, wavy profile, consistent with a computed fit to a sine wave (dashed line of FIG. 23E). This result agrees with nonlinear analysis of the initial buckled geometry in a uniform, thin, high-modulus layer on a semi-infinite low-modulus support. The peak-to-peak amplitude and wavelength associated with this function are determined to be 2.56 and 35.0 µm, respectively. The strains computed from the ratio of the horizontal distances between the adjacent two peaks on the stamp (i.e., the wavelength) to their actual contour lengths between the peaks (i.e., the surface distances measured by AFM), which we refer to as ribbon strains, yield values (i.e., 1.3%) that are smaller than the prestrain in the PDMS. This difference might be attributed to low shear modulus of PDMS and island effects related to the length of GaAs ribbons being shorter than the length of PDMS substrate. The surface strain of GaAs ribbons at peaks and troughs, which we refer to as maximum GaAs strains, is estimated from the ribbon thicknesses and radii of curvature at the peaks or troughs of the waves according to $\kappa h/2$, where $\kappa$ is the curvature. In this evaluation, the direct contribution of strains in the PDMS stamp to the GaAs are ignored because the PDMS can be treated as a semi-infinite support whose modulus is low compared to that of GaAs (Young's Modulus of GaAs: 85.5 GPa versus that of PDMS: 2 MPa). For the data of FIG. 23E, the maximum GaAs strains are ~0.62%, which is more than a factor of two smaller than the ribbon strain (i.e., 1.3%). This mechanical advantage provides stretchability in the GaAs ribbons, with physics similar to that found for wavy Si.

As shown in FIG. 23F, the peak and trough regions of the ribbons are higher and lower than the contour level (right portion of the green curve) of the surface of pristine PDMS (i.e., the areas without ribbons), respectively. The result suggests that the PDMS under the GaAs adopts a wavy profile as a result of the upward and downward forces imparted to the PDMS by the GaAs ribbons in the peaks and troughs, respectively. The precise geometry of the PDMS near the peaks of the waves is difficult to evaluate directly. We suspect that in addition to the upward deformation there is also a lateral necking caused by the Poisson effect. The wavy ribbons on the PDMS stamp can be stretched and compressed by applying strains to the PDMS (so-called applied strain denoted as positive for stretching and negative for compression, respectively). The insets of FIGS. 23A and 23B show images of the ribbons that deformed to their original, flat geometry when a relatively small stretching strain (i.e., ~1.5%) was applied. Further stretching transfers more tensile strain to the flat GaAs ribbons, resulting in their breakage of ribbons when this excess strain reaches the failure strain of GaAs. Compressive strains applied to the substrate reduce the wavelengths and increase the amplitudes of the wavy ribbons. Failure in compression occurs when the bending strains at peaks (and troughs) exceed the failure strains. This variation of wavelength with strain is consistent with previous observations in silicon, and is different than the predictions of wavelength invariance derived from ideal models.

Figure 24:
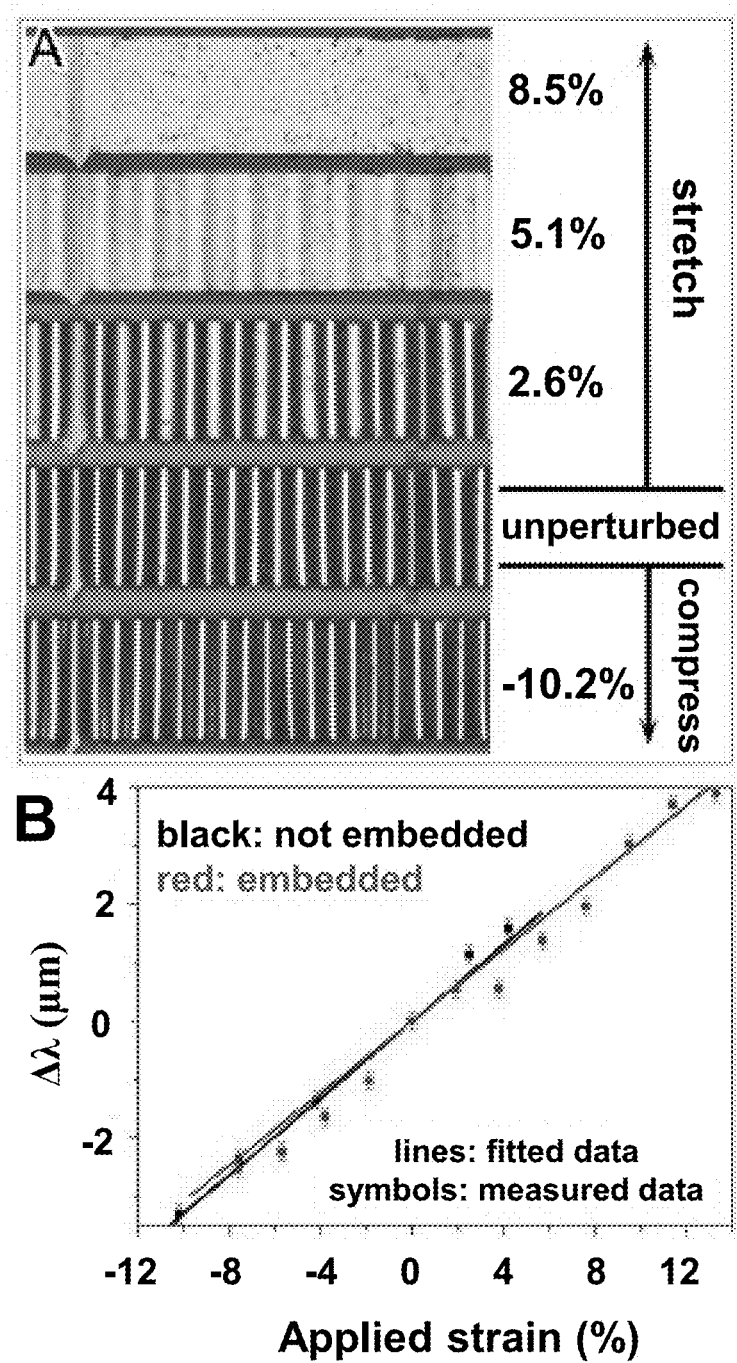
FIG. 24: (A) Optical micrographs of wavy GaAs ribbons formed with a prestrain of 7.8%, strongly bonded to the PDMS, collected at different applied strains. The blue bars on the left and right highlight certain peaks in the structure; the variation in the distance between these bars indicate the dependence of the wavelength on applied strain. (B) Change in wavelength as a function of applied strain for the wavy GaAs ribbons shown in (A), plotted in black; similar data for a system of sample (A) after embedding in PDMS, plotted in red.

The stretchability of wavy GaAs ribbons can be improved by increasing the prestrain applied to PDMS through the use of a mechanical stage (as opposed to thermal expansion). For example, transferring GaAs ribbons with $SiO_2$ layers onto the surface of a PDMS stamp with prestrain of 7.8% generated wavy ribbons without any observable cracking in the GaAs (FIG. 24A). The bending strains at the peaks in this case are estimated to be ~1.2%, which is lower than the failure strain (i.e., ~2%) of GaAs. Similar to the low prestrain case, the wavy ribbons behave like an accordion when the system is stretched and compressed: the wavelengths and amplitudes change to accommodate the applied strain. As shown in FIG. 24A, the wavelengths increase with tensile strain until the ribbons become flat and decrease with compressive strain until the ribbons break. These deformations are completely reversible, and do not involve any measurable slipping of the GaAs on the PDMS. The wavelength changes linearly with applied strains in both compression and tension (see, the black lines and symbols in FIG. 24B), in contrast to the mildly asymmetric behavior observed in Si ribbons with weak bonding and much lower prestrains.

In practical applications, it might be useful to encapsulate the GaAs ribbons and devices in a way that maintains their stretchability. As a simple demonstration of one possibility, we cast and cured PDMS pre-polymers on samples such as the one shown in FIG. 24A to embed the ribbons in PDMS. The embedded systems exhibit similar mechanical behavior to the unembedded ones, i.e., stretching the system increases wavelength and compressing the system decreases wavelength (the red lines and symbols in FIG. 24B). Shrinkage due to curing the second layer of PDMS generated some moderate amount of additional strain (~1%). This strain resulted in a slight decrease in the wavelength of the wavy ribbons, thereby expanding slightly the range of stretchability. FIG. 24B shows the difference. Overall, the systems generated with prestrain of ~7.8% can be stretched or compressed to strains of up to ~10% without inducing any observable breakage in the GaAs.

Figure 25:
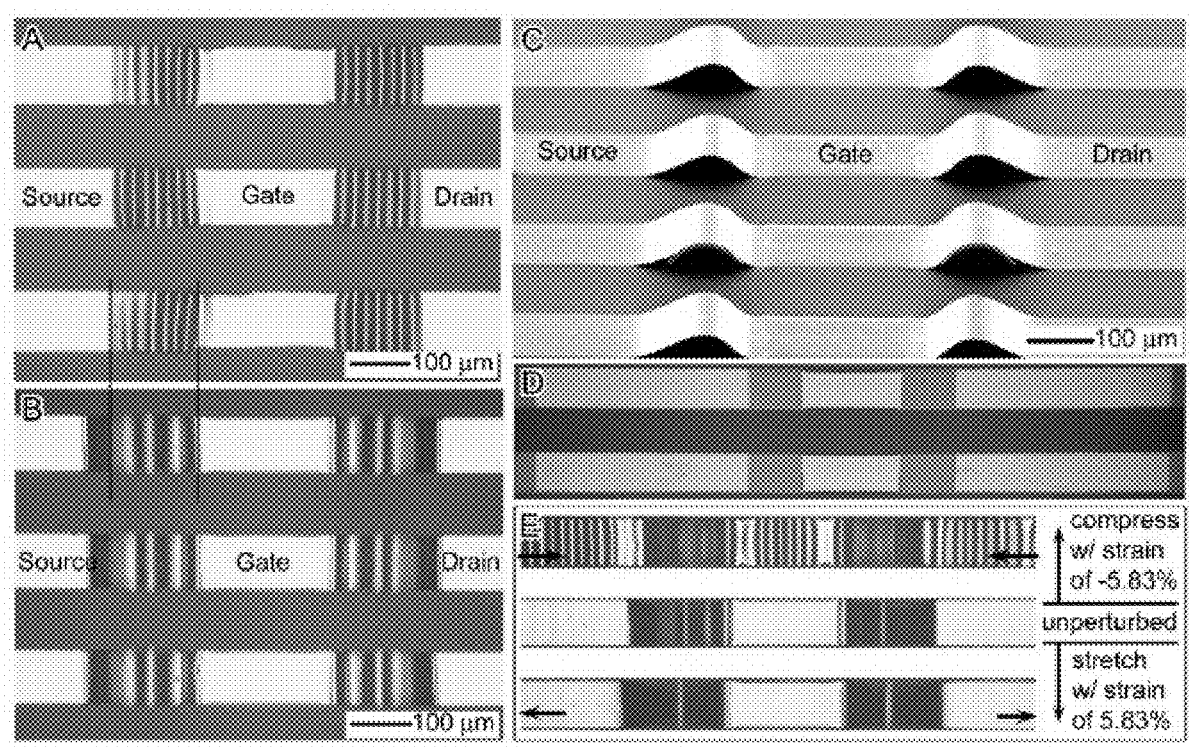
FIG. 25: Images of GaAs ribbons integrated with ohmic (source and drain) and Schottky (gate) contacts to form complete MESFETs. (A) Optical micrographs of wavy ribbons formed using a prestrain of 1.9% and strong bonding to the PDMS, showing the formation of periodic waves only in the sections without electrodes (grey). (B) Optical and (C) SEM images of buckled ribbons formed with a prestrain of ~7% and weak bonding to the PDMS. (D) Optical image of two buckled devices shown in (B) after they were stretched to be flat. (E) A set of optical images of an individual ribbon device shown in (B) with different external applied strains (i.e., compressing strain of 5.83%, no applied strain, and stretching strain of 5.83% from top to bottom) after it was embedded in PDMS.

The wavy GaAs ribbons on PDMS substrates can be used to fabricate high-performance electronic devices, such as MESFETs, the electrodes of which are formed through metallization and processing on the wafer, before transfer to PDMS. These metal layers change the flexural rigidity of the ribbons in a spatially dependent manner. FIG. 25A shows GaAs ribbons integrated with ohmic stripes (source and drain electrodes) and Schottky contacts (gate electrodes) after transfer to a PDMS substrate with prestrain of ~1.9%. The ohmic contacts consisted of metal stacks including AuGe (70 nm)/Ni (10 nm)/Au (70 nm) formed on the original wafers through lithographically defined masks along with sequential annealing of the wafers at elevated temperature (i.e., 450° C. for 1 min) in a quartz tube with flowing $N_2$. These ohmic segments have lengths of 500 µm. The distances between two adjacent ohmic contacts are 500 µm (i.e., channel length). Schottky contacts with lengths of 240 µm (i.e., gate length) are generated by directly depositing 75-nm Cr layer and 75-nm Au layer through electron-beam evaporation against the photolithographically designed mask. The electrodes have widths equal to the GaAs ribbons, i.e., 100 µm; their relatively large sizes facilitate probing. The dimensions of electrodes and semiconductor channels can be significantly decreased to achieve enhanced device performance. As shown in FIG. 25A, these stretchable GaAs MESFETS exhibit, shortrange, periodic waves only in the regions without electrodes. The absence of waves in the thicker regions might be attributed to their enhanced flexural rigidity due mainly to the additional thickness associated with the metals. Periodic waves can be initiated in the thicker regions by using prestrains larger than ~3%. In these cases, however, the ribbons tend to break at the edges of the metal electrodes due to critical flaws and/or high peak strains near these edges. This failure mode limits the stretchability.

To circumvent this limitation, we reduced the strength of interaction between the MESFETs and the PDMS by eliminating the siloxane bonding. For such samples, prestrain >3% generated large, aperiodic buckles with relatively large widths and amplitudes due to physical detachment of the ribbons from PDMS surface. FIG. 25B presents this type of system, as prepared with a prestrain of ~7%, in which the big buckles form in the thinner regions of the devices. The detachment seems to extend slightly to the thicker sections with ohmic stripes, as indicated by the vertical lines. The contrast variation along ribbons is attributed to reflections and refraction associated passage of light through the curved GaAs segments. The SEM image (FIG. 25C) clearly shows the formation of arc-shape buckles and flat, unperturbed PDMS. These buckles display asymmetric profiles (as indicated by the red curves) with tails to the sides with ohmic contacts. This asymmetry might be attributed to the unequal lengths (500 µm versus 240 µm) of ohmic stripes and Schottky contacts for individual transistors. This kind of buckled MESFET can be stretched to its original flat status (FIG. 25D) with applied stretching strains between ~6% and ~7%. However, compressing the system shown in FIG. 25B leads to continuous detachment of ribbons from PDMS surface to form larger buckles because of weak bonding. Embedding such devices in PDMS, according to the previously described procedures, eliminates this type of uncontrolled behavior. FIG. 25B shows such a system, in which the liquid PDMS precursor fills the gaps underneath the buckles. The fully surrounding PDMS confines the ribbons and prevents them from sliding and detaching. The embedded devices can be reversibly stretched and compressed to strains up to ~6% without breaking the ribbons. It is notable that when the embedded system was compressed by ~5.83% (top frame of FIG. 25E), periodic, small waves formed in the regions with metal electrodes as well as new ripples in the buckled regions. The formation of these new small waves, in combination with the large buckles, enhances the compressibility. Stretching the system forces the buckled regions to compress and stretch the PDMS in a manner that enables some flattening of these buckles, thereby elongating the projected lengths of the ribbons (bottom frame of FIG. 25E). These results suggest that embedded devices with big buckles, which is a geometry distinct from the waves, represent a promising method to achieve stretchability and compressibility that can be used in combination with or separately from the wavy approach.

Figure 26:
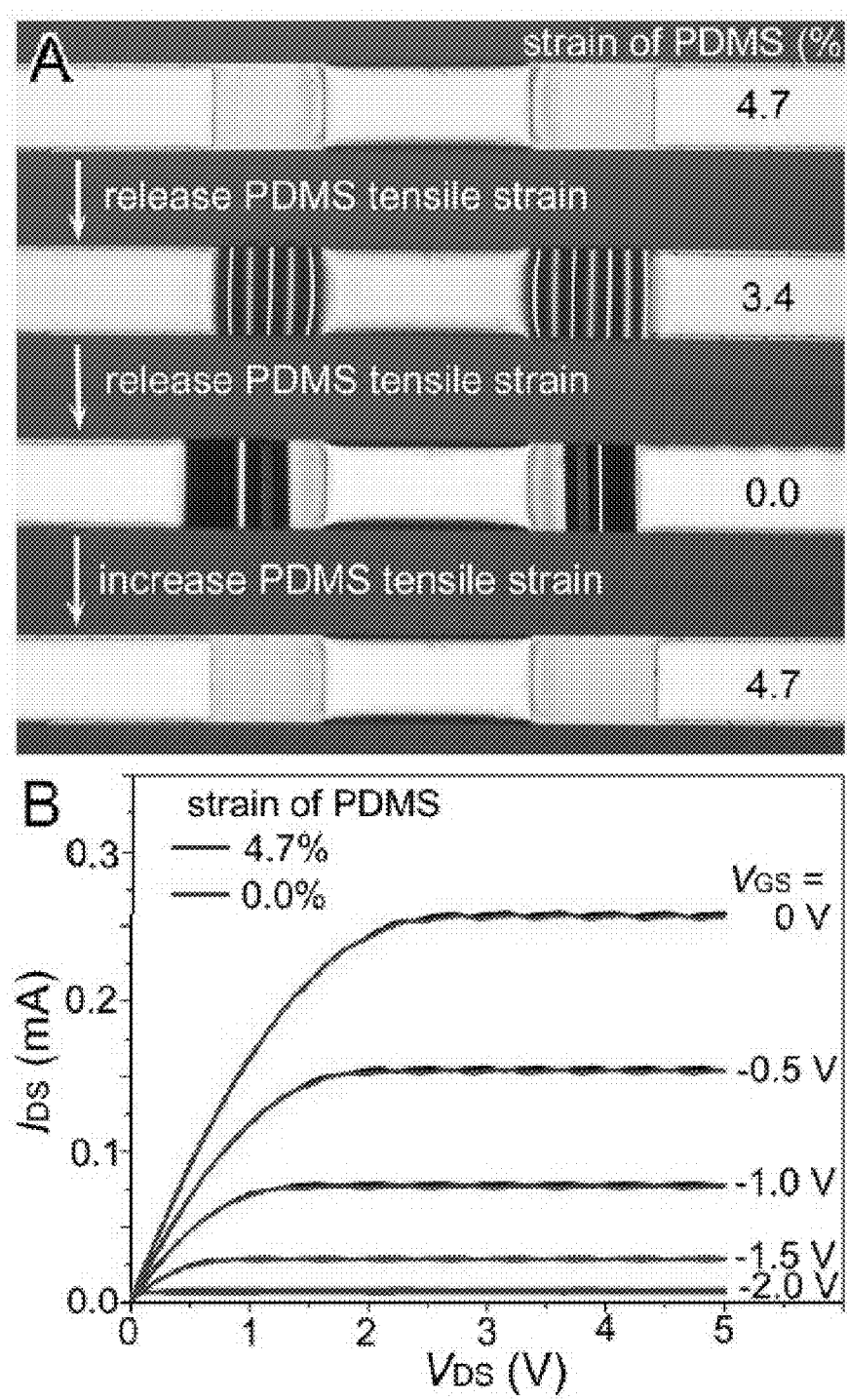
FIG. 26: (A) Optical images of a GaAs ribbon MESFET on a PDMS stamp with different strains built in the PDMS substrate. The prestrain applied to the PDMS stamp was 4.7% before the devices were transferred onto its surface. (B) Comparison of I-V curves for the device shown in (A) before and after the system was applied 4.7% stretching strain.

The performance of buckled devices can be evaluated by directly probing the current flow from source to drain. FIG. 26A shows GaAs-ribbon devices fabricated on a wafer, picked up using a flat PDMS stamp and transfer printed onto a PDMS substrate with a prestrain of 4.7%. In this configuration, the metal electrodes are exposed to air for electrical probing. After the prestretched PDMS is relaxed to a strain of 3.4%, periodic small waves formed in the thin regions of the MESFET (FIG. 26A: second frame from the top). When the prestretched PDMS stamp is fully relaxed, the small waves in each segment of pure GaAs coalesced into an individual big buckle (FIG. 26A: third frame from the top). The buckled devices can be stretched to their flat status with applied stretching strain of 4.7% (FIG. 26A: bottom frame). The IV curves of the same device with applied strains of 0.0% (FIG. 26A: third frame from the top) and 4.7% (FIG. 26A: bottom frame) are plotted in FIG. 26B with red and black colors, respectively. The results indicate that the current flow from source to drain of buckled MESFETs on PDMS substrates can be well modulated with the voltages applied to the gate and that the applied stretching strain generates only a minor effect on device performance.

In summary, this example discloses an approach to form 'buckled' and 'wavy' GaAs ribbons on and embedded in PDMS elastomeric substrates. The geometrical configurations of these ribbons depend on the level of prestrain used in the fabrication, the interaction strength between the PDMS and ribbons, and on the thicknesses and types of materials used. Buckled and wavy ribbons of GaAs multilayer stacks and fully formed MESFET devices show large levels of compressibility/stretchability, due to the ability of their geometries to adjust in a manner that can accommodate applied strains without transferring those strains to the materials themselves. Successful realization of large levels of mechanical stretchability (and, as a result, other attractive mechanical characteristics such as extreme bendability) in an intrinsically fragile material like GaAs provides similar strategies applicable to a wide range of other materials classes.

The thermally-induced prestrain is ascribed to thermal expansion of PDMS stamp, which has the bulk linear coefficient of thermal expansion of $\alpha_L = 3.1 \times 10^{-4}$ µm/µm/° C. On the other hand, the coefficient of thermal expansion for GaAs is only $5.73 \times 10^{-6}$ µm/µm/° C. Therefore, the prestrain on PDMS (relatively GaAs ribbons) for the sample that was prepared at 90° C. and cooled down to 27° C. is determined according to $\Delta\alpha_L \times \Delta T = (3.1 \times 10^{-4} - 5.73 \times 10^{-6}) \times (90-27) = 1.9\%$.

Methods: GaAs wafers with customer-designed epitaxial layers are purchased from IQE Inc., Bethlehem, Pa. The lithographic processes employed AZ photoresist, i.e., AZ 5214 and AZ nLOF 2020 for positive and negative imaging, respectively. The GaAs wafers with photoresist mask patterns are anisotropically etched in the etchant (4 mL $H_3PO_4$ (85 wt %), 52 mL $H_2O_2$ (30 wt %), and 48 mL deionized water) that is cooled in the ice-water bath. The AlAs layers are dissolved with a diluted HF solution (Fisher® Chemicals) in ethanol (1:2 in volume). The samples with released ribbons on mother wafers are dried in a fume hood. The dried samples are placed in the chamber of electron-beam evaporator (Temescal FC-1800) and coated with sequential layers of 2-nm Ti and 28-nm $SiO_2$. The metals for the MESFET devices are deposited by electron-beam evaporation before removal of AlAs layers. PDMS stamp with thickness of ~5 mm is prepared by pouring the mixture of low-modulus PDMS (A:B=1:10, Sylgard 184, Dow Corning) onto a piece of silicon wafer pre-modified with monolayer of (tridecafluoro-1,1,2,2-tetrahydrooctyl)-1-trichlorosilane, followed by baking at 65° C. for 4 hrs. In order to generate strong bonding, the stamps are exposed to UV light for 5 minutes. In the transfer process, the stamps are stretched through thermal expansion (in oven) and/or mechanical forces. The wafers with released ribbons are then laminated on the surfaces of the stretched PDMS stamps and left in contact at elevated temperatures (dependent on the required prestrains) for 5 minutes. The mother wafers are peeled from the stamps and all the ribbons are transferred to stamps. The prestrains applied to the stamps are released through cooling down to room temperature and/or removing the mechanical forces, resulting in the formation of wavy profiles along the ribbons. In the mechanical evaluations, we use a specially designed stage to stretch as well as compress the PDMS stamps with 'wavy' and 'buckled' GaAs ribbons.

Example 3: Two-Dimensional Stretchable Semiconductors

The present invention provides stretchable semiconductors and stretchable electronic devices capable of stretching, compressing and/or flexing in more than one direction, including directions oriented orthogonal to each other. Stretchable semiconductors and stretchable electronic devices of this aspect of the present invention exhibit good mechanical and electronic properties and/or device performance when stretched and/or compressed in more than one direction.

FIGS. 27A-C provides images at different degrees of magnification of a stretchable silicon semiconductor of the present invention exhibiting stretchability in two dimensions. The stretchable semiconductor shown in FIG. 27A-B was prepared by pre-straining an elastic substrate via thermal expansion.

Figure 28B:
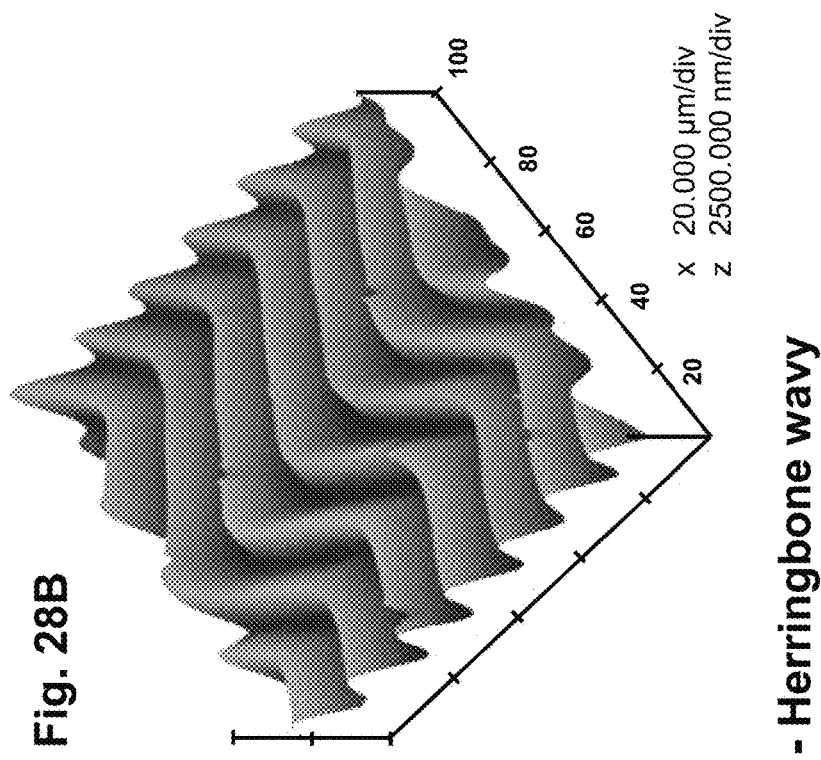
FIGS. 28A-C provide images of three different structural conformations of stretchable semiconductors of the present invention exhibiting stretchability in two dimensions.
Figure 28A:
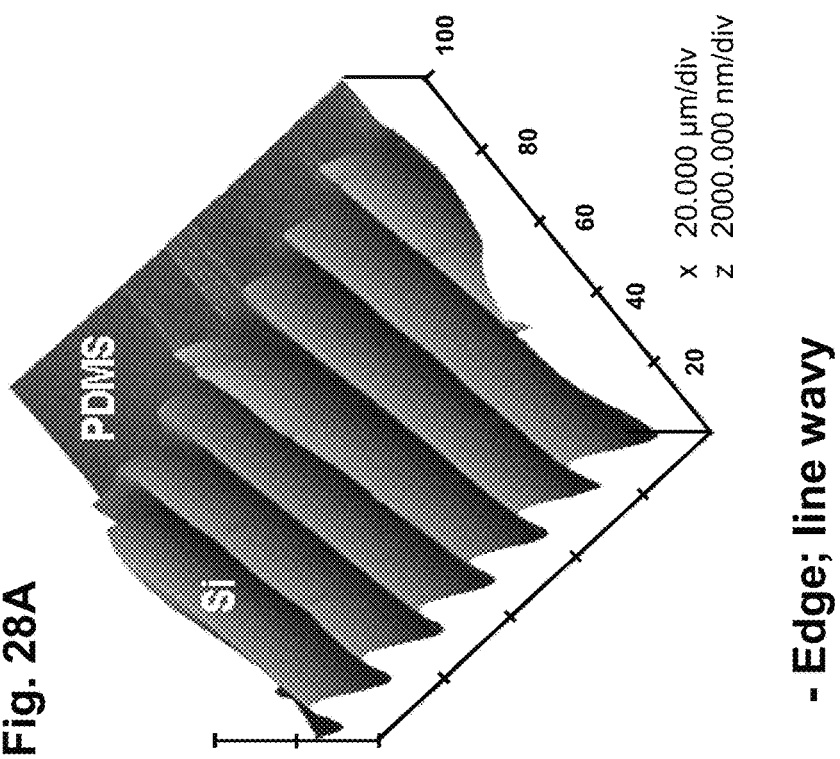
Figure 28C:
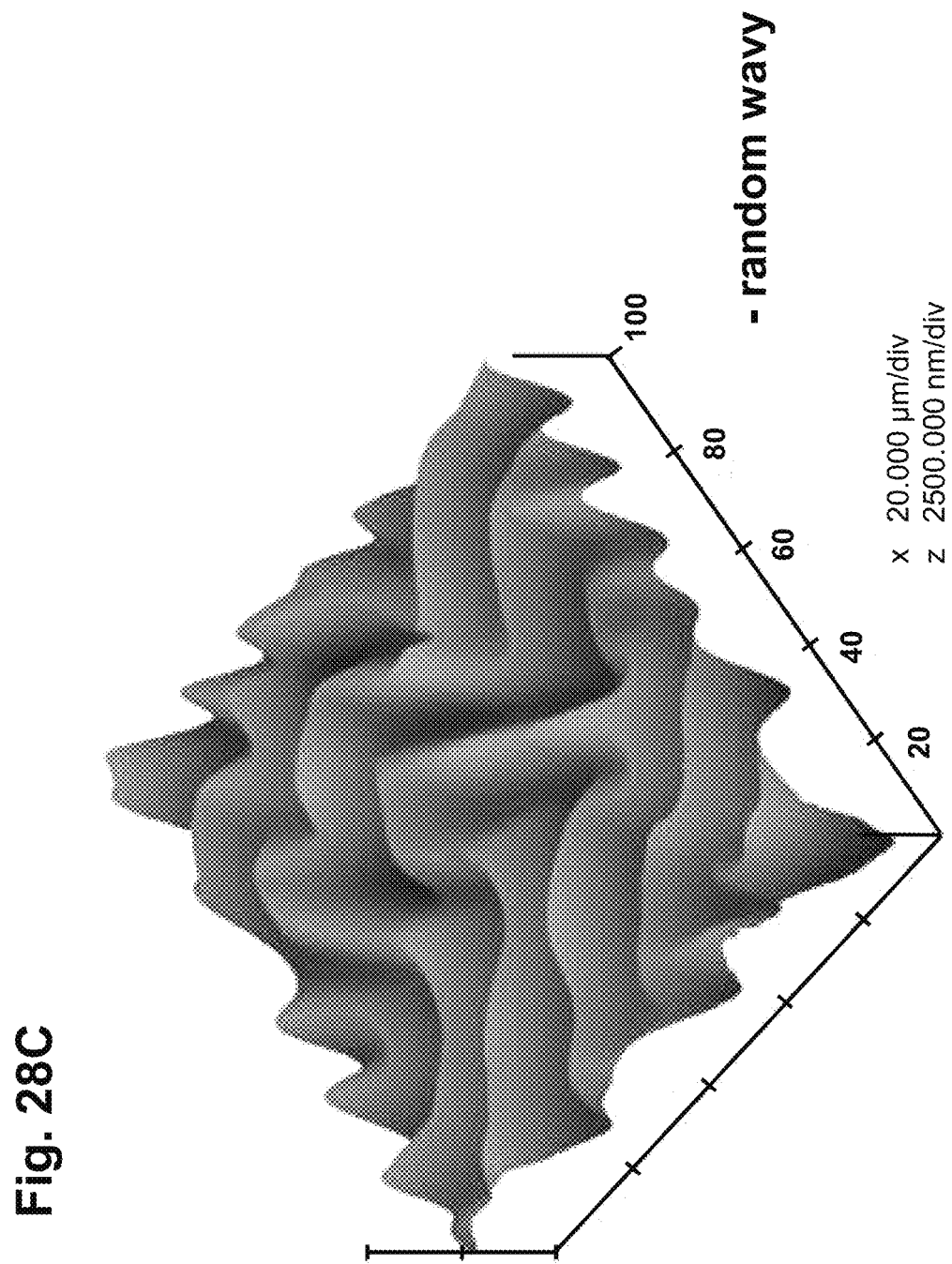
Figure 29A:
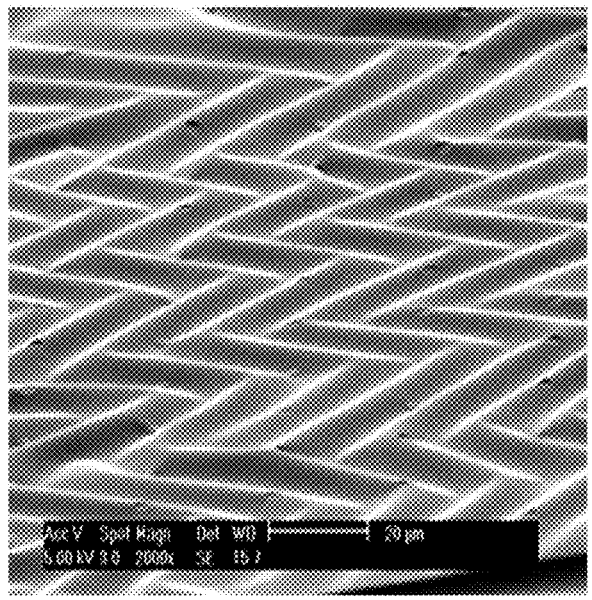
FIGS. 29A-D provide images of stretchable semiconductors of the present invention prepared by prestraining the elastic substrate via thermal expansion.
Figure 29B:
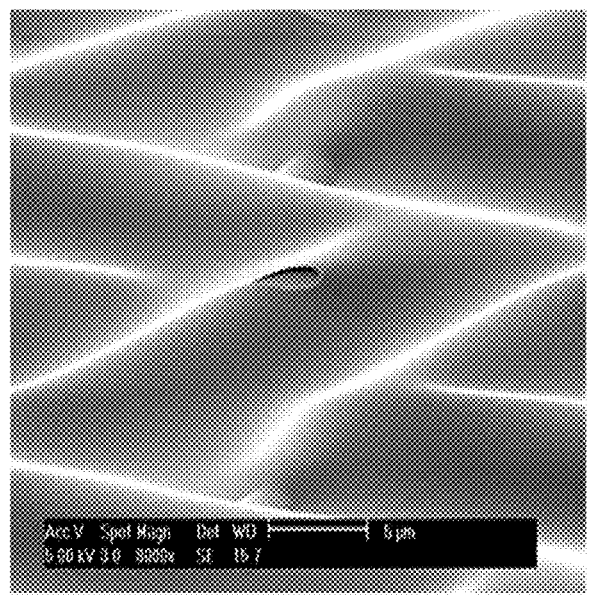
Figure 29C:
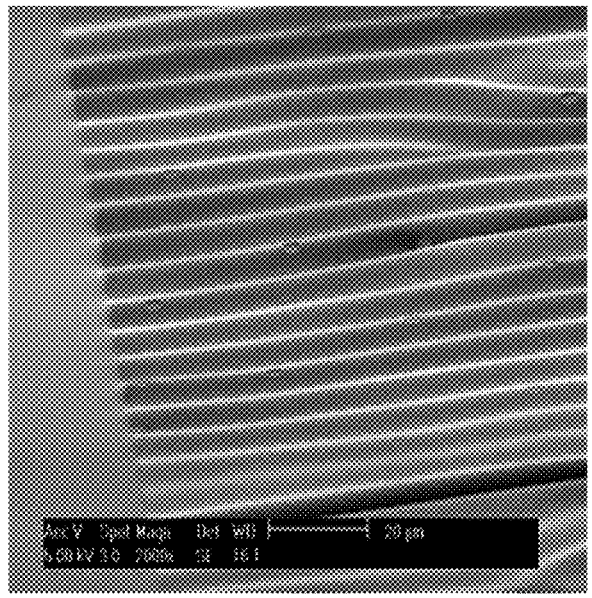
Figure 29D:
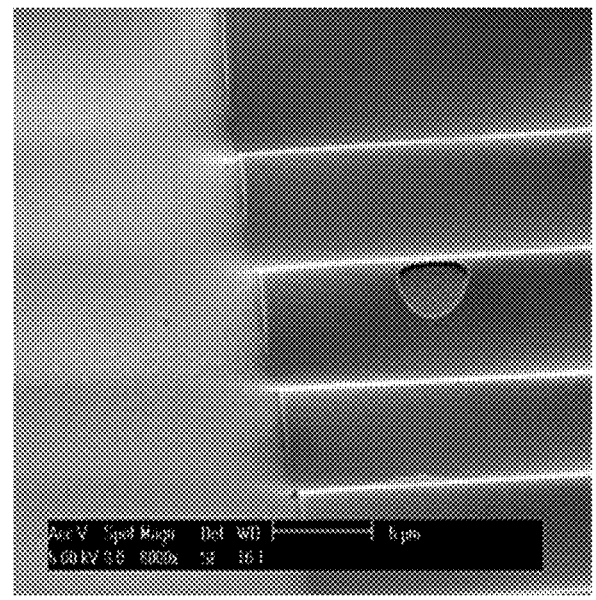

FIGS. 28A-C provide images of three different structural conformations of stretchable semiconductors of the present invention exhibiting stretchability in two dimensions. As shown, the semiconductor structures in FIG. 28A exhibit an edge line wavy conformation, the semiconductor structures in FIG. 28B exhibit a Herringbone wavy conformation and the semiconductor structures in FIG. 28C exhibit a random wavy conformation.

FIGS. 29A-D provide images of stretchable semiconductors of the present invention fabricated via prestraining an elastic substrate via thermal expansion.

Figure 30:
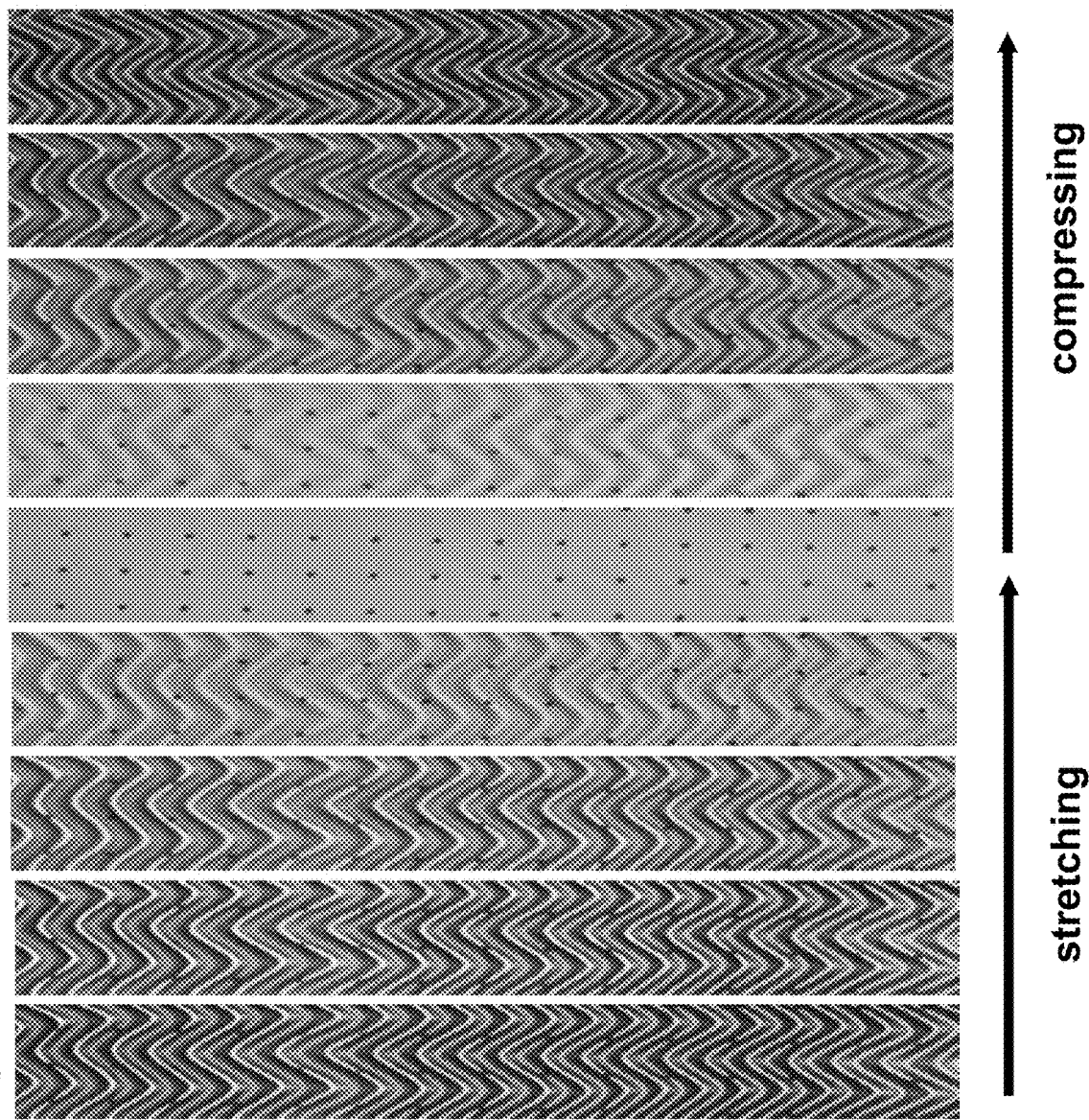
FIG. 30 shows optical images of stretchable semiconductors exhibiting stretchability in two dimensions under varying stretching and compression conditions.

FIG. 30 shows optical images of stretchable semiconductors exhibiting stretchability in two dimensions prepared via prestraining an elastic substrate via thermal expansion. FIG. 30 shows images corresponding to a variety of stretching and compression conditions.

Figure 31B:
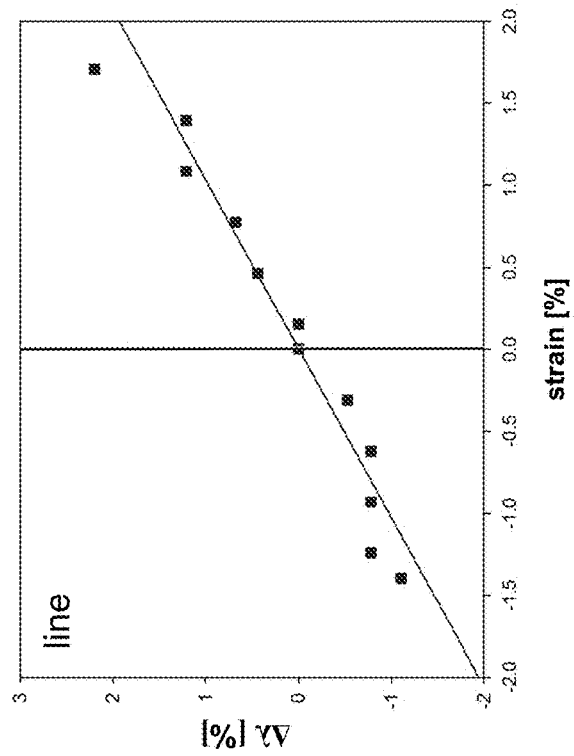
FIGS. 31B and 31 C provide experimental results relating to the mechanical properties of the stretchable semiconductors shown in FIG. 31A.
Figure 31A:
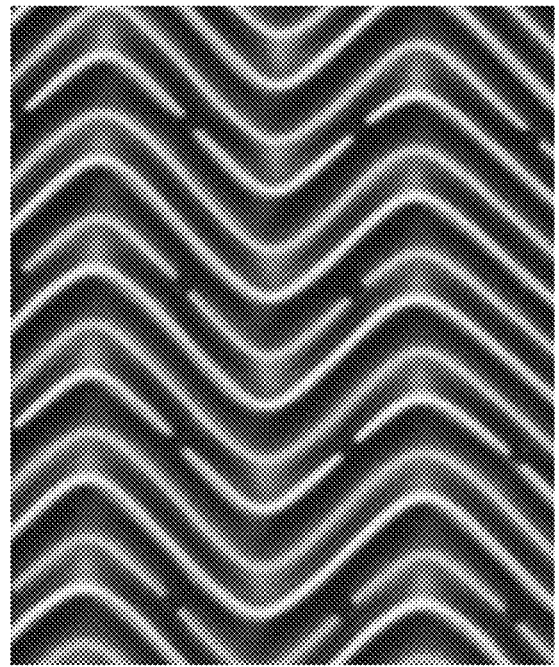
FIG. 31A shows an optical image of stretchable semiconductors exhibiting stretchability in two dimensions fabricated via prestraining an elastic substrate via thermal expansion.
Figure 31C:
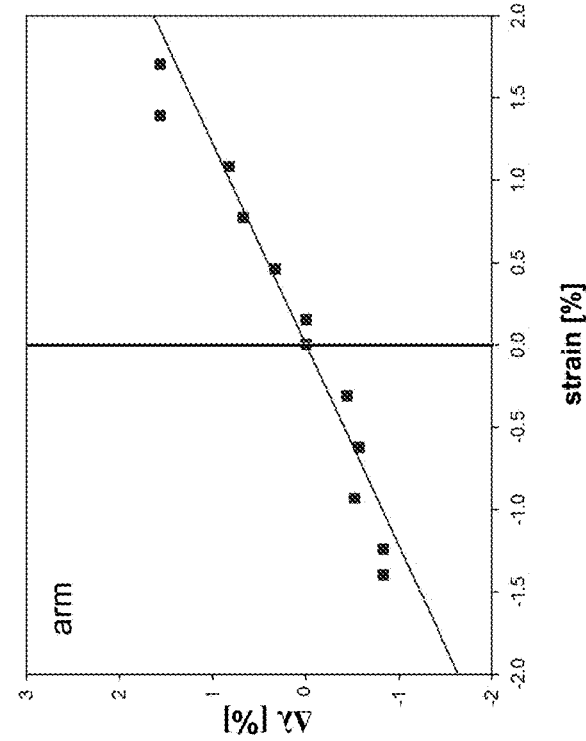

FIG. 31A shows an optical image of stretchable semiconductors exhibiting stretchability in two dimensions fabricated via prestraining an elastic substrate via thermal expansion. FIGS. 31B and 31C provide experimental results relating to the mechanical properties of the stretchable semiconductors shown in FIG. 31A.

REFERENCES

1. S. R. Forrest, *Nature* 428, 911 (2004).
2. For recent progress and reviews, see *Proc. IEEE* 93, Iss. 7 and 8 (2005).
3. J. A. Rogers et al., *Proc. Nat. Acad. Sci. USA* 98, 4835 (2001).
4. H. O. Jacobs, A. R. Tao, A. Schwartz, D. H. Gracias, G. M. Whitesides, *Science* 296, 323 (2002).
5. H. E. A. Huitema et al., *Nature* 414, 599 (2001).
6. C. D. Sheraw et al., *Appl. Phys. Lett.* 80, 1088 (2002).
7. Y. Chen et al., *Nature* 423, 136 (2003).
8. H. C. Jin, J. R. Abelson, M. K. Erhardt, R. G. Nuzzo, *J. Vac. Sci. Techn. B* 22, 2548 (2004).
9. P. H. I. Hsu et al., *IEEE Trans. Electron. Dev.* 51, 371 (2004).
10. T. Someya et al., *Proc. Nat. Acad. Sci. USA* 101, 9966 (2004).
11. H. C. Lim et al., *Sens. Act. A* 119, 2005, 332 (2005).
12. J. Vandeputte et al., U.S. Pat. No. 6,580,151 (2003).
13. T. Sekitani et al., *Appl. Phys. Lett.* 86, 2005, 073511 (2005).
14. E. Menard, R. G. Nuzzo, J. A. Rogers, *Appl. Phys. Left.* 86, 2005, 093507 (2005).
15. H. Gleskova et al., *J. Noncryst. Sol.* 338, 732 (2004).
16. S.-H. Hur, O. O. Park, J. A. Rogers, *Appl. Phys. Lett.* 86, 243502 (2005).
17. X. F. Duan et al., *Nature* 425, 274 (2003).
18. Z. Suo, E. Y. Ma, H. Gleskova, S. Wagner, *Appl. Phys. Left.* 74, 1177 (1999).
19. Y.-L. Loo et al., *Proc. Nat. Acad. Sci. USA* 99, 10252 (2002).
20. T. Someya et al., *Proc. Nat. Acad. Sci. USA* 102, 12321 (2005).
21. S. P. Lacour, J. Jones, S. Wagner, Z. G. Suo, *Proc. IEEE* 93, 1459 (2005).
22. S. P. Lacour et al., *Appl. Phys. Lett.* 82, 2404 (2003).
23. D. S. Gray, J. Tien, C. S. Chen, *Adv. Mater.* 16, 393 (2004).
24. R. Faez, W. A. Gazotti, M. A. De Paoli, *Polymer* 40, 5497 (1999).
25. C. A. Marquette, L. J. Blum, Biosens. *Bioelectron.* 20, 197 (2004).
26. X. Chen, J. W. Hutchinson, *J. Appl. Mech.* 71, 597 (2004).
27. Z. Y. Huang, W. Hong, Z. Suo, *J. Mech. Phys. Solids* 53, 2101 (2005).
28. *Properties of Silicon* (An INSPEC publication, New York, 1988).
29. A. Bietsch, B. Michel, *J. Appl. Phys.* 88, 4310 (2000).
30. N. Bowden et al., *Nature* 146, 146 (1998).
31. W. T. S. Huck et al., *Langmuir* 16, 3497 (2000).
32. C. M. Stafford et al., *Nat. Mater.* 3, 545 (2004).
[1] R. H. Reuss, B. R. Chalamala, A. Moussessian, M. G. Kane, A. Kumar, D. C. Zhang, J. A. Rogers, M. Hatalis, D. Temple, G. Moddel, B. J. Eliasson, M. J. Estes, J. Kunze, E. S. Handy, E. S. Harmon, D. B. Salzman, J. M. Woodall, M. A. Alam, J. Y. Murthy, S. C. Jacobsen, M. Olivier, D. Markus, P. M. Campbell, E. Snow, *Proc. IEEE* 2005, 93, 1239.
[2] K. Jain, M. Klosner, M. Zemel, S. Raghunandan, *Pro. IEEE* 2005, 93, 1500.
[3] A. Nathan, B.-K. Park, Q. Ma, A. Sazonov, J. A. Rowlands, *Microelectronics Reliability* 2002, 42, 735.
[4] Reviews: a) H. Sirringhaus, *Adv. Mater.* 2005, 17, 2411. b) S. R. Forrest, *Nature* 2004, 428, 911. c) C. R. Newman, C. D. Frisbie, D. A. da Silva Filho, J.-L. Brédas, P. C. Ewbank, K. R. Mann, *Chem. Mater.* 2004, 16, 4436. d) H. E. Katz, Z. Bao, S. Gilat, *Acc. Chem. Res.* 2001, 34, 359. e) H. E. Katz, *Chem. Mater.* 2004, 16, 4748. f) Y. Sun, Y. Liu, D. Zhu, *J. Mater. Chem.* 2005, 15, 53.
[5] a) D. Knipp, R. A. Street, A. Völkel, J. Ho, *J. Appl. Phys.* 2003, 93, 347. b) C.-W. Chu, S.-H. Li, C.-W. Chen, V. Shrotriya, Y. Yang, *Appl. Phys. Lett.* 2005, 87, 193508. c) B. S. Ong, Y. Wu, P. Liu, *Proc. IEEE* 2005, 93, 1412.
[6] a) G. H. Gelinck, H. E. A. Juitema, E. Van Veenendaal, E. Cantatore, L. Schrijnemakers, J. B. P. H. Van der Putten, T. C. T. Geuns, M. Beenhakkers, J. B. Giesbers, B.-H. Huisman, E. J. Meijer, E. M. Benito, F. J. Touwslager, A. W. Marsman, B. J. E. Van Rens, D. M. de Leeuw, *Nat. Mater.* 2004, 3, 106. b) J. A. Rogers, Z. Bao, K. Baldwin, A. Dodabalapur, B. Crone, V. R. Raju, V. Kuck, H. Katz, K. Amundson, J. Ewing, P. Drzaic, *Proc.*

*Natl. Acad. Sci. USA* 2001, 98, 4935. c) T. Someya, Y. Kato, S. Iba, Y. Noguchi, T. Sekitani, H. Kawaguchi, T. Sakurai, *IEEE Trans. Electron Devices* 2005, 52, 2502. d) T. Someya, Y. Kato, T. Sekitani, S. Iba, Y. Noguchi, Y. Murase, H. Kawaguchi, T. Sakurai, *Proc. Natl. Acad. Sci. USA* 2005, 102, 12321.

[7] single crystal a) V. C. Sundar, J. Zaumseil, V. Podzorov, E. Menard, R. L. Willett, T. Someya, M. E. Gershenson, J. A. Rogers, *Science* 2004, 303, 1644. E. Menard, V. Podzorov, S.-H. Hur, A. Gaur, M. E. Gershenson, J. A. Rogers, *Adv. Mater.* 2004, 16, 2097. c) V. Podzorov, E. Menard, J. A. Rogers, M. E. Gershenson, *Phys. Rev. Lett.* 2005, 95, 226601. d) W.-Y. Chou, H.-L. Cheng, *Adv. Func. Mater.* 2004, 14, 811. e) M. Mas-Torrent, P. Hadley, N. Crivillers, J. Veciana, C. Rovira, *Chem Phys Chem* 2006, 7, 86.

[8] a) M. Halik, H. Klauk, U. Zschieschang, G. Schmid, C. Dehm, M. Schütz, S. Maisch, F. Effenberger, M. Brunnbauer, F. Stellacci, *Nature* 2004, 431, 963. b) M.-H. Yoon, H. Yan, A. Facchetti, T. J. Marks, *J. Am. Chem. Soc.* 2005, 127, 10388. c) Y. Jang, D. H. Kim, Y. D. Park, J. H. Cho, M. Hwang, K. Cho, *Appl. Phys. Lett.* 2006, 88, 072101.

[9] a) M. C. Hamilton, S. Martin, J. Kanicki, *Chem. Mater.* 2004, 16, 4699. b) M. J. Deen, M. H. Kazemeini, Y. M. Haddara, J. Yu, G. Vamvounis, S. Holdcroft, W. Woods, IEEE Trans. Electron Devices 2004, 51, 1892. c) K. Cheng, M.-H. Yang, W. W. W. Chiu, C.-Y. Huang, J. Chang, T.-F. Ying, Y. Yang, *Macromol. Rapid Commun.* 2005, 26, 247.

[10] a) E. Fortunato, L. Pereira, H. Águas, I. Ferreira, R. Martins, *Proc. IEEE* 2005, 93, 1281. b) A. Sazonov, D. Striakhilev, C.-H. Lee, A. Nathan, *Proc. IEEE* 2005, 93, 1420. c) A. J. Flewitt, W. I. Milne, *Proc. IEEE* 2005, 93, 1364. d) P. Servati, A. Nathan, *Proc. IEEE* 2005, 93, 1257.

[11] a) C.-S. Yang, L. L. Smith, C. B. Arthur, G. N. Parsons, *J. Vac. Sci. Technol. B* 2000, 18, 683. b) P. I. Hsu, H. Gleskova, M. Huang, Z. Suo, S. Wagner, J. C. Sturm, *J. Non-Crystalline Solids* 2002, 299-302, 1355.

[12] Y. Chen, J. Au, P. Kazlas, A. Ritenour, H. Gates, M. McCreary, *Nature* 2003, 423, 136.

[13] a) M. Wu, S. Wagner, *Appl. Phys. Left.* 2001, 78, 3729. b) S. Wagner, H. Gleskova, I.-C. Cheng, M. Wu, Thin Solid Films 2003, 430, 15. c) M. Wu, S. Wagner, *Appl. Surf. Sci.* 2001, 175-176, 753.

[14] a) S. V. Karnik, M. K. Hatalis, *Jpn. J. Appl. Phys.* 2003, 42, 1200. c) S. V. Karnik, M. K. Hatalis, Solid-State Electronics 2003, 47, 653.

[15] P. K. Shetty, N. D. Theodore, J. Ren, J. Menendez, H. C. Kim, E. Misra, J. W. Mayer, T. L. Alford, *Mater. Lett.* 2005, 59, 872.

[16] A. Imparato, C. Minarini, A. Rubino, P. Tassini, F. Villani, D. D. Sala, E. Amendola, M. Kunst, H.-C. Neitzert, S. Bellone, Thin Solid Films 2005, 487, 58.

[17] X. Duan, C. Niu, V. Sahi, J. Chen, J. W. Parce, S. Empedocles, J. L. Goldman, *Nature* 2003, 425, 274.

[18] M. C. McAlpine, R. S. Friedman, S. Jin, K.-H. Liu, W. U. Wang, C. M. Lieber, *Nano Lett.* 2003, 3, 1531.

[19] E. Menard, K. J. Lee, D.-Y. Khang, R. G. Nuzzo, J. A. Rogers, *Appl. Phys. Lett.* 2004, 84, 5398.

[20] E. Menard, R. G. Nuzzo, J. A. Rogers, *Appl. Phys. Lett.* 2005, 86, 093507.

[21] Z.-T. Zhu, E. Menard, K. Hurley, R. G. Nuzzo, J. A. Rogers, *Appl. Phys. Lett.* 2005, 86, 133507.

[22] K. J. Lee, M. J. Motala, M. A. Meitl, W. R. Childs, E. Menard, A. K. Shim, J. A. Rogers, R. G. Nuzzo, *Adv. Mater.* 2005, 17, 2332.

[23] Y. Sun, S. Kim, I. Adesida, J. A. Rogers, *Appl. Phys. Lett.* 2005, 87, 083501.

[24] Y. Sun, E. Menard, J. A. Rogers, H.-S. Kim, S. Kim, G. Chen, I. Adesida, R. Dettmer, R. Cortez, A. Tewksbury, *Appl. Phys. Lett.*, submitted.

[25] D.-Y. Khang, H. Jiang, Y. Huang, J. A. Rogers, *Science* 2006, 311, 208. [26] Y. Sun, J. A. Rogers, Nano Left. 2004, 4, 1953.

[27] Y. Sun, D.-Y. Khang, F. Hua, K. Hurley, R. G. Nuzzo, J. A. Rogers, *Adv. Funct. Mater.* 2005, 15, 30.

[28] T. Buma, M. Spisar, M. O'Donnell, *Appl. Phys. Lett.* 2001, 79, 548.

[29] Z. Y. Huang, W. Hong, Z. Suo, *J. Mech. Phys. Solids* 2005, 53, 2101. [30] S. Wagner, S. P. Lacour, J. Jone, P.-H. I. Hsu, J. C. Sturm, T. Li, Z. Suo, Physica E 2005, 25, 326.

STATEMENTS REGARDING INCORPORATION BY REFERENCE AND VARIATIONS

The following references relate to self assembly techniques which may be used in methods of the present invention to transfer, assembly and interconnect printable semiconductor elements via contact printing and/or solution printing techniques and are incorporated by reference in their entireties herein: (1) "Guided molecular self-assembly: a review of recent efforts", Jiyun C Huie *Smart Mater. Struct.* (2003) 12, 264-271; (2) "Large-Scale Hierarchical Organization of Nanowire Arrays for Integrated Nanosystems", Whang, D.; Jin, S.; Wu, Y.; Lieber, C. *M. Nano Lett.* (2003) 3(9), 1255-1259; (3) "Directed Assembly of One-Dimensional Nanostructures into Functional Networks", Yu Huang, Xiangfeng Duan, Qingqiao Wei, and Charles M. Lieber, *Science* (2001) 291, 630-633; and (4) "Electric-field assisted assembly and alignment of metallic nanowires", Peter A. Smith et al., *Appl. Phys. Lett.* (2000) 77(9), 1399-1401.

All references throughout this application, for example patent documents including issued or granted patents or equivalents; patent application publications; unpublished patent applications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

Any appendix or appendices hereto are incorporated by reference as part of the specification and/or drawings.

Where the terms "comprise", "comprises", "comprised", or "comprising" are used herein, they are to be interpreted as specifying the presence of the stated features, integers, steps, or components referred to, but not to preclude the presence or addition of one or more other feature, integer, step, component, or group thereof. Separate embodiments of the invention are also intended to be encompassed wherein the terms "comprising" or "comprise(s)" or "comprised" are optionally replaced with the terms, analogous in grammar, e.g.; "consisting/consist(s)" or "consisting essentially of/consist(s) essentially of" to thereby describe further embodiments that are not necessarily coextensive.

The invention has been described with reference to various specific and preferred embodiments and techniques. However, it should be understood that many variations and modifications may be made while remaining within the spirit and scope of the invention. It will be apparent to one of ordinary skill in the art that compositions, methods, devices, device elements, materials, procedures and techniques other than those specifically described herein can be applied to the practice of the invention as broadly disclosed herein without resort to undue experimentation. All art-known functional equivalents of compositions, methods, devices, device elements, materials, procedures and techniques described herein are intended to be encompassed by this invention. Whenever a range is disclosed, all subranges and individual values are intended to be encompassed as if separately set forth. This invention is not to be limited by the embodiments disclosed, including any shown in the drawings or exemplified in the specification, which are given by way of example or illustration and not of limitation. The scope of the invention shall be limited only by the claims.

We claim:

1. A stretchable semiconductor element comprising:
a flexible substrate having a supporting surface;
a semiconductor structure having a curved internal surface, wherein at least a portion of said curved internal surface is bonded to said supporting surface of said flexible substrate; and
an encapsulating layer or coating that at least partially encapsulates the semiconductor structure;
wherein said curved internal surface is continuously bonded to said supporting surface at substantially all points along said curved internal surface.

2. The stretchable semiconductor element of claim 1 wherein said semiconductor structure is a bent semiconductor structure.

3. The stretchable semiconductor element of claim 2 wherein said bent semiconductor structure has a wave-shaped, wrinkled, coiled or buckled conformation.

4. The stretchable semiconductor element of claim 2 wherein said bent semiconductor structure is under strain.

5. The stretchable semiconductor element of claim 2 wherein said bent semiconductor structure is under strain selected over the range of about 1% to about 30%.

6. The stretchable semiconductor element of claim 2 wherein said bent semiconductor structure has a conformation comprising a periodic wave that extends at least a portion of the length of said structure.

7. The stretchable semiconductor element of claim 6 wherein said bent semiconductor structure has a sine wave conformation having a periodicity selected from the range of about 1 micron and 100 microns and an amplitude selected from the range of about 50 nanometers and about 5 microns.

8. The stretchable semiconductor element of claim 2 wherein said bent semiconductor structure has a conformation comprising a plurality of buckles that extend along the length of said structure.

9. The stretchable semiconductor element of claim 2 wherein said bent semiconductor structure has a conformation that varies spatially in one-dimension or two dimensions, wherein said internal surface has a contour profile that varies spatially in one-dimension or two dimensions.

10. The stretchable semiconductor element of claim 1 wherein said curved internal surface has at least one convex region, at least one concave region or a combination of at least one convex region and at least one concave region.

11. The stretchable semiconductor element of claim 1 wherein said curved internal surface has a contour profile comprising a periodic wave or an aperiodic wave.

12. The stretchable semiconductor element of claim 1 wherein said semiconductor structure comprises a ribbon, wire, strip, disc, or platelet.

13. The stretchable semiconductor element of claim 1 wherein said semiconductor structure has a thickness selected over the range of about 50 nanometers to about 50 microns.

14. The stretchable semiconductor element of claim 1 wherein said flexible substrate comprises a polymer.

15. The stretchable semiconductor element of claim 1 wherein said semiconductor structure is a single crystalline inorganic semiconductor material.

16. The stretchable semiconductor element of claim 1 wherein said semiconductor structure comprises a material selected from the group consisting of: Si, Ge, SiC, AlP, AlAs, AlSb, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP, carbon nanotubes, graphene and GaN.

17. A stretchable electronic circuit comprising:
a flexible substrate having a supporting surface;
an electronic circuit having a curved internal surface, wherein at least a portion of said curved internal surface is bonded to said supporting surface of said flexible substrate;
an encapsulating layer or coating that at least partially encapsulates the electronic circuit; and
wherein the electronic circuit comprises a stretchable semiconductor element according to claim 1.

18. The stretchable electronic circuit of claim 17, wherein said encapsulating layer or coating is a polymer.

19. A stretchable semiconductor element comprising:
a flexible substrate having a supporting surface;
a semiconductor structure having a curved internal surface, wherein at least a portion of said curved internal surface is bonded to said supporting surface of said flexible substrate;
an encapsulating layer or coating that at least partially encapsulates the semiconductor structure; and
wherein said semiconductor structure is a bent semiconductor structure and said bent semiconductor structure is under a strain selected over the range of 1% to 30%.

20. A stretchable semiconductor element comprising:
a flexible substrate having a supporting surface;
a semiconductor structure having a curved internal surface, wherein at least a portion of said curved internal surface is bonded to said supporting surface of said flexible substrate;
an encapsulating layer or coating that at least partially encapsulates the semiconductor structure;
wherein said semiconductor structure is a bent semiconductor structure having a conformation comprising a periodic wave that extends at least a portion of the length of said bent semiconductor structure; and
wherein said periodic wave has a periodicity selected from the range of 1 micron and 100 microns and an amplitude selected from the range of 50 nanometers and 5 microns.

21. A stretchable semiconductor element comprising:
a flexible substrate having a supporting surface;
a semiconductor structure having a curved internal surface, wherein at least a portion of said curved internal surface is bonded to said supporting surface of said flexible substrate; and
an encapsulating layer or coating that at least partially encapsulates the semiconductor structure;
wherein said curved internal surface is discontinuously bonded to said supporting surface at selected points along said curved internal surface.

22. A stretchable semiconductor element comprising:
a flexible substrate having a supporting surface;
a semiconductor structure having a curved internal surface, wherein at least a portion of said curved internal surface is bonded to said supporting surface of said flexible substrate;
an encapsulating layer or coating that at least partially encapsulates the semiconductor structure;
wherein said semiconductor structure is a bent semiconductor structure; and
said bent semiconductor structure has a conformation comprising a plurality of buckles that extend along the length of said structure.

* * * * *